US012238881B2

(12) United States Patent
Goss

(10) Patent No.: US 12,238,881 B2
(45) Date of Patent: Feb. 25, 2025

(54) GUIDE PANEL AND METHOD OF MAKING THEREOF

(71) Applicant: Donald C Goss, Redondo Beach, CA (US)

(72) Inventor: Donald C Goss, Redondo Beach, CA (US)

(*) Notice: Subject to any disclaimer, the term of this patent is extended or adjusted under 35 U.S.C. 154(b) by 1016 days.

(21) Appl. No.: 16/656,548

(22) Filed: Oct. 17, 2019

(65) Prior Publication Data

US 2020/0128686 A1   Apr. 23, 2020

Related U.S. Application Data

(60) Provisional application No. 62/748,435, filed on Oct. 20, 2018.

(51) Int. Cl.
  *H05K 5/02* (2006.01)

(52) U.S. Cl.
  CPC ................... *H05K 5/0286* (2013.01)

(58) Field of Classification Search
  CPC ............... H05K 5/0286; H05K 7/1417; H05K 7/1418
  See application file for complete search history.

(56) References Cited

U.S. PATENT DOCUMENTS

| | | |
|---|---|---|
| 3,511,385 A | 5/1970 | Ayling |
| 4,353,469 A | 10/1982 | Etchison, Jr. et al. |
| 4,509,647 A | 4/1985 | Shevchuk |
| 4,519,016 A | 5/1985 | Bradely et al. |
| 4,758,928 A | 7/1988 | Wierec et al. |
| 5,031,075 A | 7/1991 | Casanova et al. |
| 5,156,280 A | 10/1992 | Joist |
| 5,392,629 A | 2/1995 | Goss et al. |
| 5,394,305 A | 2/1995 | Moral et al. |
| 5,406,455 A * | 4/1995 | Devenish, III ....... H05K 7/1418 174/547 |
| 5,428,507 A | 6/1995 | Chatel et al. |
| 5,504,656 A | 4/1996 | Joist |
| 5,506,751 A | 4/1996 | Chatel |
| 5,675,475 A | 10/1997 | Mazura et al. |
| 5,735,411 A | 4/1998 | Flamme et al. |
| 5,812,377 A | 9/1998 | Golbach |
| 5,912,801 A | 6/1999 | Roy et al. |
| 6,043,991 A | 3/2000 | Sorrentino |
| 6,083,037 A | 7/2000 | Gunther et al. |
| 6,086,404 A | 7/2000 | Giese et al. |

(Continued)

FOREIGN PATENT DOCUMENTS

| | | |
|---|---|---|
| CN | 2870380 Y | 2/2007 |
| EP | 0313270 | 6/1993 |
| EP | 0313270 B1 | 6/1993 |

OTHER PUBLICATIONS

PCT/US19/56909 ; Filing Date: Oct. 18, 2019; ISA Search Report; Date: Mar. 3, 2020.

(Continued)

*Primary Examiner* — Sagar Shrestha
(74) *Attorney, Agent, or Firm* — Patent Law Agency, LLC; Peter Ganjian

(57) ABSTRACT

A guide panel comprised of unitized construction that includes a guidance slot, an engagement structure, a power-data transmission alignment structure, and electrostatic discharge components.

17 Claims, 58 Drawing Sheets

(56) References Cited

U.S. PATENT DOCUMENTS

| | | | |
|---|---|---|---|
| 6,128,187 A | 10/2000 | Mimlitch, III et al. | |
| 6,134,119 A | 10/2000 | Gunther et al. | |
| 6,166,902 A | 12/2000 | Liu | |
| 6,175,507 B1 | 1/2001 | Koradia et al. | |
| 6,198,633 B1 | 3/2001 | Lehman et al. | |
| 6,201,692 B1* | 3/2001 | Gamble | G11B 33/126 |
| | | | 361/728 |
| 6,220,879 B1 | 4/2001 | Ulrich | |
| 6,266,253 B1* | 7/2001 | Kurrer | H05K 7/1455 |
| | | | 361/801 |
| 6,272,016 B1* | 8/2001 | Matonis | H05K 7/1404 |
| | | | 361/732 |
| 6,322,175 B1 | 11/2001 | Aggus et al. | |
| 6,359,788 B1 | 3/2002 | Giese et al. | |
| 6,395,976 B1* | 5/2002 | Koradia | H05K 7/1409 |
| | | | 361/801 |
| 6,418,026 B1 | 7/2002 | Ho et al. | |
| 6,442,035 B1* | 8/2002 | Perry | H05K 7/1425 |
| | | | 206/706 |
| 6,447,082 B1 | 9/2002 | Haag et al. | |
| 6,456,498 B1 | 9/2002 | Larson et al. | |
| 6,493,235 B1* | 12/2002 | Barringer | H05K 7/1418 |
| | | | 361/747 |
| 6,594,150 B2 | 7/2003 | Creason et al. | |
| 6,915,562 B2 | 7/2005 | Joist et al. | |
| 7,007,809 B2 | 3/2006 | Greenside | |
| 7,167,380 B2* | 1/2007 | Ice | H05K 7/1404 |
| | | | 361/756 |
| 7,495,931 B2 | 2/2009 | Clark et al. | |
| 8,498,104 B2* | 7/2013 | Lin | G06F 1/187 |
| | | | 361/679.31 |
| 9,762,037 B1* | 9/2017 | Lach | H05K 7/1492 |
| 10,585,461 B2* | 3/2020 | Suzuki | G06F 1/185 |
| 2002/0011525 A1* | 1/2002 | Tabuchi | H05K 7/1425 |
| | | | 238/122 |
| 2002/0181194 A1 | 12/2002 | Ho et al. | |
| 2003/0081386 A1* | 5/2003 | Robillard | H05K 7/1492 |
| | | | 312/223.1 |
| 2003/0116515 A1 | 6/2003 | Ureshino | |
| 2003/0172523 A1 | 9/2003 | Joist et al. | |
| 2004/0252471 A1 | 12/2004 | Barsun et al. | |
| 2005/0146855 A1* | 7/2005 | Brehm | H05K 7/1454 |
| | | | 361/788 |
| 2006/0133054 A1* | 6/2006 | Haag | H05K 7/1425 |
| | | | 361/756 |
| 2006/0286869 A1 | 12/2006 | Looney et al. | |
| 2007/0167070 A1 | 7/2007 | Waltz et al. | |
| 2008/0045051 A1* | 2/2008 | Sato | H05K 7/1409 |
| | | | 439/78 |
| 2010/0097773 A1* | 4/2010 | Ellis | H05K 7/1418 |
| | | | 361/756 |
| 2010/0124034 A1* | 5/2010 | Shouyama | H05K 7/1418 |
| | | | 361/756 |
| 2011/0299257 A1* | 12/2011 | Yamaguchi | H05K 7/1489 |
| | | | 361/752 |
| 2014/0247540 A1* | 9/2014 | Steeves | H05K 7/14325 |
| | | | 174/68.2 |
| 2014/0268599 A1* | 9/2014 | Laufer | H05K 7/1452 |
| | | | 361/752 |
| 2015/0012760 A1* | 1/2015 | Shichi | H05K 7/1492 |
| | | | 713/300 |
| 2015/0188298 A1* | 7/2015 | Lutze | H02B 1/34 |
| | | | 211/26 |
| 2017/0071063 A1* | 3/2017 | Sizemore | H05K 9/0041 |
| 2017/0155222 A1* | 6/2017 | Hsu | H05K 7/1489 |

OTHER PUBLICATIONS

PCT/US19/56909 Office Action Restriction Requirement Jan. 9, 2020.
Office Action from case 108137910 Filed In Tiawan, Dated: Oct. 20, 2020; the equivalent of which is U.S. Appl. No. 16/656,548.
E-ENCLOS1-2EP ; EPO Suplementary European Search Report ; EP 19 87 3541 ; Oct. 14, 2022.
India Patent Application No. 202127045407 dated: Apr. 25, 2022.
Nvent Schroff Subracks/ 19" Chassis Catalog ; published 2018.

* cited by examiner

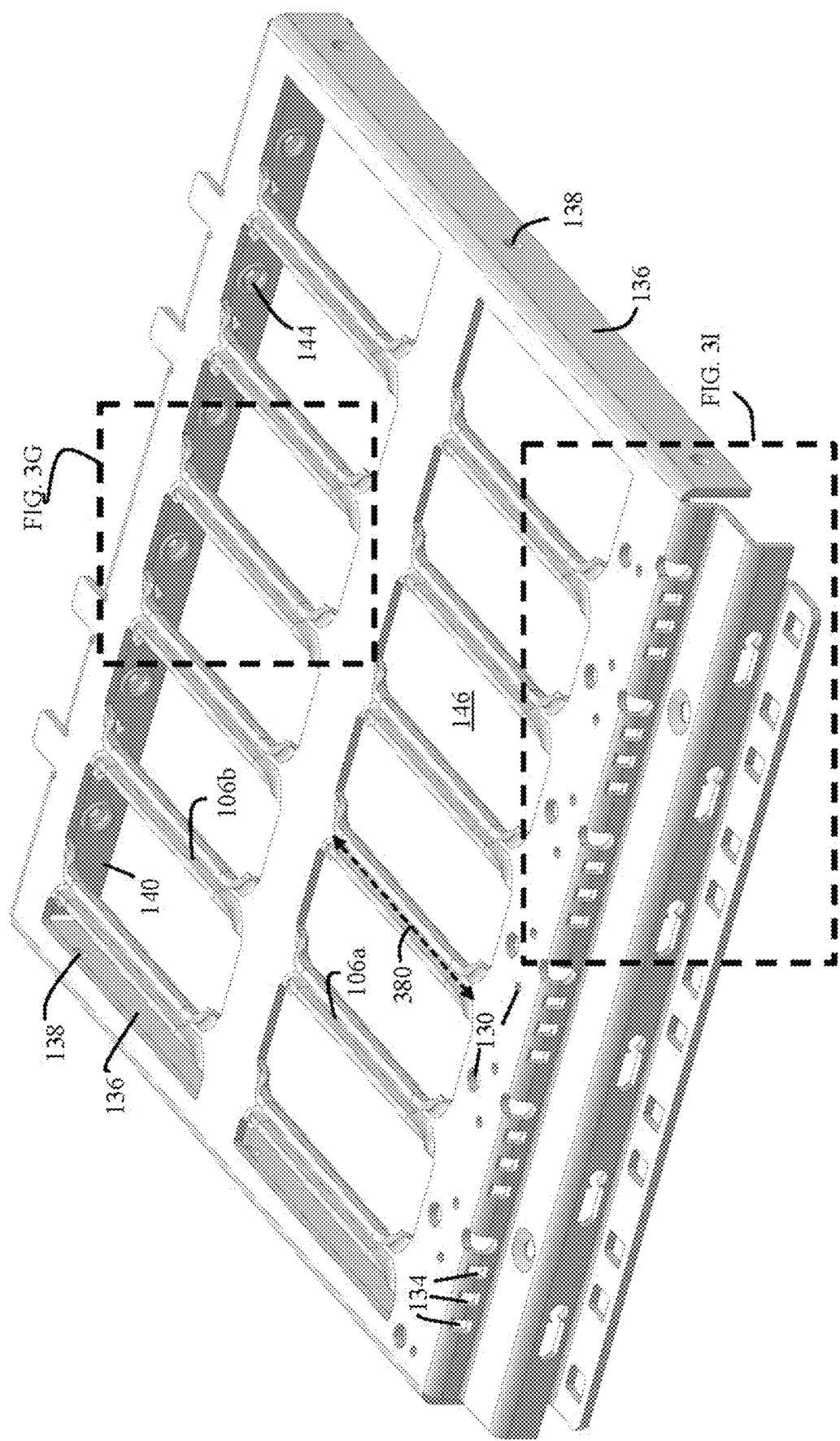

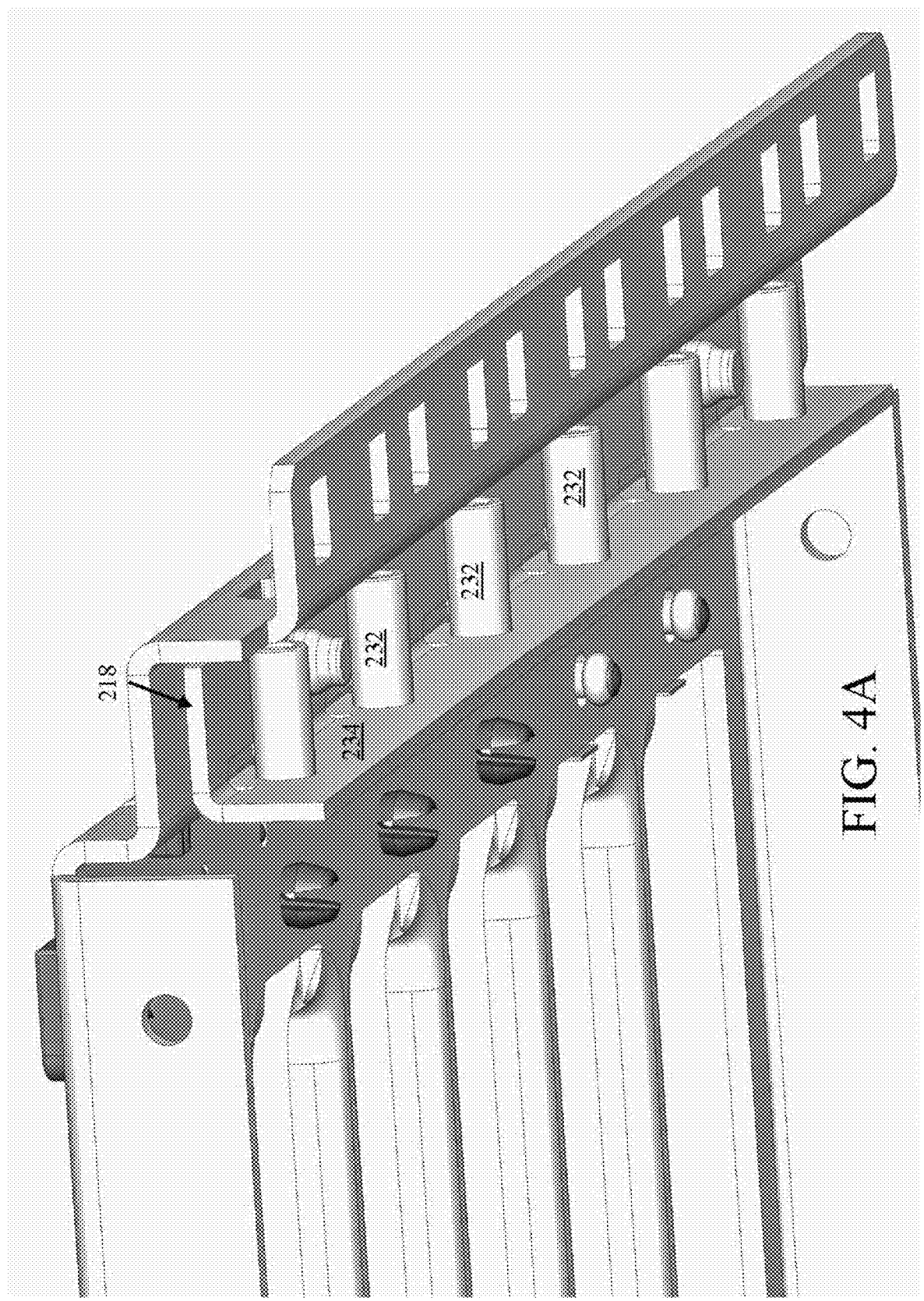

GUIDE PANEL AND METHOD OF MAKING THEREOF

CROSS-REFERENCE TO RELATED APPLICATIONS

This application claims the benefit of priority of U.S. Utility Provisional Patent Application 62/748,435, filed 20 Oct. 2018, the entire disclosure of which is expressly incorporated by reference in its entirety herein.

All documents mentioned in this specification are herein incorporated by reference to the same extent as if each individual document was specifically and individually indicated to be incorporated by reference.

It should be noted that throughout the disclosure, where a definition or use of a term in any incorporated document(s) is inconsistent or contrary to the definition of that term provided herein, the definition of that term provided herein applies and the definition of that term in the incorporated documents) does not apply.

BACKGROUND OF THE INVENTION

Field of the Invention

One or more embodiments of the present invention relate to electronic enclosures such as card, cages and more particularly, to a guide panel used in a card cage and method of manufacture thereof.

Description of Related Art

Conventional card cages are well known and have been in use for a number of years. Regrettably, most conventional card cages used today that are compatible with various industry standards are comprised of guide panel assemblies made of numerous complex parts of different materials and multiple processes.

Each part or component of a guide panel assembly manufactured requires separate, complex, and unique manufacturing process, each of which add their respective tolerances for accommodating manufacturing processes, which cumulatively, produce an imprecise or inaccurate guide panel assembly. Given that some components are customized and manufactured separately through complex processes, most manufacturers are generally required to maintain a large inventory of each manufactured customized component for later use.

Further and as importantly, difficult, labor intensive, and time-consuming process is required to assemble all the manufactured parts into a fully assembled guide panel assembly—a costly task that is prone to many potential errors. For example, any one of the components being assembled to form the guide panel assembly may be damaged or mis-configured during assembly due to human error, which means the unit must be disassembled to, replace the damaged or incorrectly assembled part, which adds to the overall costs in assembly of conventional card cages.

Non-limiting, non-exhaustive listing of examples of components of a single conventional guide panel assembly may include multiple extrusions, fasteners, insulators, and multiple individual injection molded plastic guides of multiple complex configurations, etc. with each requiring different injection molds due to their different feature requirements, shapes and sizes, etc.

Once manufactured and assembled, a guide panel assembly must next be assembled together with other components of a card cage such as power-data transmission, panels to form a fully functional card cage.

Regrettably, alignment of conventional guide panel assemblies in relation to power-data transmission panels of a card cage so to enable proper insertion and connection of a plug-in unit with the power-data transmission panels lacks repeatable accuracy and required additional manual alignment procedures between the plug-in units and their respective power-data transmission panel for each and every card cage that is built.

One known method of "alignment" uses two plug-in units inserted at extreme lateral end slots (left-most and right-most) of the guide panel to potentially align the guide panel with the power-data transmission panel. This task is extremely time consuming, labor intensive, and very inconsistent in its accuracy as the methodology assumes that the remaining slots in between the extreme lateral end slots of the guide panel would automatically align with the power-data transmission panel.

Accordingly, in light of the current state of the art and the drawbacks to current guide panels and complex manufacturing processes that must meet industry standards, a need exists for a guide panel and manufacturing process thereof that would comprise of a single, unitized piece, which would reduce overall accumulated error tolerances and reduce labor in terms of the assembly of a card cage.

Further, a need exists for a guide panel and manufacturing process that would enable the guide panel to self-align with other components that constitute the overall card cage without the use of plug-in units for alignment.

Additionally, a need exists for a guide panel and manufacturing process that would be fully compatible with industry standard requirements and needs to ensure conformity, without loss in functionality.

BRIEF SUMMARY OF THE INVENTION

A non-limiting, exemplary aspect of an embodiment of the present invention provides a guide panel, comprising:
a unitized construction that includes:
a guidance slot;
an engagement structure; and
a power-data transmission alignment structure.

Another non-limiting, exemplary aspect of an embodiment of the present invention provides a guide panel, comprising:
a unitized construction, having:
guidance slot; and
engenderment structure for engagement with one of a plug-in unit panel and a filler panel, that includes:
a step configuration comprising:
horizontal and vertical surfaces;
a first horizontal surface of horizontal surfaces is comprised of a latch-opening that receives a latch of a latch mechanism of a handle of a one of plug-in unit panel and filler panel;
a first vertical surface that includes:
a pass-through securing-opening that secure one of the plug-in unit panel and the filler panel; and
a guide-opening for receiving a first guide-pin of one of the plug-in unit panel and the filler panel;
the first vertical surface leads to a second horizontal surface, which, in turn, leads to a second vertical surface.

Yet another non-limiting, exemplary aspect of an embodiment of the present invention provides a guide panel, comprising:

alignment structures that facilitate with precision and accuracy an engagement of plug-in units with a power-data transmission panel;

alignment structures further facilitate the prevention of the power-data transmission panel associated with the guide panel from an in-plane rotation movement, a lateral movement, and a vertical movement.

A further non-limiting, exemplary aspect of an embodiment of the present invention provides a guide panel, comprising:

a unitized construction that includes:

a guidance, slot;

an electro-static discharge (ESD) component secured within an ESD opening on the guide panel; and an engagement structure.

Still a further non-limiting, exemplary aspect of an embodiment of the present invention provides a method of making a guide panel, comprising:

mapping coordinates of one or more connectors of a plug-in unit onto a power data transmission panel;

constructing a corresponding one or more connector of power-data transmission panel from the mapping;

constructing a guidance slot size, position, and orientation of guide panel from the coordinates of the one or more connectors of the plug-in unit;

determining a coordinate of a slot surface of guidance slot, mapping the coordinate onto the power-data transmission panel, and constructing alignment openings of the power-data transmission panel from the mapping.

These and other features and aspects of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" may be used to mean "serving as an example, instance, or illustration," but the absence of the term "exemplary" does not denote a limiting embodiment. Any embodiment described as "exemplary" is not necessarily to be construed as preferred or advantageous over other embodiments. In the drawings, like reference character(s) present corresponding part(s) throughout.

FIGS. 4A to 4C are non-limiting, exemplary illustrations of a fastener bar and its connection with guide panel in accordance with one or more embodiments of the present invention;

DETAILED DESCRIPTION OF THE INVENTION

Figure 1A:
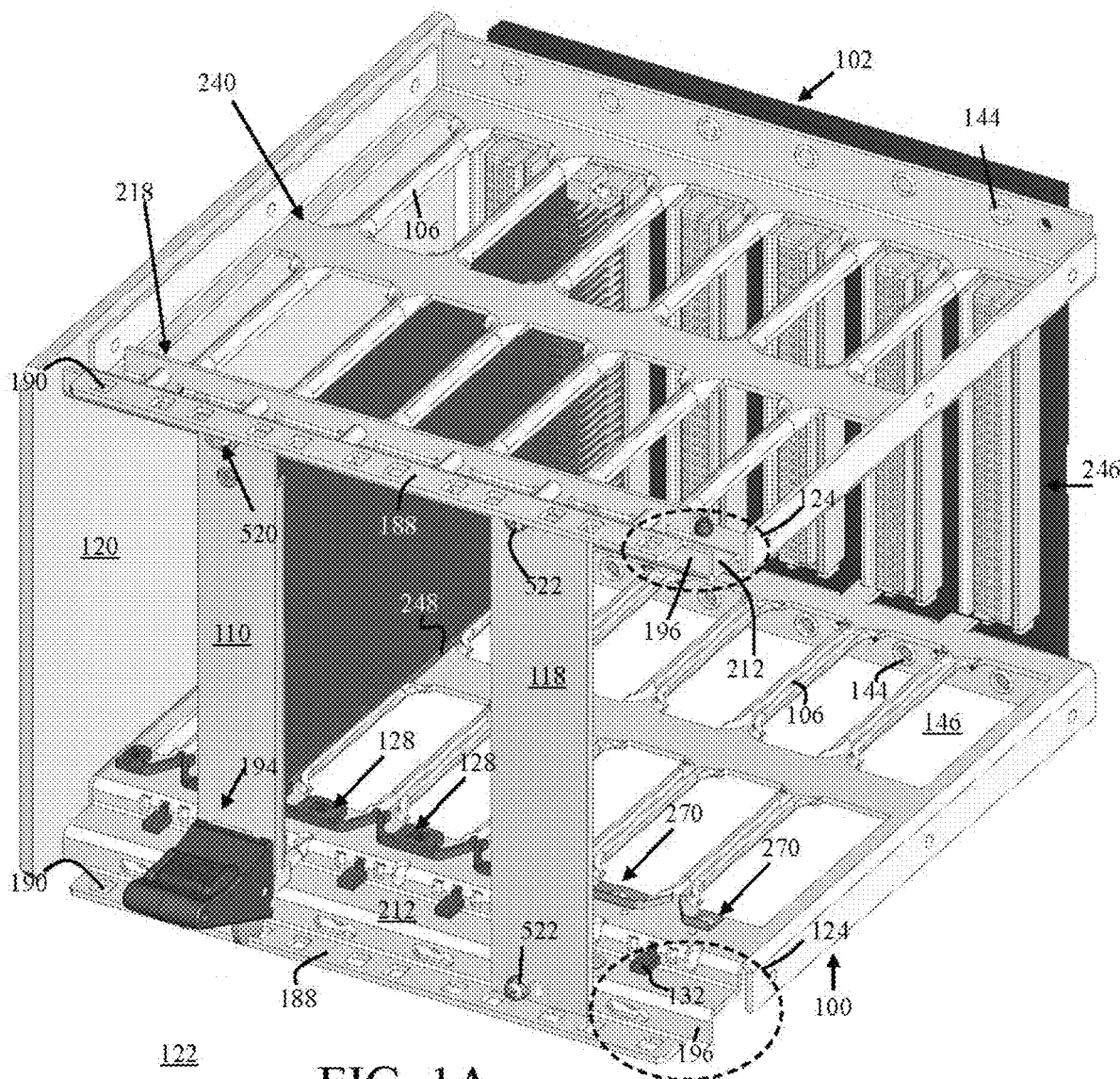
FIGS. 1A to 1E are a non-limiting, exemplary illustration of the various views of a partially assembled card cage with guide panels in accordance with one or more embodiments of the present invention.

The detailed description set forth below in connection with the appended drawings is intended as a description of presently preferred embodiments of the invention and is not intended to represent the only forms in which the present invention may be constructed and or utilized.

It is to be appreciated that certain features of the invention, which are, for clarity, described in the context of separate embodiments, may also be provided in combination in a single embodiment. Conversely, various features of the invention that are, for brevity, described in the context of a single embodiment may also be provided separately or in any suitable sub-combination or as suitable in any other described embodiment of the invention. Stated otherwise, although the invention is described below in terms of various exemplary embodiments and implementations, it should be understood that the various features and aspects described in one or more of the individual embodiments are not limited in their applicability to the particular embodiment with which they are described, but instead can be applied, alone or in various combinations, to one or more of the other embodiments of the invention.

One or more embodiments of the present invention define a card cage as a chassis for electrical and or electronic equipment. A chassis is defined in accordance to its ordinary meaning, which is a structural framework (in the present instance) of electrical and or electronic equipment. The term chassis and the phrase "card cage" are deemed equivalent by the present invention and may be used interchangeably.

One or more embodiments of the present invention define a plug-in unit as an element (such as Printed Circuit Board(s)—PCB) that mounts within a card cage that may have a plug-in unit panel.

One or more embodiments of the present invention define a plug-in unit panel as an actual cover that may have securing fasteners and may further include a handle. The plug-in unit handle may comprise a static handle, one or more injector/ejector handles, or both.

One or more embodiments of the present invention defines a filler panel as a cover that fills an opening at a position that would normally be occupied by a plug-in unit. In other words, filler panels may, for example, be comprised of a simple panel with securing fasteners.

In general, there are two types of plug-in units—board (or card) and box. A board (or card) plug-in unit may be comprised of a PCB that may contain one or more connectors intended to connect to a backplane or midplane (defined below), or other devices such as other plug-in units.

A box plug-in unit may be comprised of a "box" that contains any number of electronic or electro-mechanical components such as PC boards, power supplies, disk or solid-state drives, fans, keypads displays, etc. combined into a "box" plug-in unit.

Both box and board plug-in units include one or more connectors intended to connect to the backplane, midplane, or other devices, and have a plug-in unit panel with a plug-in unit handle (e.g., static handle, injector/ejector handle, or both), including securing fasteners.

One or more embodiments of the present invention define backplane or mid-plane as a power-data transmission panel that is comprised of a Printed Circuit Board (PCB), integrated circuitry or bus architecture and connectors for transmission of communication, power, and or data signals between plug-in units.

As is well known, a backplane is a power-data transmission back-panel or PCB that is positioned at or near the back of a card cage and has plug-in unit connectors on only one side thereof, whereas a midplane is a power-data transmission mid-panel or PCB generally positioned at a general middle portion of the card cage and has plug-in unit connectors on both sides thereof. It should be noted that throughout the disclosure, any references to a back-plane are generally equally applicable to mid-planes and vice versa.

As is well known, the phrase "mid-plane" or "middle-plane" does not necessarily mean that the mid-plane is located in a position within card cage that is exactly at the middle of the chassis. For example, a mid-plane may be positioned much closer to one end of the chassis, typically making that end the "rear" of the card cage with shorter plug-in unit depth that is much smaller in volume than the front section. Accordingly, a mid-plane may be positioned anywhere between front and rear of a card cage and still be referred to as "mid-plane" so long as it may receive plug-in units from both sides thereof.

Throughout the disclosure, a guide panel is provided that intentionally includes a large number of added options and complex features for discussion purposes to clearly demonstrate to those skilled in the art the versatility of a guide panel and its manufacturing process in accordance with one or more embodiments of the present invention.

One or more embodiments of the present invention provide a guide panel and manufacturing process thereof that is comprised of a single, unitized piece, which, reduces overall accumulated error tolerances and reduces labor in terms of the assembly of a card cage.

Further, one or more embodiments of the present invention provide a guide panel and manufacturing, process that self-aligns with other components that constitute the overall card cage and in particular, with a power-data transmission panel without the use of plug-in units for alignment.

Additionally, one or more embodiments of the present invention provide a guide panel and manufacturing process that is fully compatible with industry standards requirements and needs to ensure conformity, without loss in functionality.

FIGS. 1A to 1E are a non-limiting, exemplary illustration of the various views of a partially assembled card cage with guide panels in accordance with one or more embodiments of the present invention. FIG. 1A is a non-limiting, exemplary illustration of the partially assembled card cage 122 showing one of the side panels 120 and a filler panel 118, whereas the rest of the figures show the same (from different views) but without any side panel 120 or filler panels 118 for clarity and discussion purposes. It should be noted that a fully assembled card cage (with its well known, standardized components) is not illustrated for the sake of clarity.

FIGS. 1A to 1E illustrate lower and upper guide panels 100 and 240 in accordance with one or more embodiments of the present invention that are associated with a well-known backplane (i.e., power-data transmission panel) 102 in accordance with one or more embodiments of the present invention.

As detailed below, the only difference between the illustrated lower and upper guide panels 100 and 240 in this non-limiting, exemplary embodiment is that lower guide panel 100 includes, alignment projections 126 and 242 (detailed below) whereas the upper guide panel 240 does not. In other embodiments alignment projections may be on upper guide panel or both upper and lower guide panels. (FIG. 3B-2 is a rear top view of a flipped upper guide panel 240, the rest are various views, of guide panel 100). Accordingly, the description details lower guide panel 100 only as all other aspects of both guide panels 100 and 240 are identical, including all assembled parts such as ESD components, fastener nut bars 218, etc.

Figure 6A:
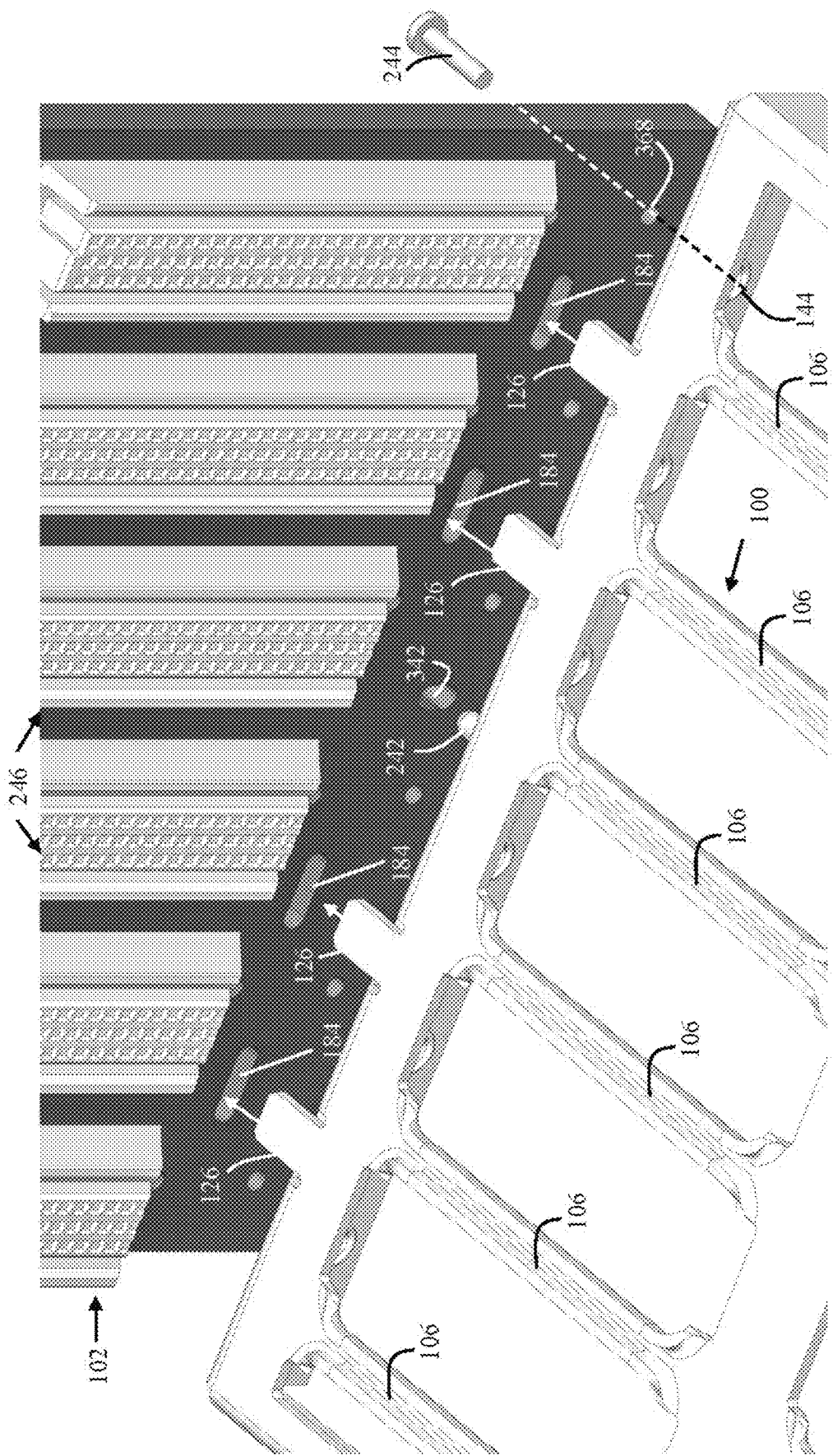
FIGS. 6A to 6I are non-limiting, exemplary illustrations of various detailed views of alignment projections and alignment openings of the guide panel and the power-data transmission panel of FIGS. 1A to 5M in accordance with one or more embodiments of the present invention.
Figure 6B:
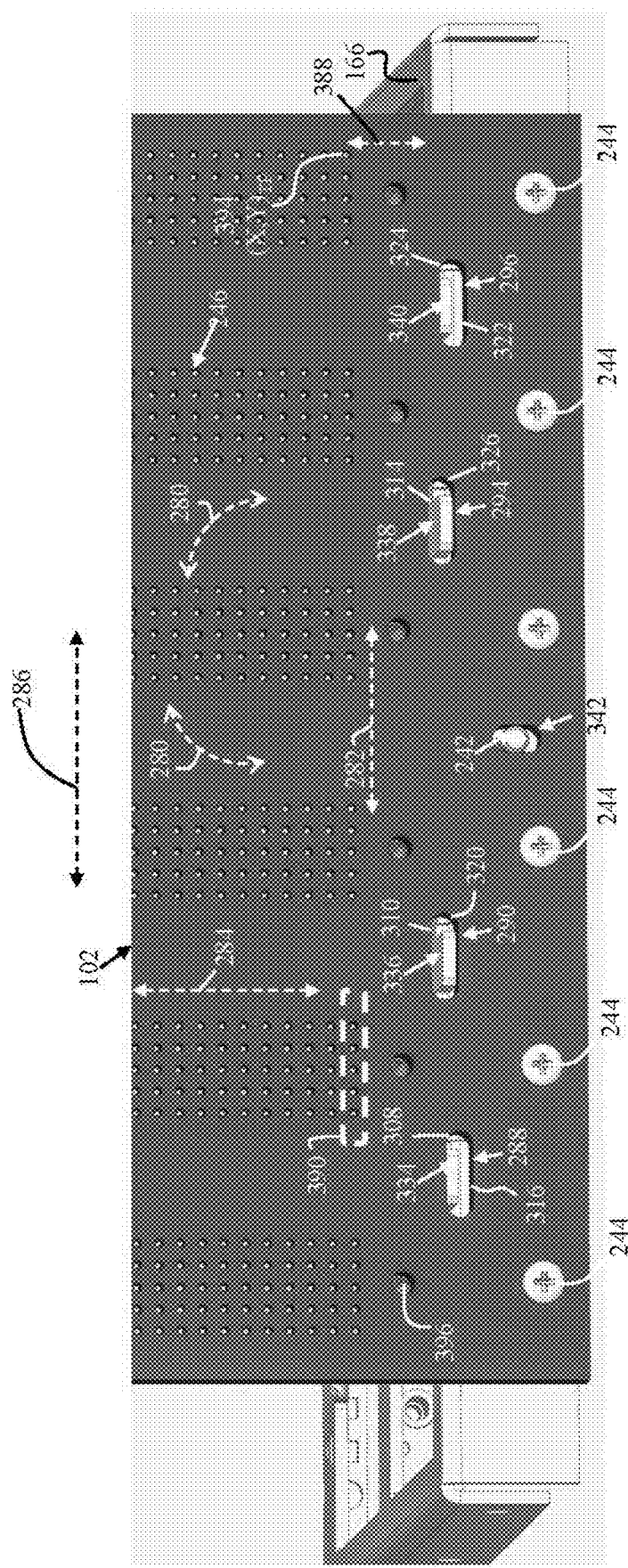
Figure 6C:
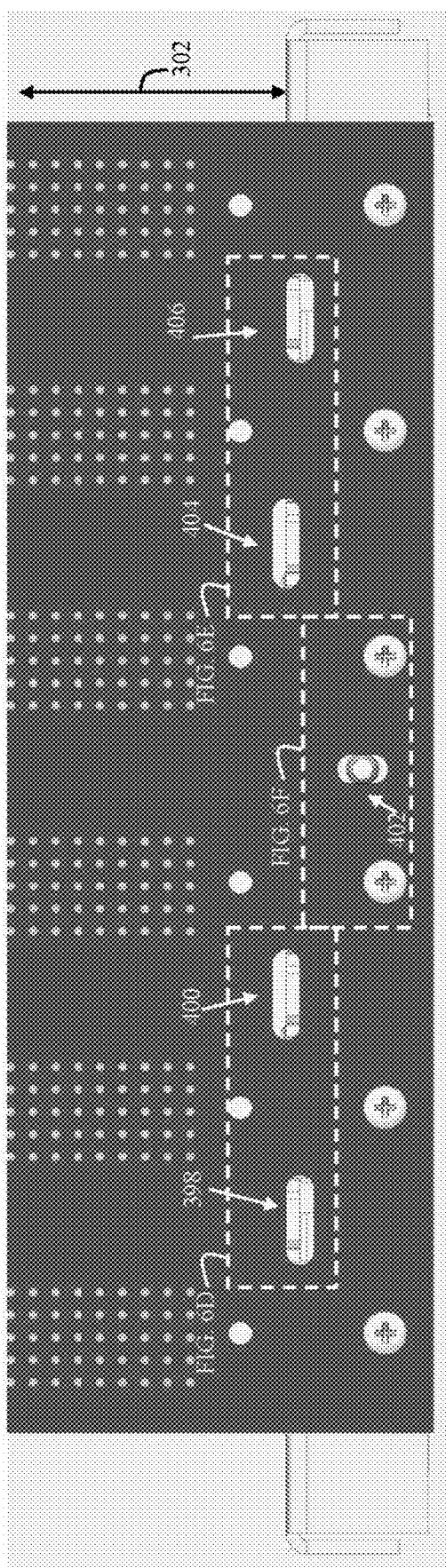
Figure 6D:
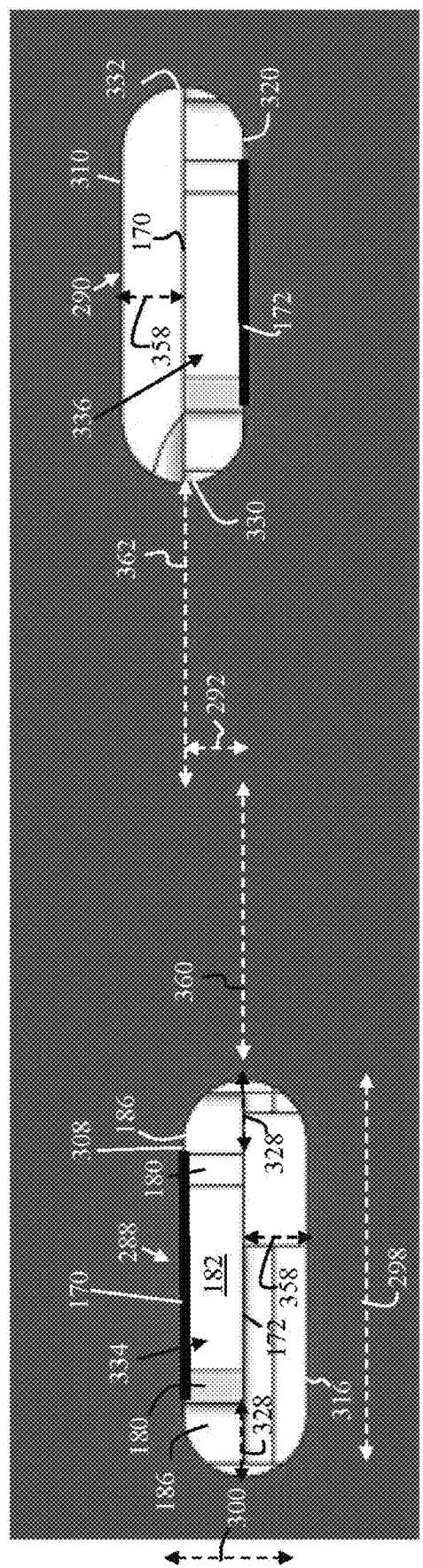
Figure 6E:
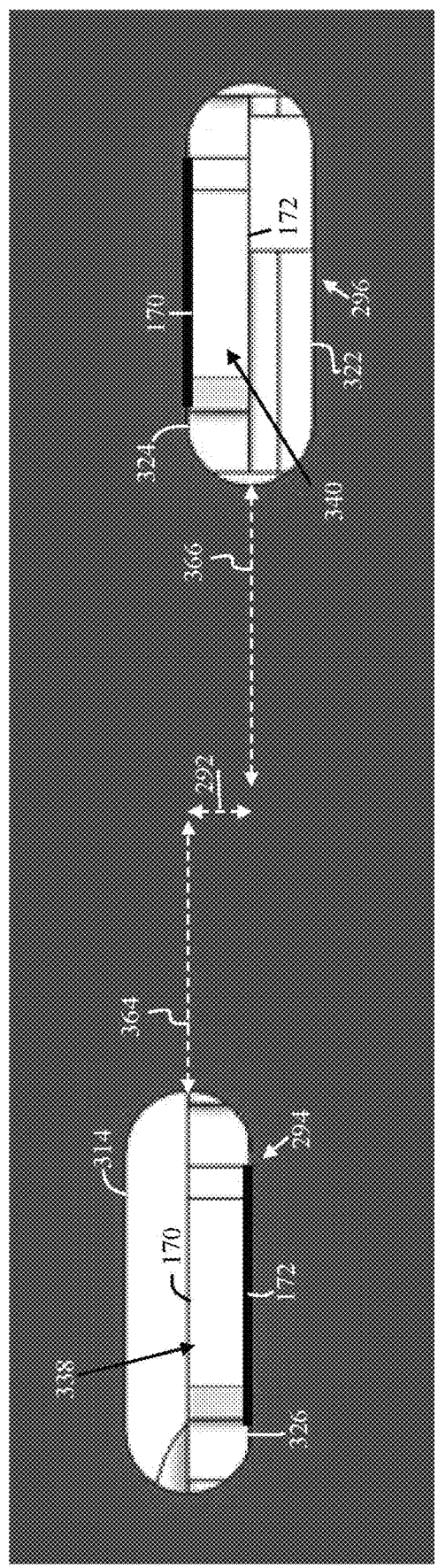
Figure 6F:
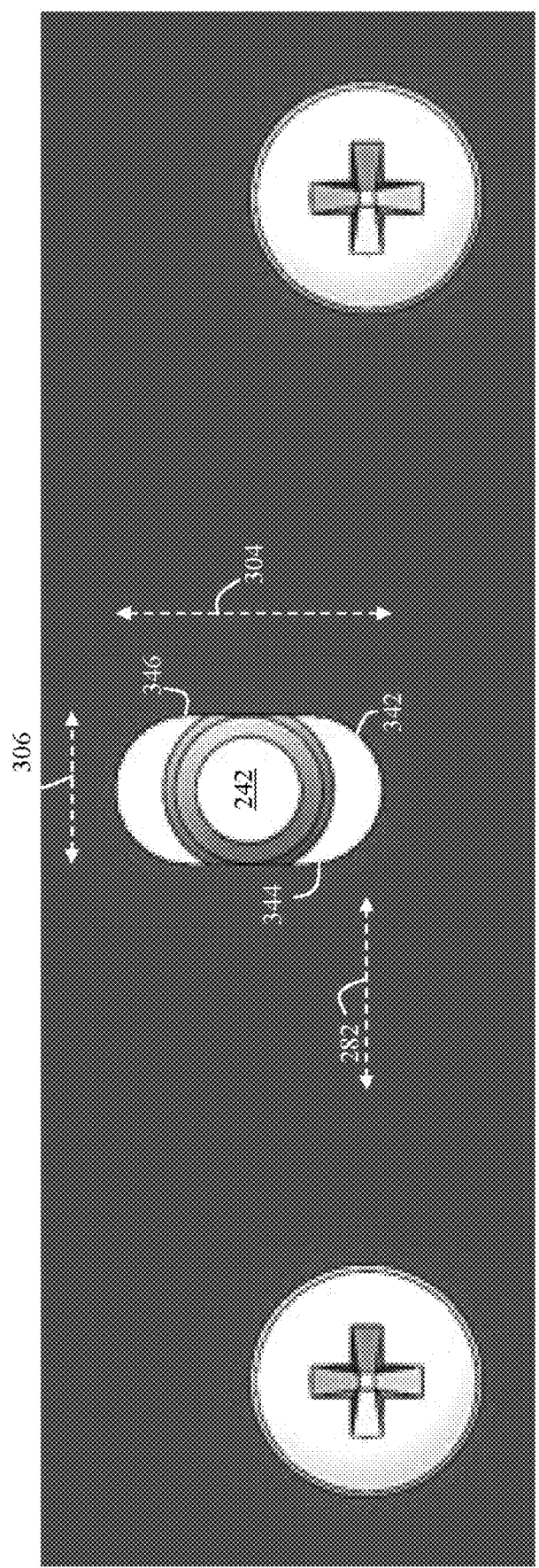
Figure 6G:
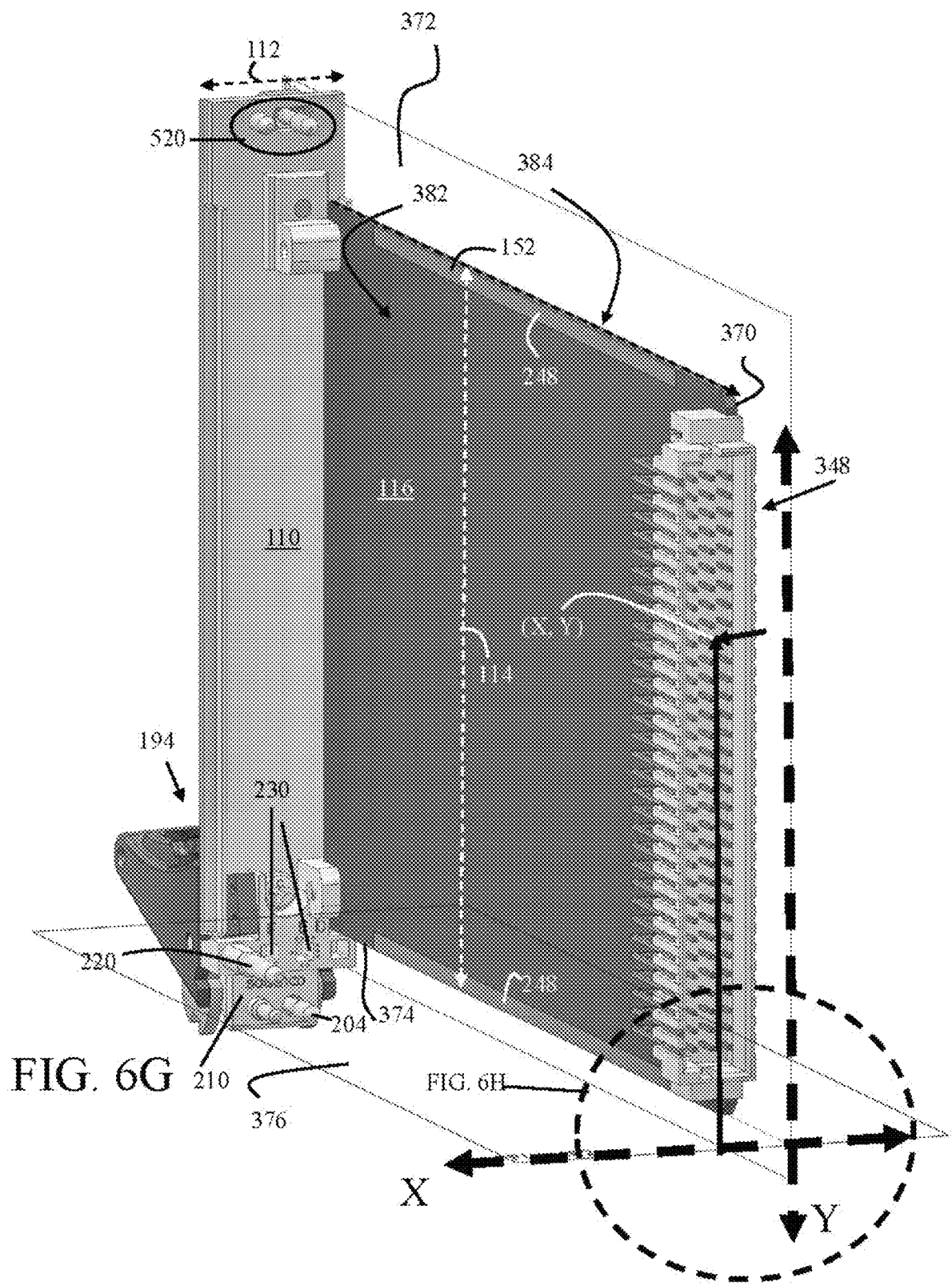
Figure 6H:
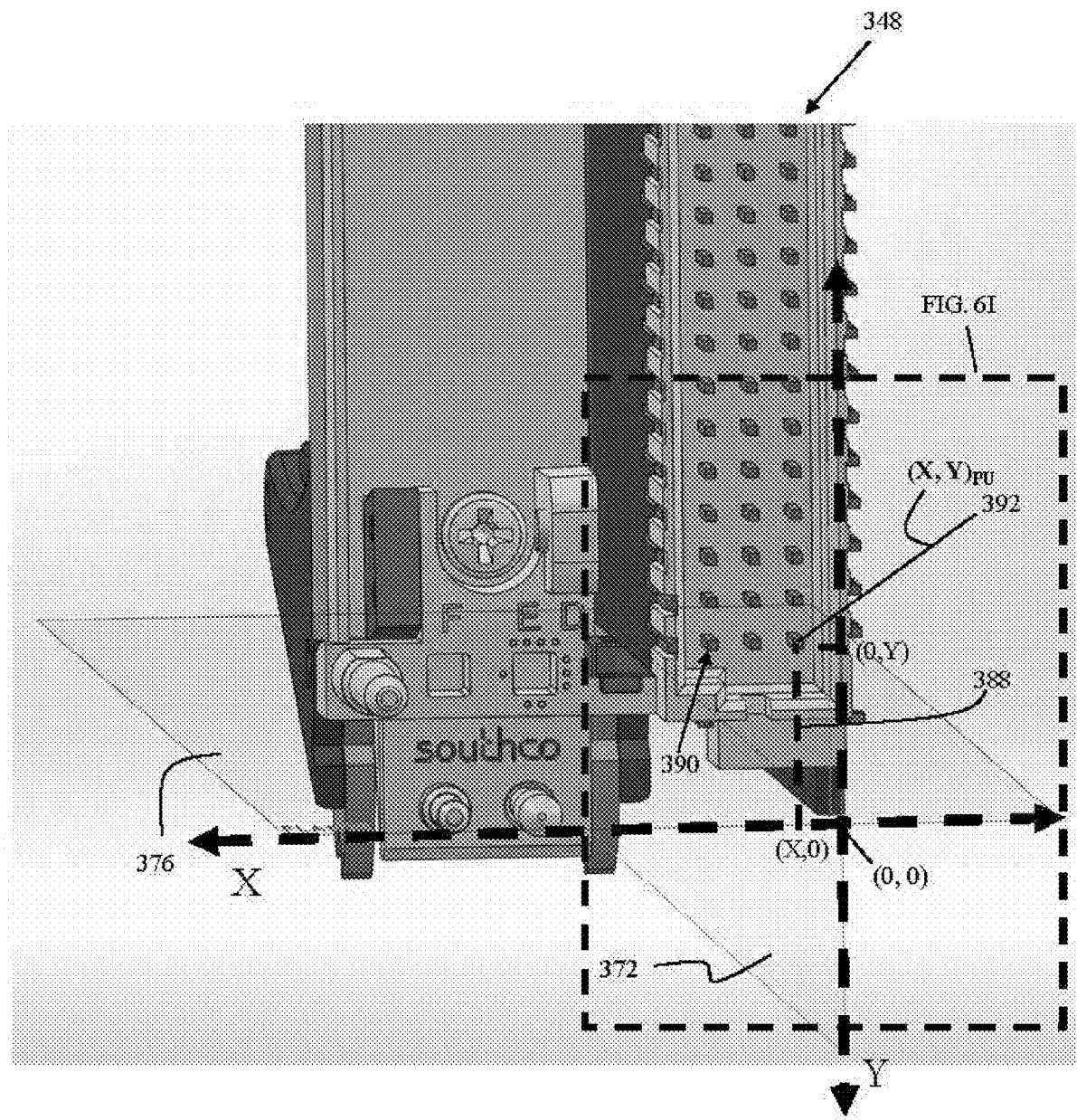
Figure 6I:
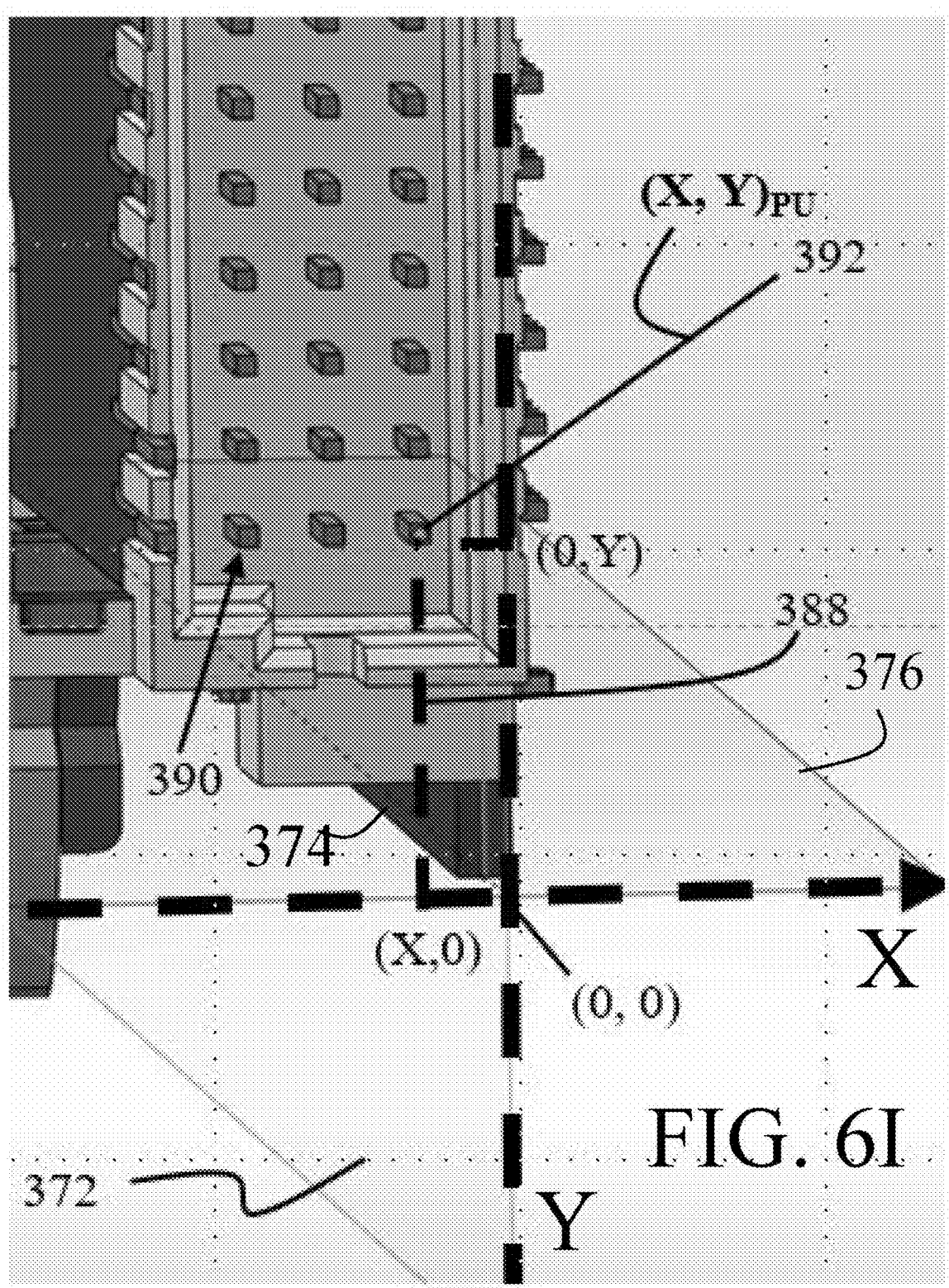

Further illustrated in FIGS. 1A to 1E is a well-known single plug-in unit 104 (details of which is also illustrated in FIGS. 6G to 6I) associated, with lower and upper guide panels 100 and 240 and connected to power-data transmission panel 102 in accordance with one or more embodiments of the present invention. In this non-limiting, exemplary instance, plug-in unit 104 is associated with a lower guide panel 100 by a handle (injector-ejector) 194 (detailed below) and a fastener-guide set 520 with upper guide panel 240.

FIG. 1A also illustrates a well-known filler panel 118 connected to lower and upper guide panels 100 and 240 by simple fastener sets 522, associated with upper and lower fastener nut bars 218 in a well-known manner. FIG. 1A further illustrates lower and upper guide panels 100 and 240 connected to a side-panel 120 (only one side panel is shown for clarity), forming the chassis. Filler panel 118 and side panels 120 are not shown in the rest of the figures for simplicity and clarity.

In general, guide panels 100 may be designed based on the largest size plug-in unit 104 (FIG. 1C) in terms of their height and depth (further defined below), and divided or sub-divided for accommodating smaller sized plug-in units 104. Guide panels 100 may accommodate a wide variety of different sized plug-in units (other plug-in units are not shown). For example, board plug-in units 104 may be sized 4 HP wide 112 by 6 U in height 114, while an adjacent board plug-in unit (not shown for simplicity) may be comprised of a 6 HP with 6 U height.

As is well known, "HP" stands for Horizontal Pitch. In general, most (but not all) conventional card cages set 1 HP as a fixed horizontal distance 112 of 0.200 inches. This very limiting conventional set value of 0.200 inch of spacing for base HP (1 HP) is set because of the methods conventional extrusions are produced along with the manner in which the conventional injection molded plastic card guides are designed.

The present invention does not use conventional extrusion methodology along with the conventional injection molded plastic card guides to produce guide panels 100. Instead, as detailed below, the present invention utilizes machinery (e.g., Computer Numerical Control—CNC machines, or stamping presses) that enable the use of other HP units without restrictions. For example, instead of setting 1 HP to equal to 0.200 inches, 1 HP may be set to 0.131 inch or other selected values based on the required engineering parameters.

As indicated above, HP units of measurements may be used to manufacture a card cage, including producing different width and depth sized plug-in units, different spacings between guidance slots 106 and depth of a guide panel 100, etc. To ensure minimal confusion the card cage height and depth must be matched to the plug-in unit, height and depth. The width is the variable within a single card cage.

For example, the width distance of a plug-in unit, panel 110 is measured in terms of HP, which must also account for a small clearance gap or space on either side to ensure unobstructed insertion removal of each plug-in unit panel. Accordingly, a plug-in unit panel width may simply be defined as xHP, where x is multiple of the base unit z. For example, base unit may be selected to equal z=0.112 inches. In the case of base unit z=0.112 inch, systems may include various sized board or box plug-in units, or filler panels (detailed below) such as 4 HP (=0.448 inch), 5 HP (=0.560 inch), 6 HP (=0.672), 8 HP (=8.96 inch), 12 HP (=1.344 inch), or xHP=z*x.

Figure 1B:
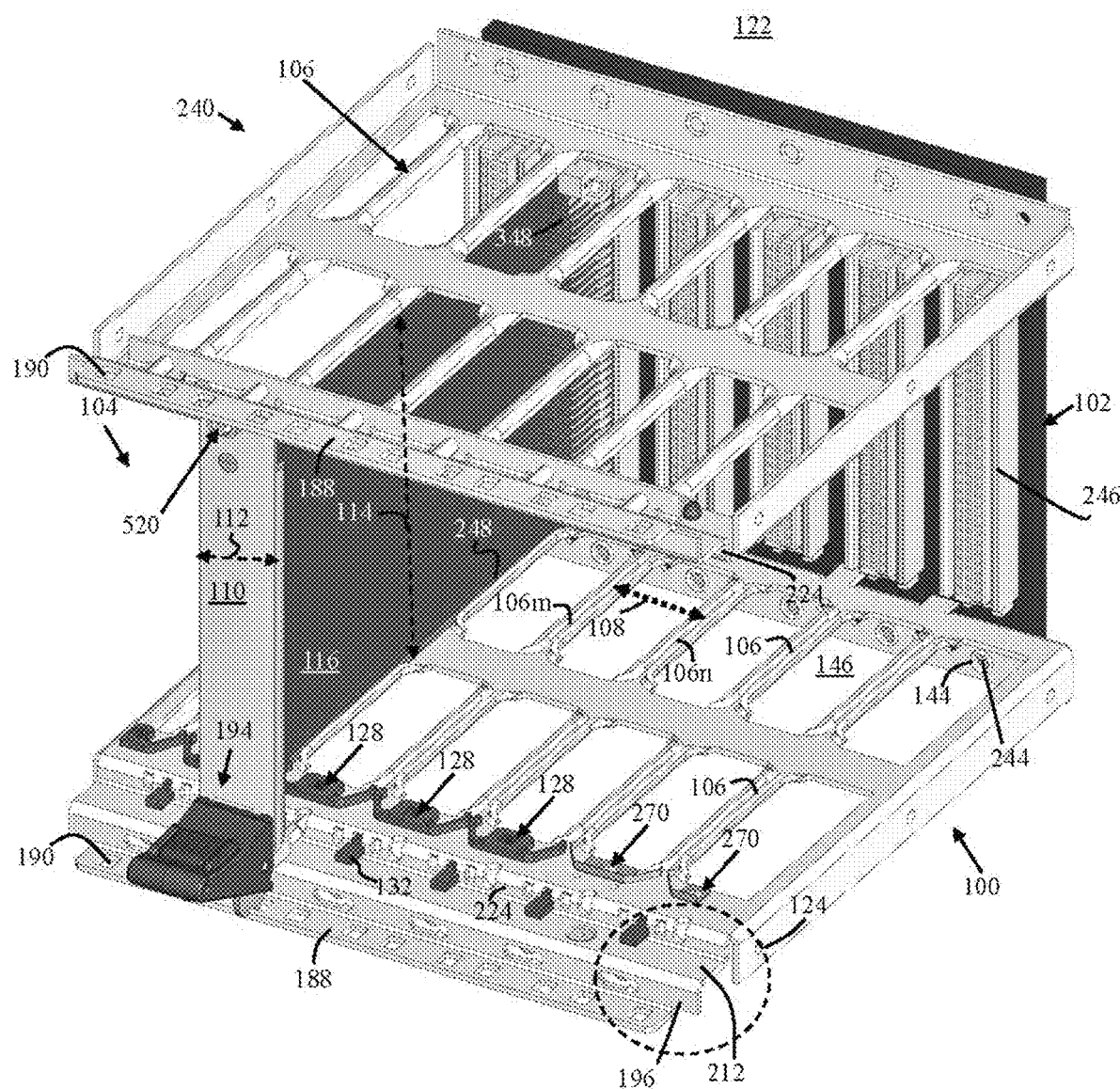

As another example, HP units of measurements are also used for guide panel 100 and in particular, guidance slot distances 108 of guide panels 100. In other words, the xHP for a guidance slot 106 separation distance 108 (from one guidance slot 106m to the next, adjacent slot 106n) must be commensurate with xHP measurement of a corresponding plug-in unit panel 110 that will be inserted into the given guidance slot 106. As illustrated in FIG. 1B. HP may be different from one plug-in unit panel 110 to next and also, correspondingly, from one guidance slot 106 to next guidance slot on a single guide panel 100.

As is also well known, the measurements of 3 U, 6 U, 9 U, and 12 U refer to the height 114 of a PCB 116 of a plug-in unit 104 that will fit in between lower and upper guide panels 100. The 3 U, 6 U, 9 U, and 12 U units of measurements may be used to produce different height sized plug-in units 104 (box or board) or filler panels 118 commensurate with distances between lower and upper guide panels 100 and 240.

As is further well known, filler panel 118 may also be used in, any corresponding location along guide panels 100 where a plug-in unit panel 110 may be secured. For example, the illustrated plug-in unit 104 may be replaced by a simple, well known and conventional filler panel 118 and instead, the illustrated plug-in unit 104 may be mounted onto an adjacent position and connected to power-data transmission panel 102. As another example, depending on the use of the card cage, the rest of the spaces illustrated in FIGS. 1A to 1E may all be covered by filler panels 118. In that case, the final card cage would have the illustrated single plug-in unit 104. One function of filler panel 118 is to facilitate and maintain proper airflow within the finalized card cage, otherwise air would escape from the opening not covered by filler panel 118 which may result in an overheating condition of adjacent plug-in units 104. Filler panels 118 may also be used to facilitate in maintaining faraday cage continuity (well-known).

FIGS. 2A to 2D are non-limiting exemplary exploded view illustrations of the various components of only a single guide panel 100 and power-data transmission panel 102 combination illustrated in FIGS. 1A to 1E in accordance with one or more embodiments of the present invention. The exploded views shown in FIGS. 2A to 2D illustrate disassembled, separated components that show the cooperative working relationship, orientation, positioning, and exemplary manner of assembly of the various components of guide panel 100 and power-data transmission panel 102 in accordance with one or more embodiments of the present invention, with each component detailed below.

As illustrated and further detailed below, guide panel 100 may comprise of structures such as various openings to enable mounting of different components such as different types of Electrostatic Discharge components 128 and 270, an angled nut-bar 218, indexing elements 132, in addition to various openings to interface with a plug-in unit panel 110 or a filler panel 118. Further included are alignment and securing structures (detailed below) that enable proper engagement and securing of guide panel 100 with power-data transmission panel 102.

Figure 3A:
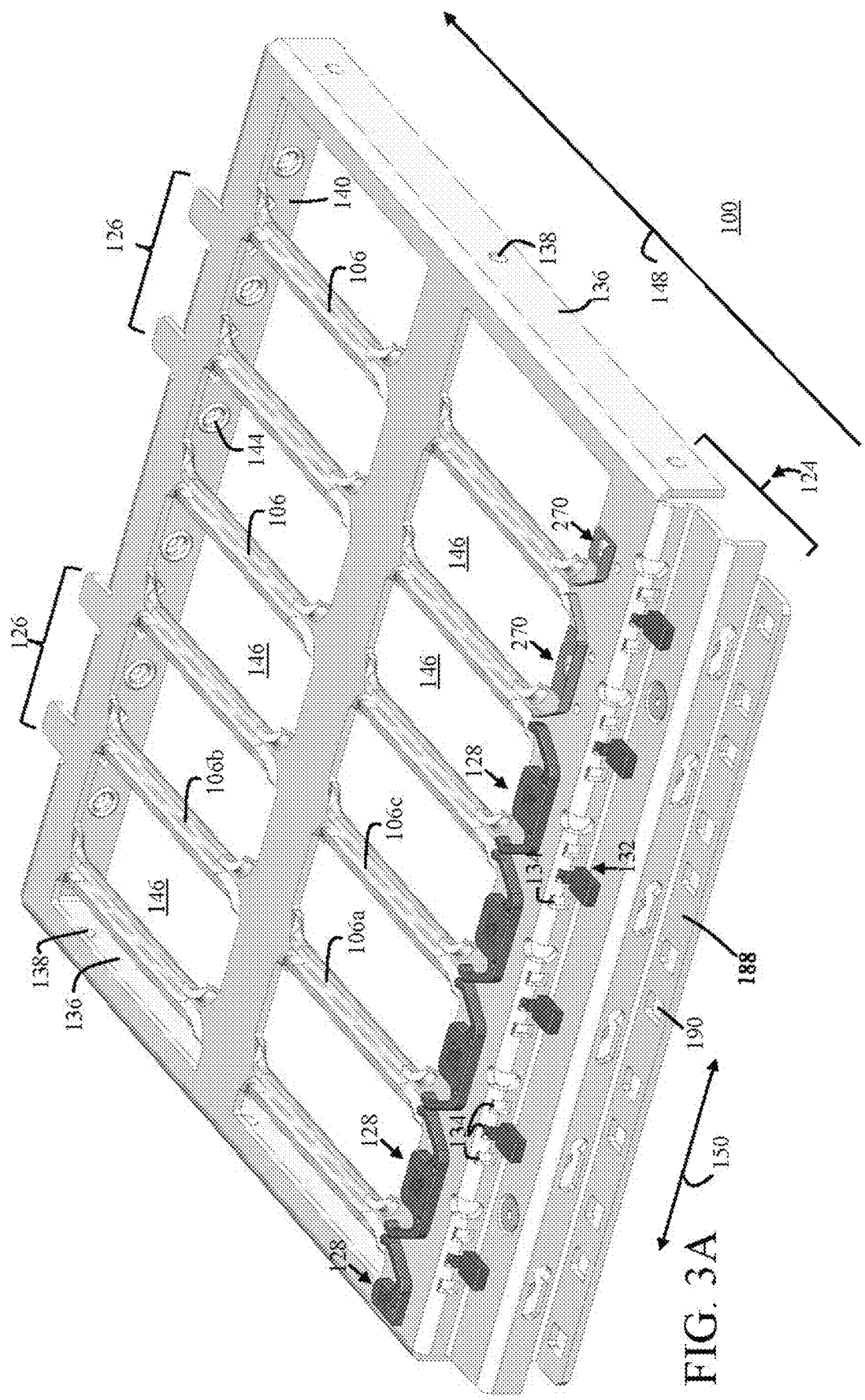
FIGS. 3A to 3N are non-limiting, exemplary illustrations of a guide panel in accordance with one or more embodiments of the present invention.
Figures 1, 3B:
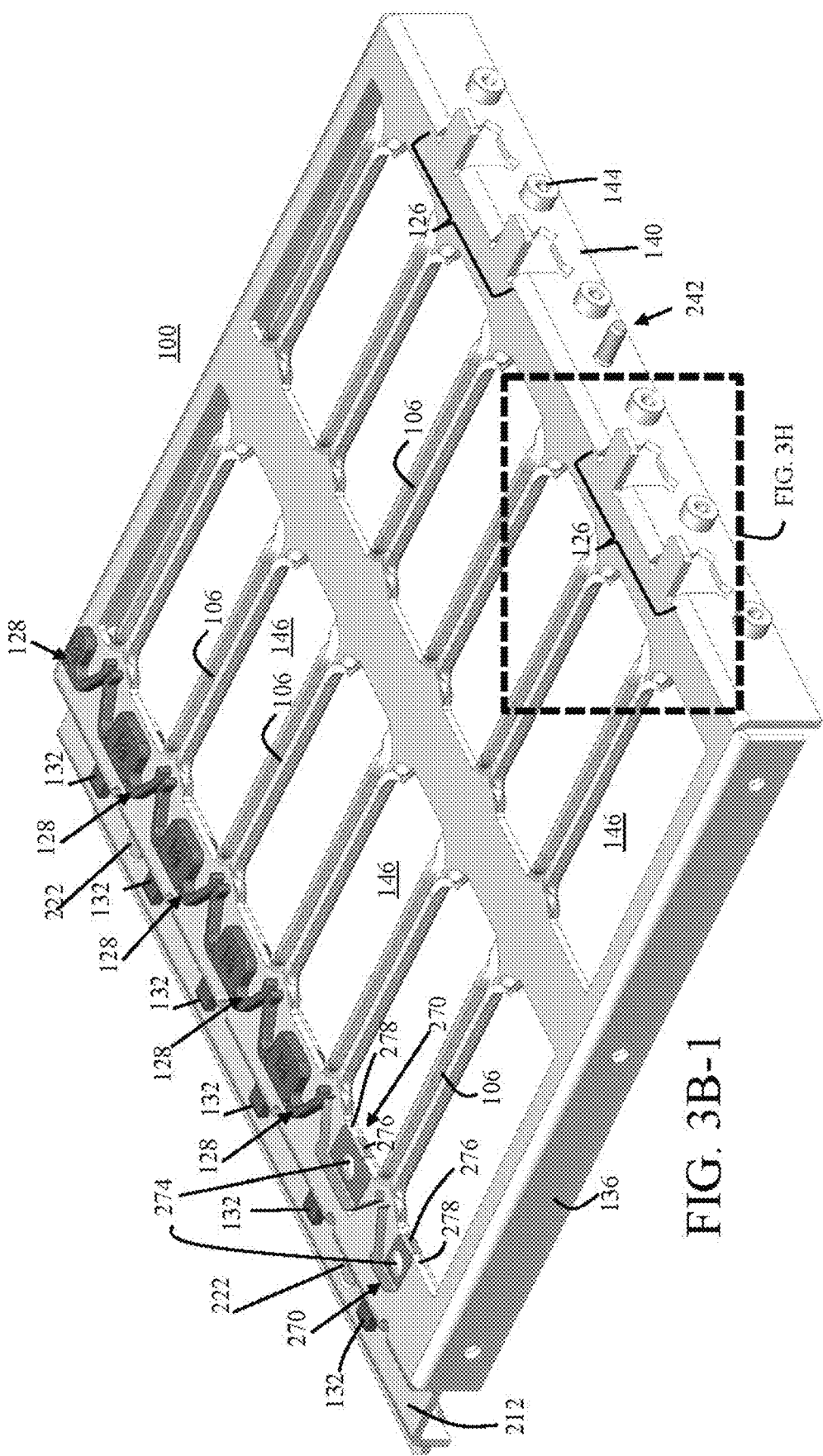
Figures 2, 3B:
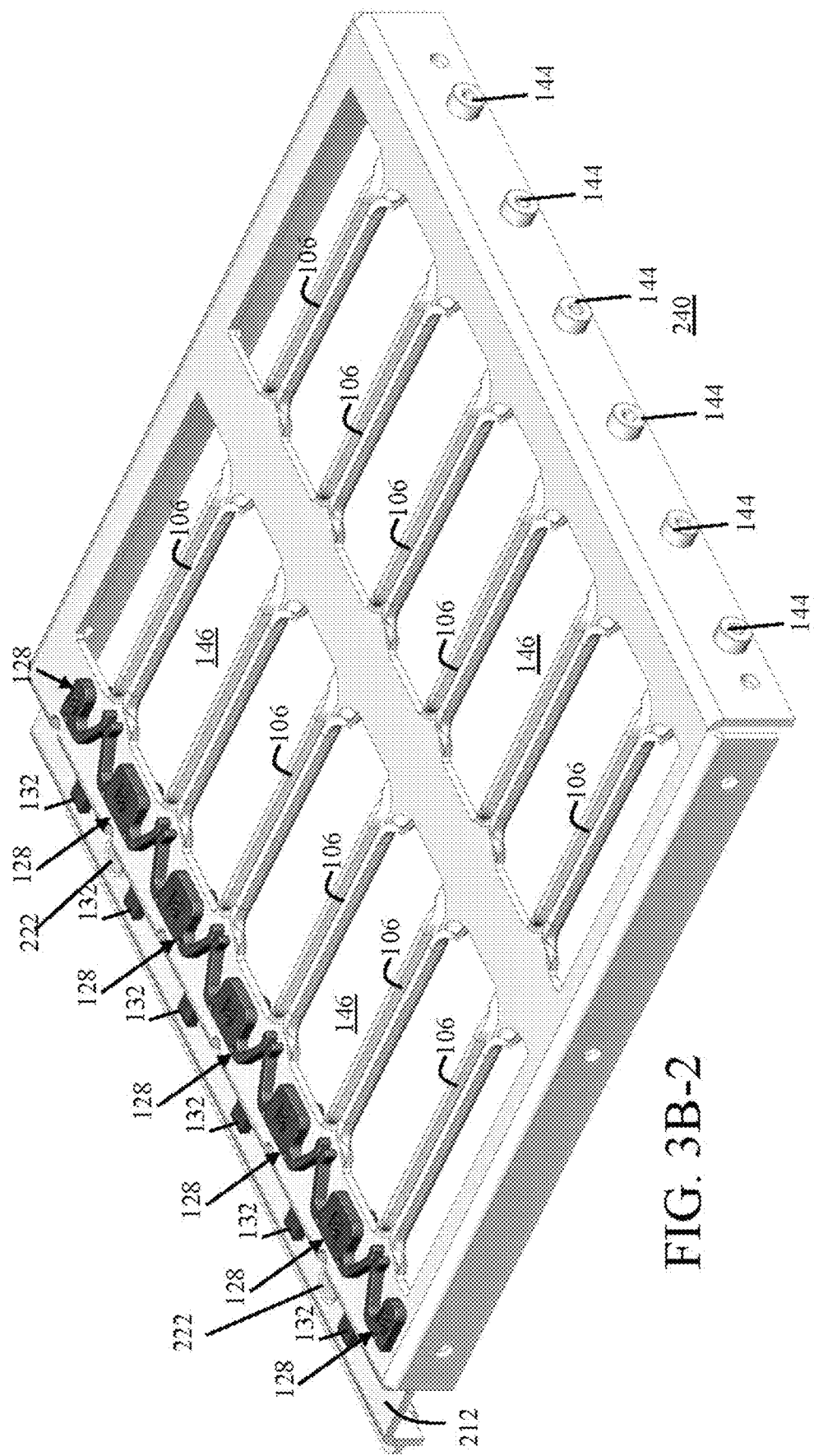
Figure 3C:
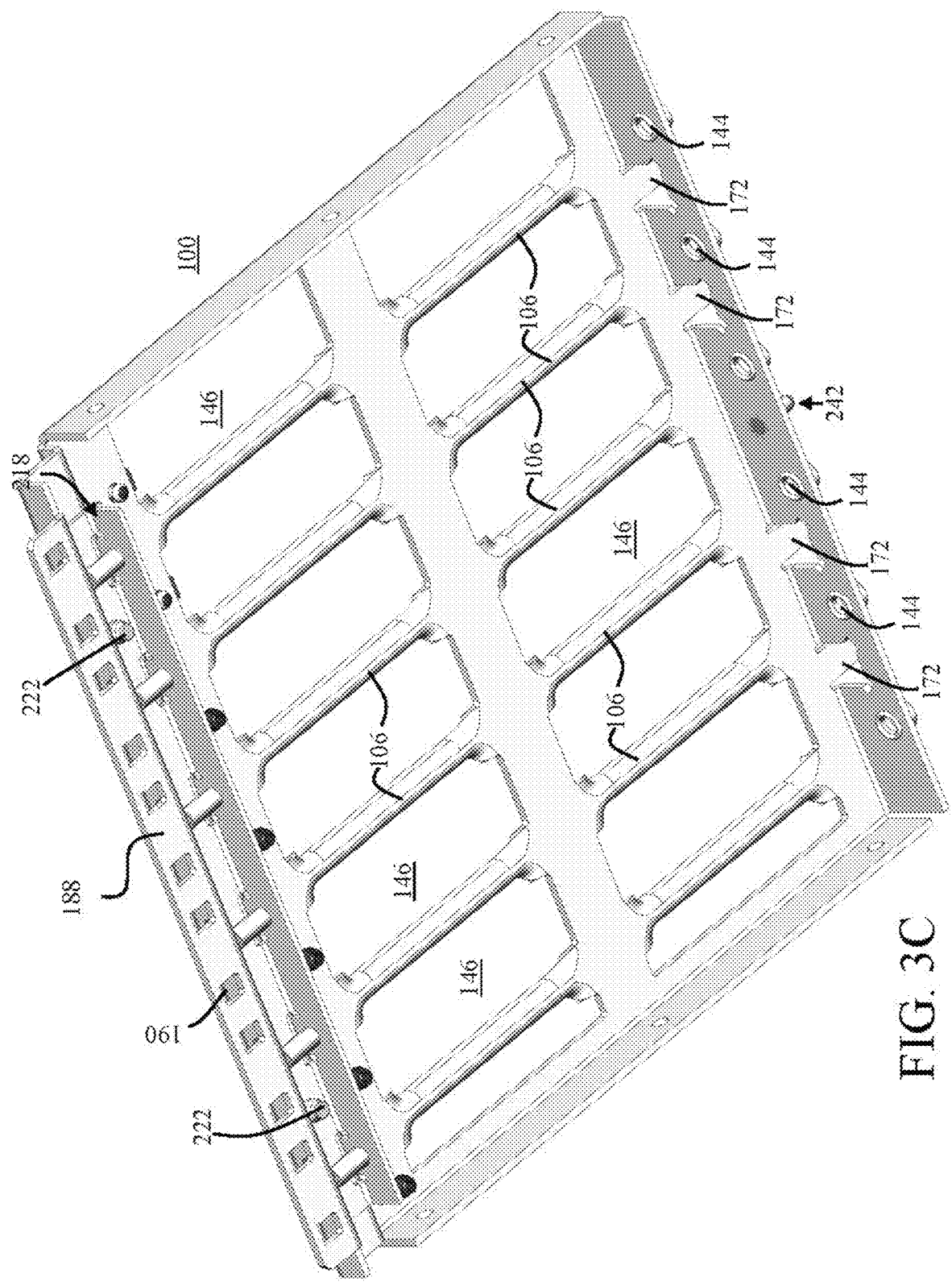
Figure 3D:
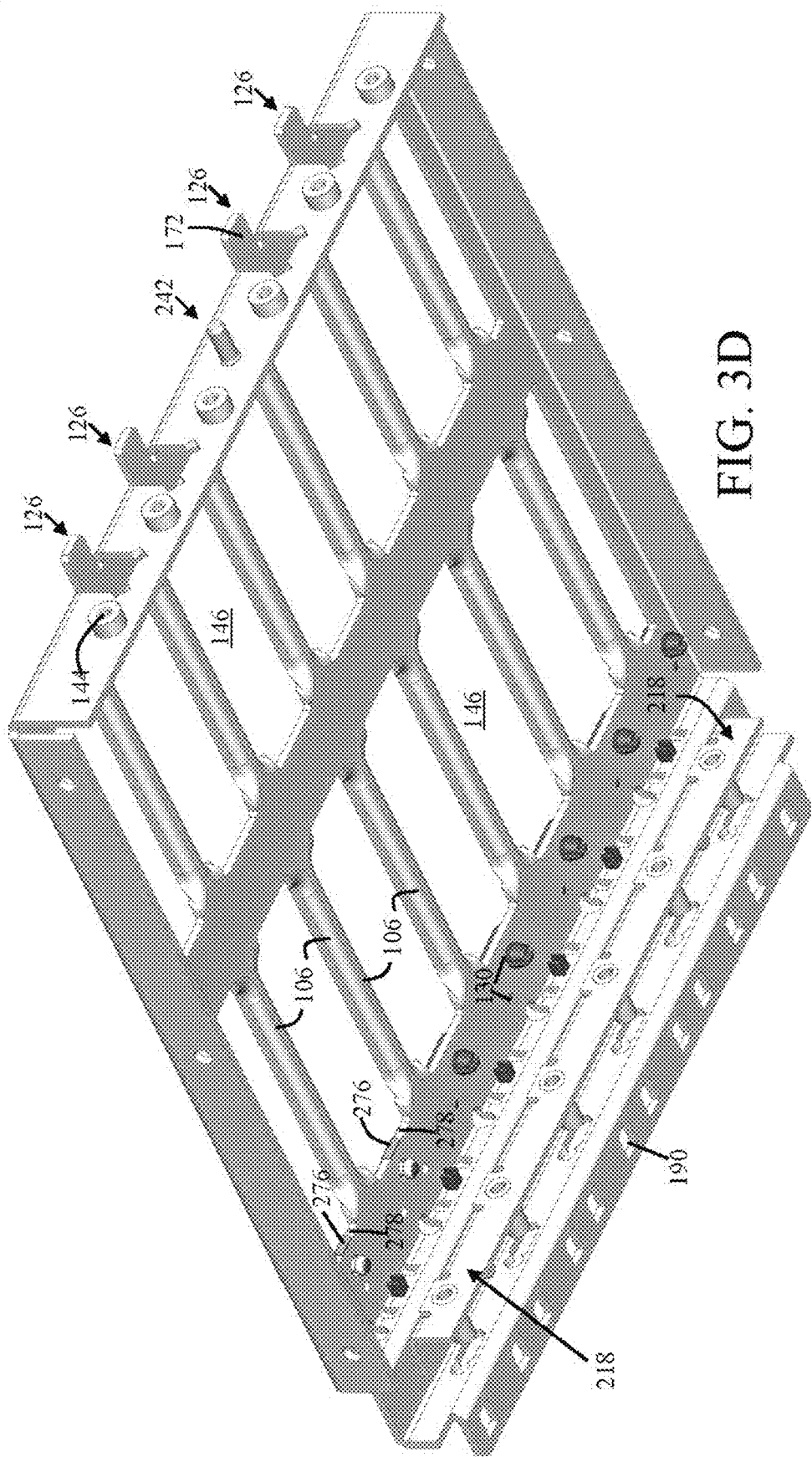
Figure 3F:
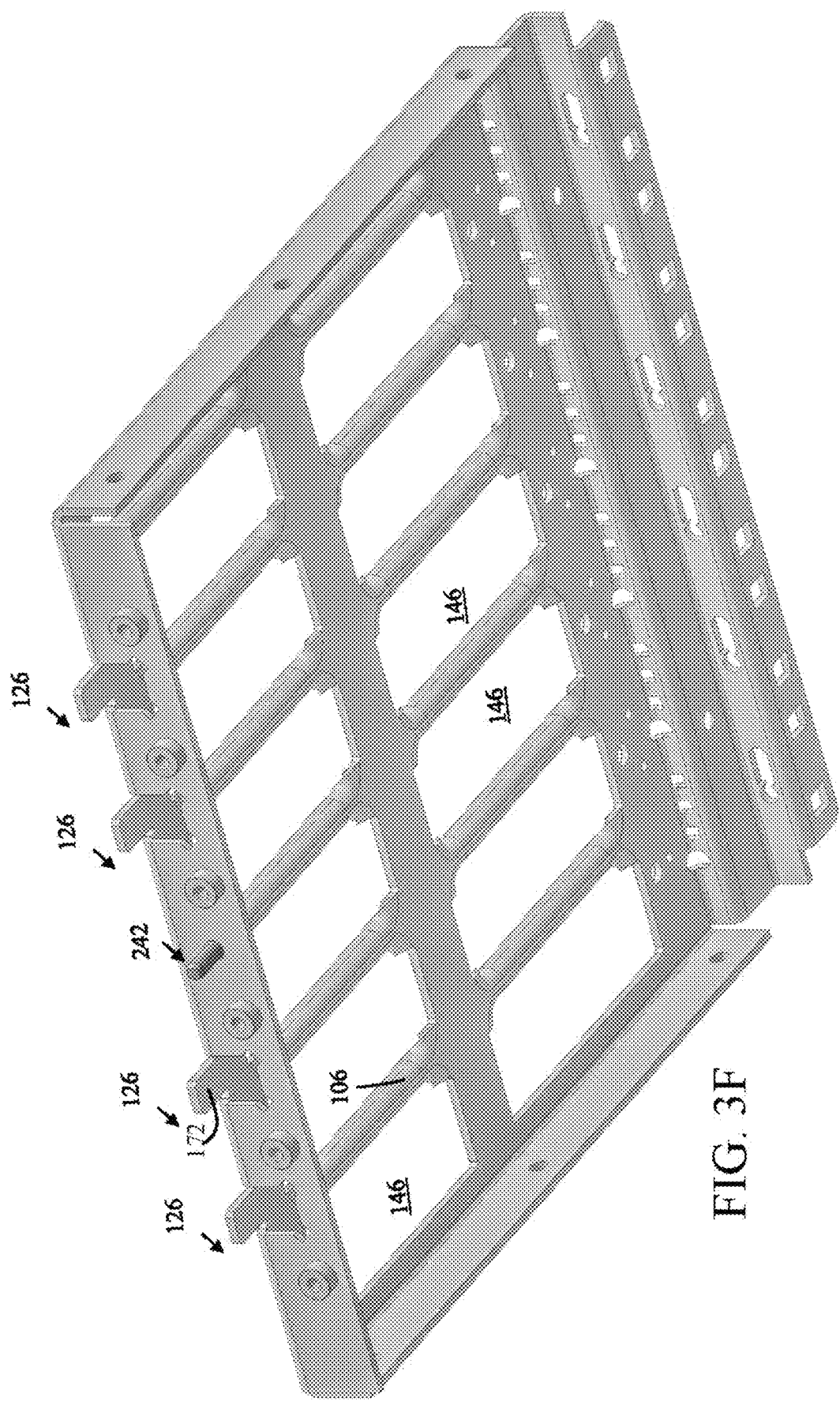
Figure 3G:
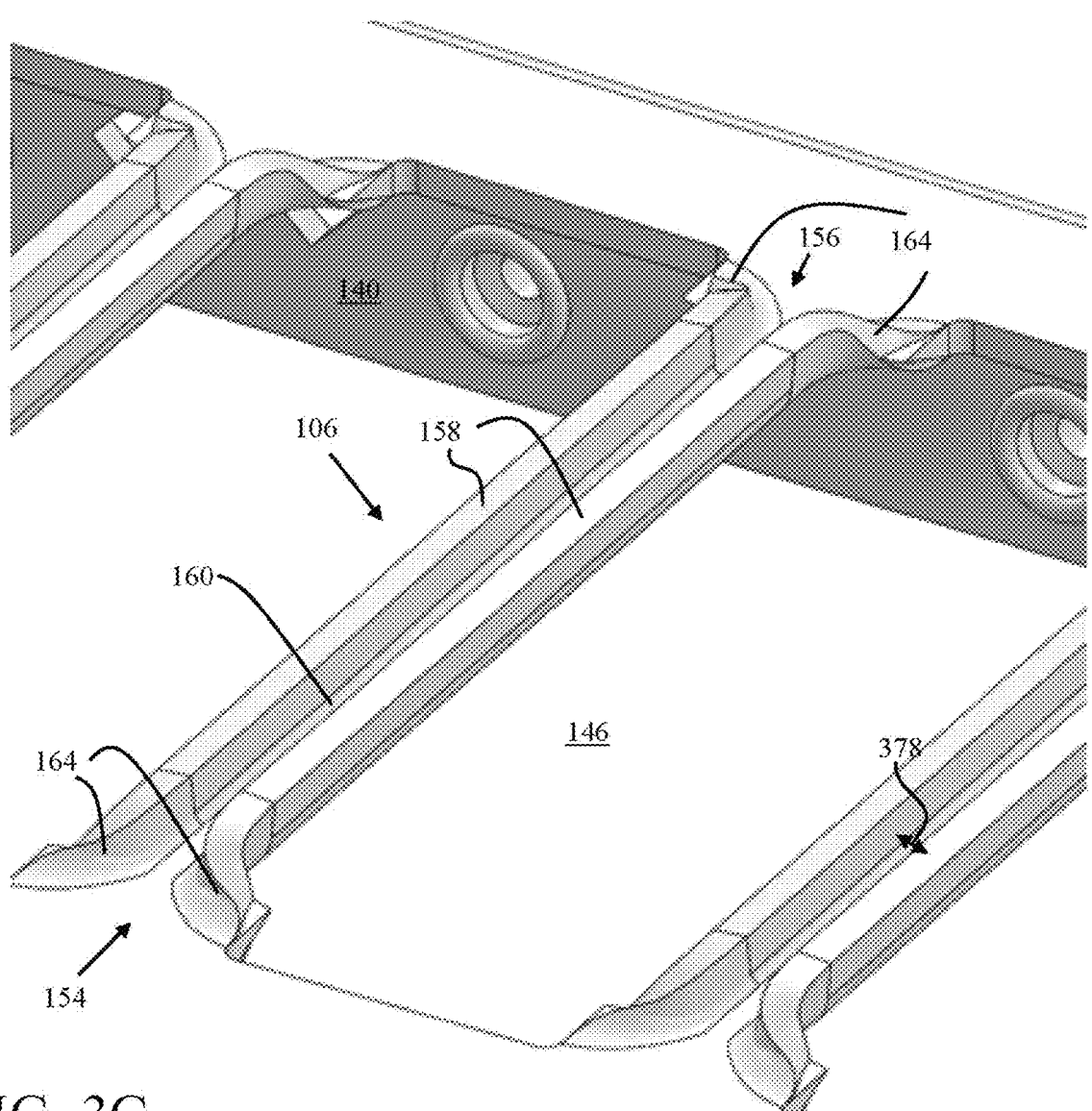
Figure 3H:
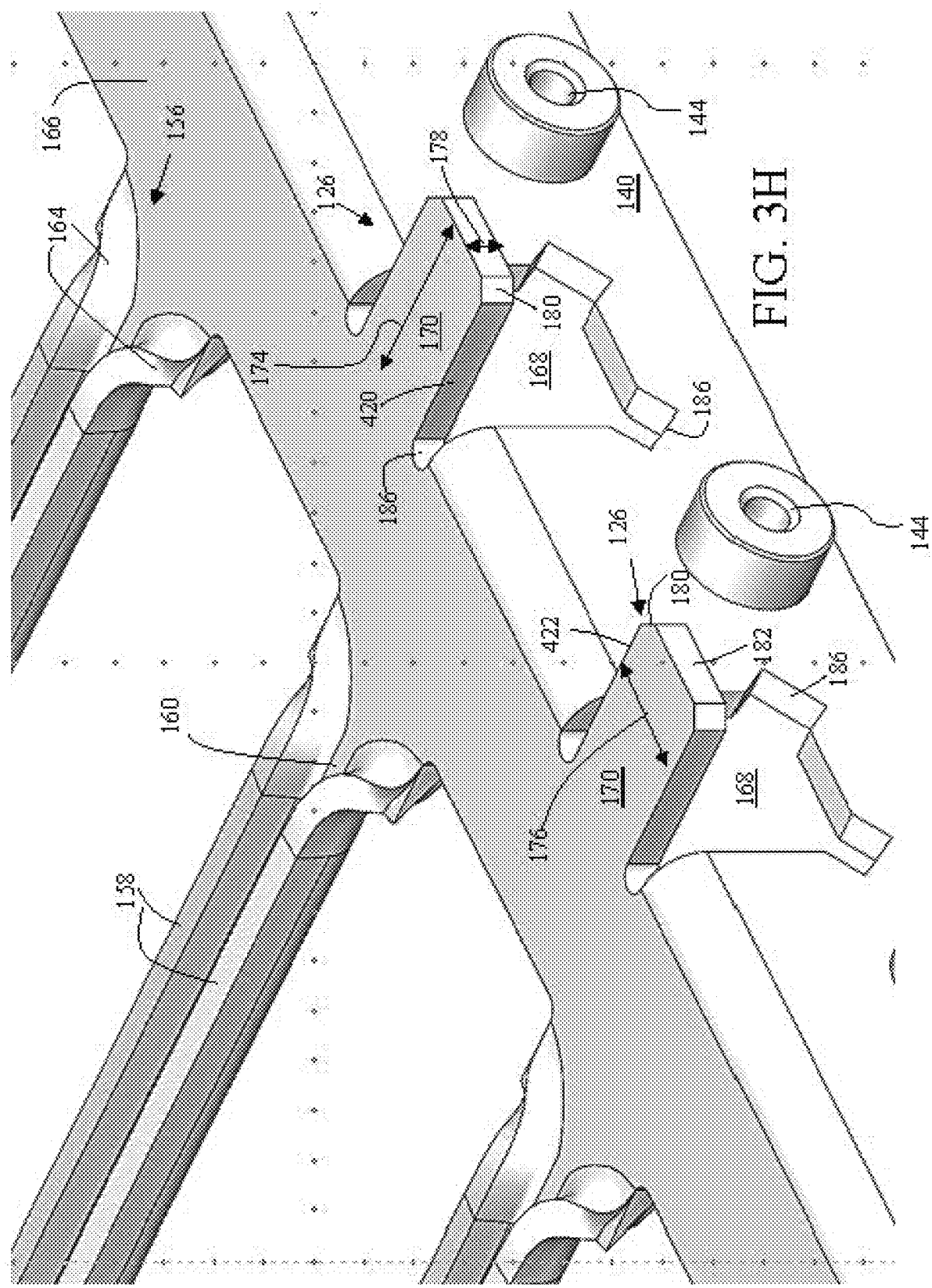
Figure 3I:
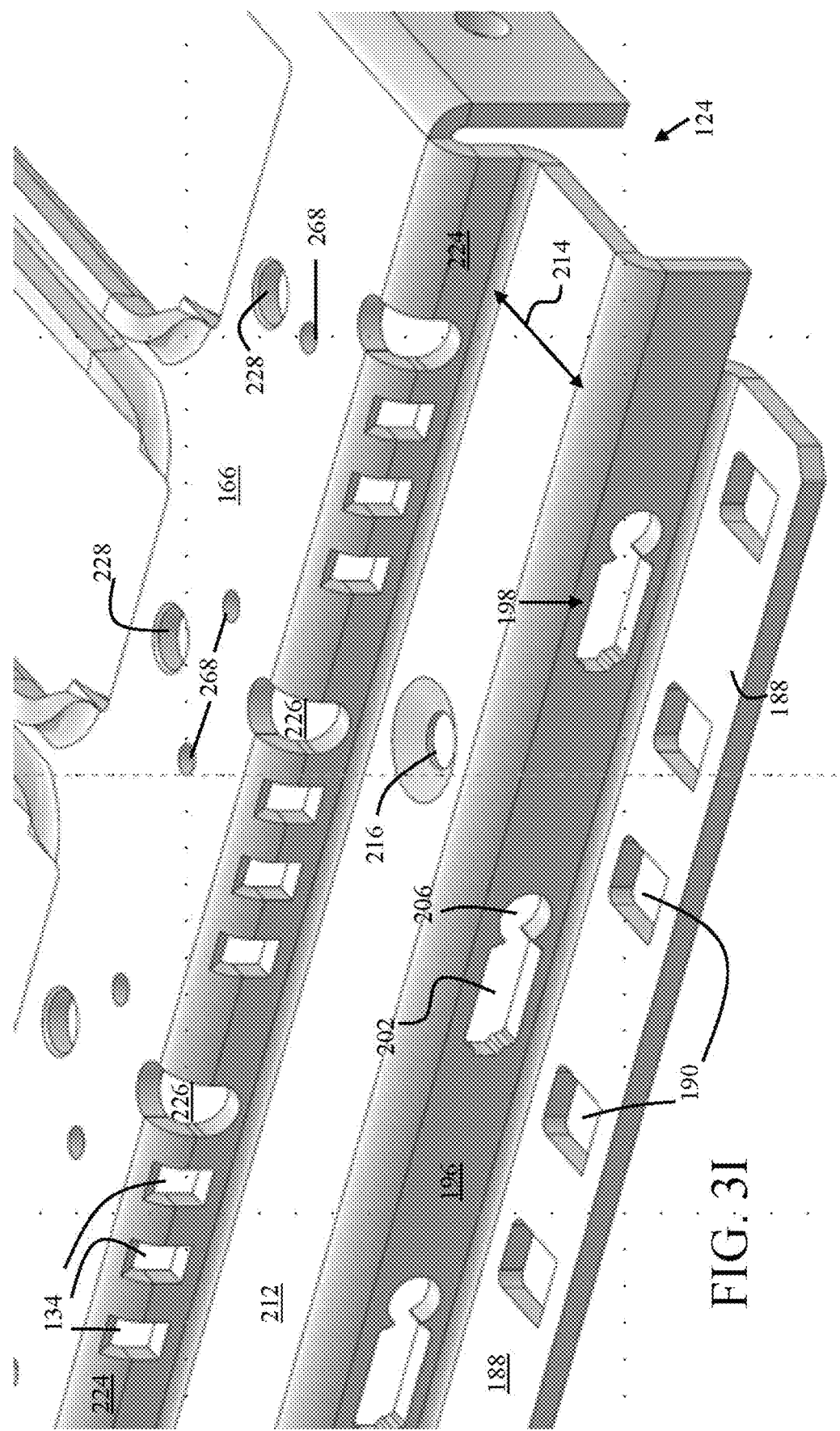
Figure 3J:
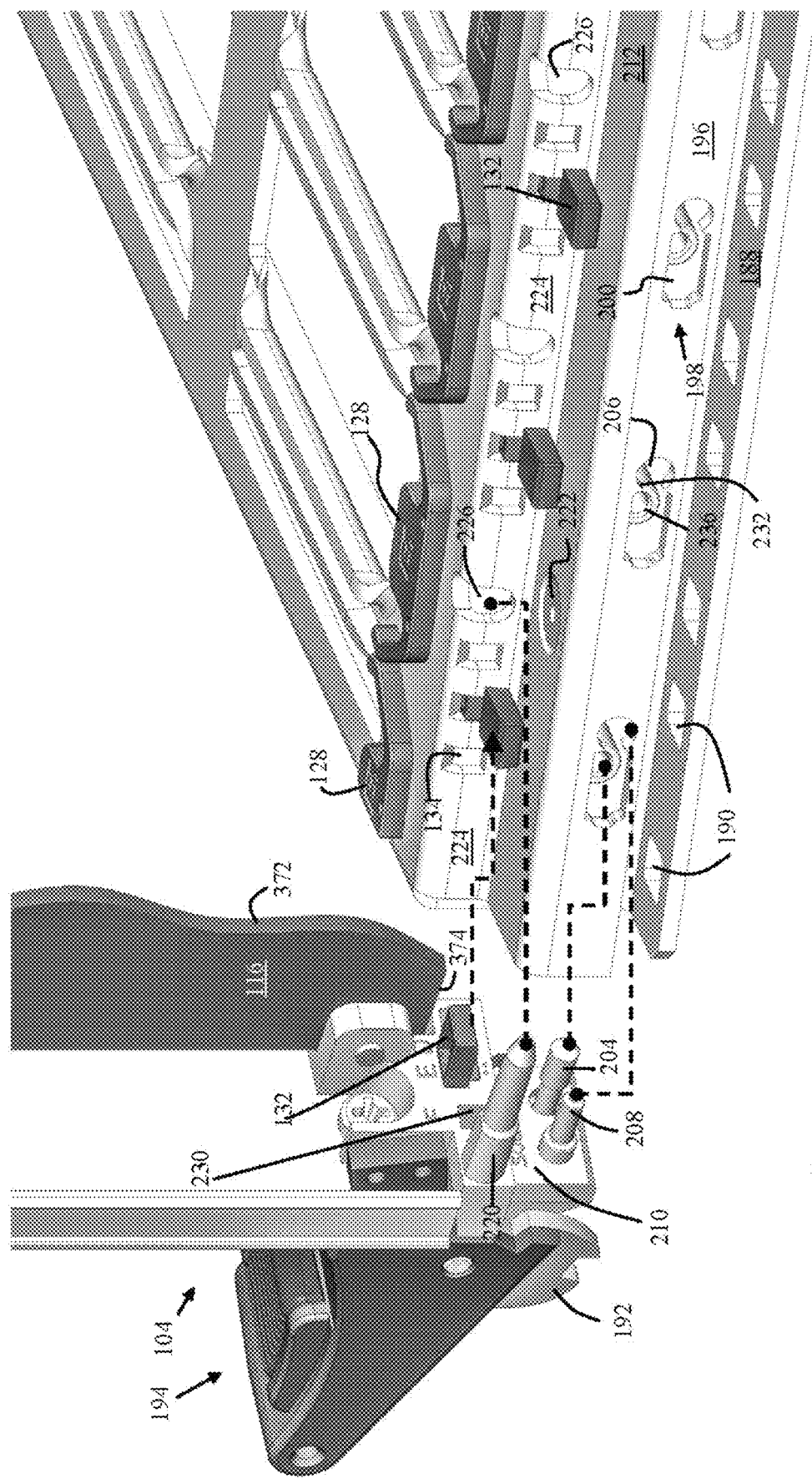
Figure 3K:
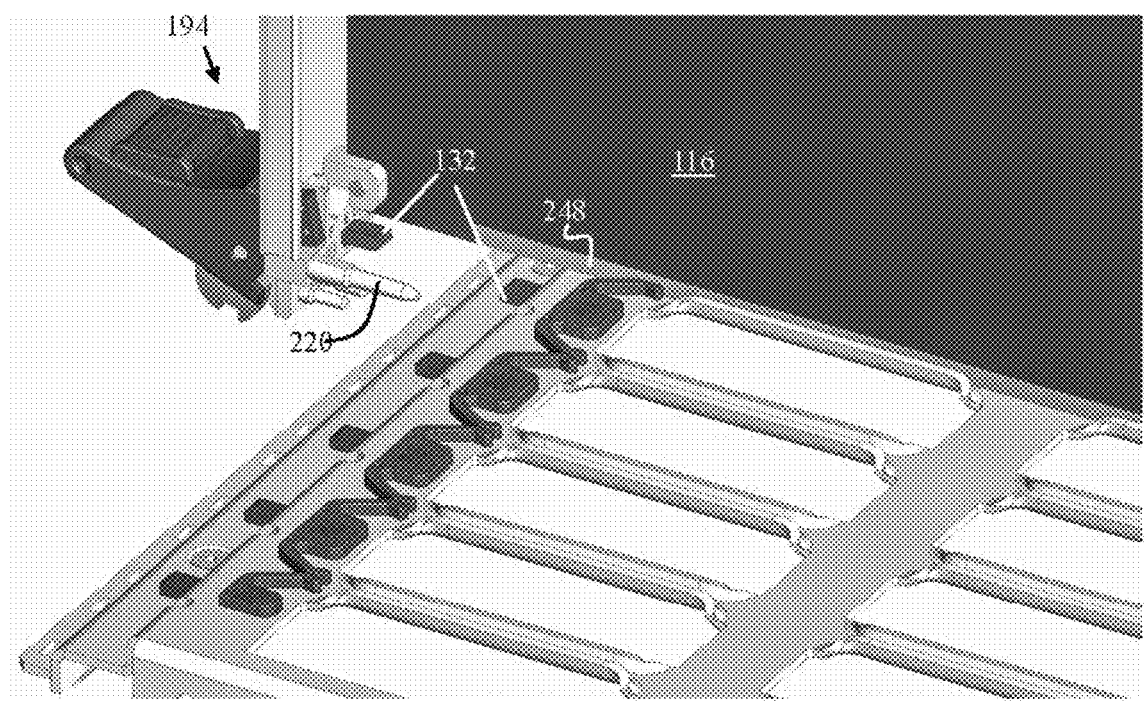
Figure 3L:
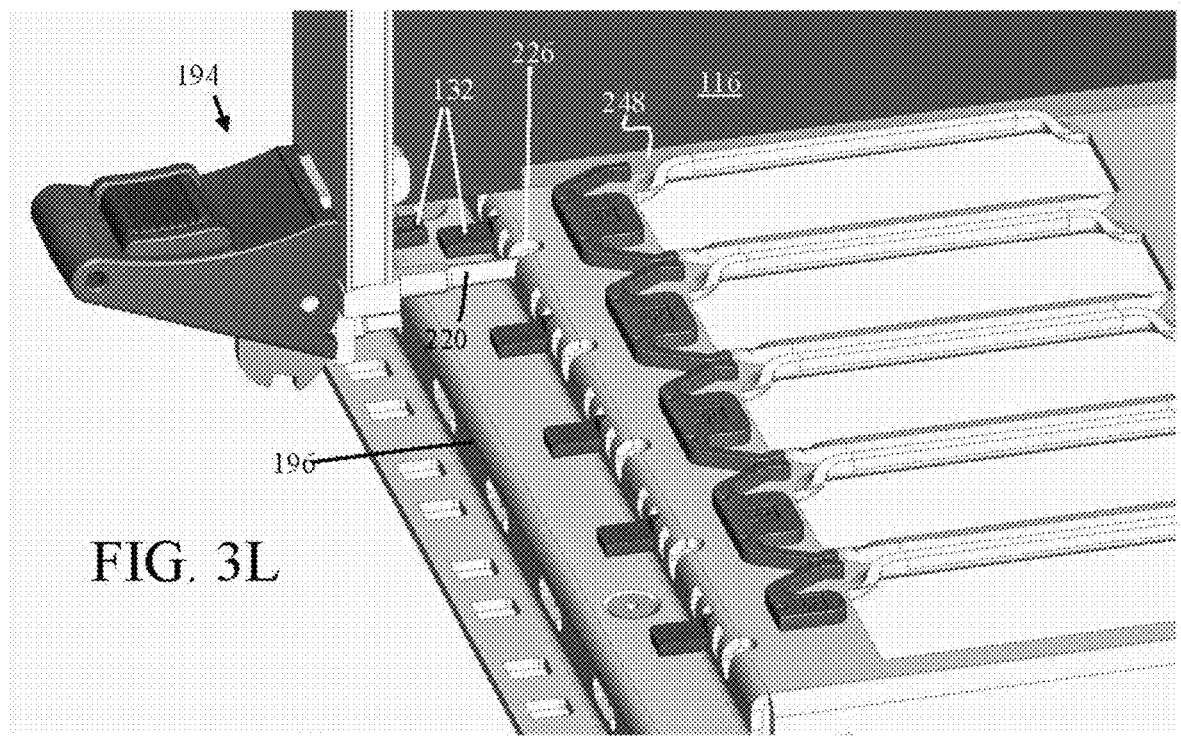
Figure 3M:
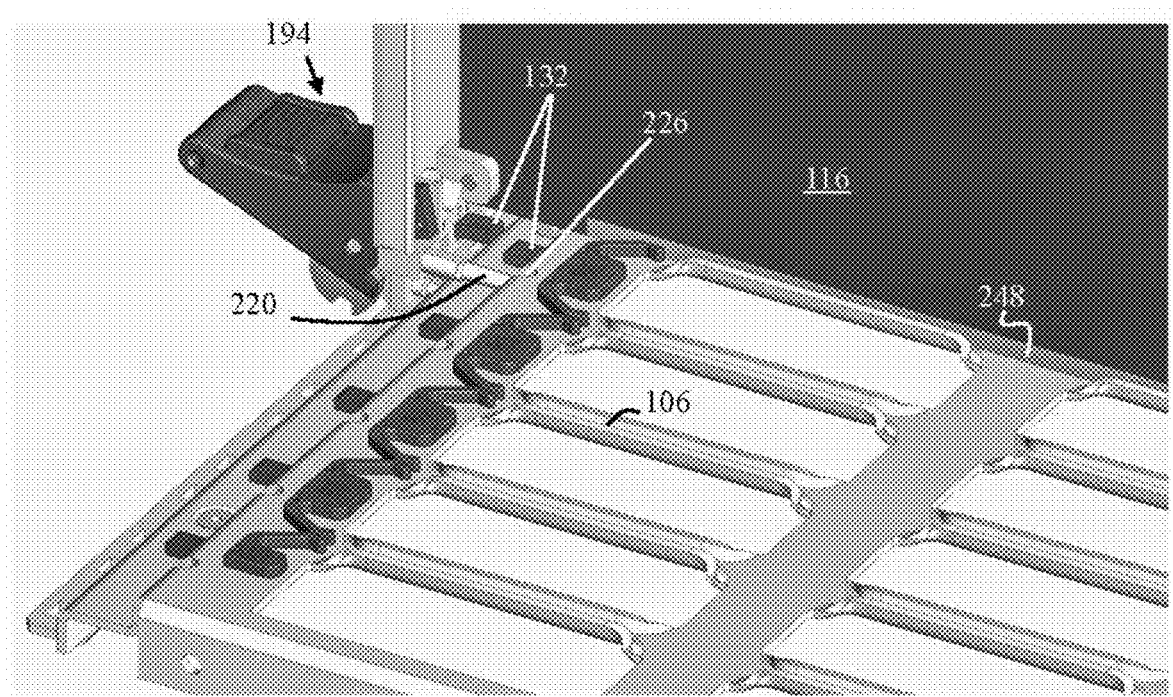
Figure 3N:
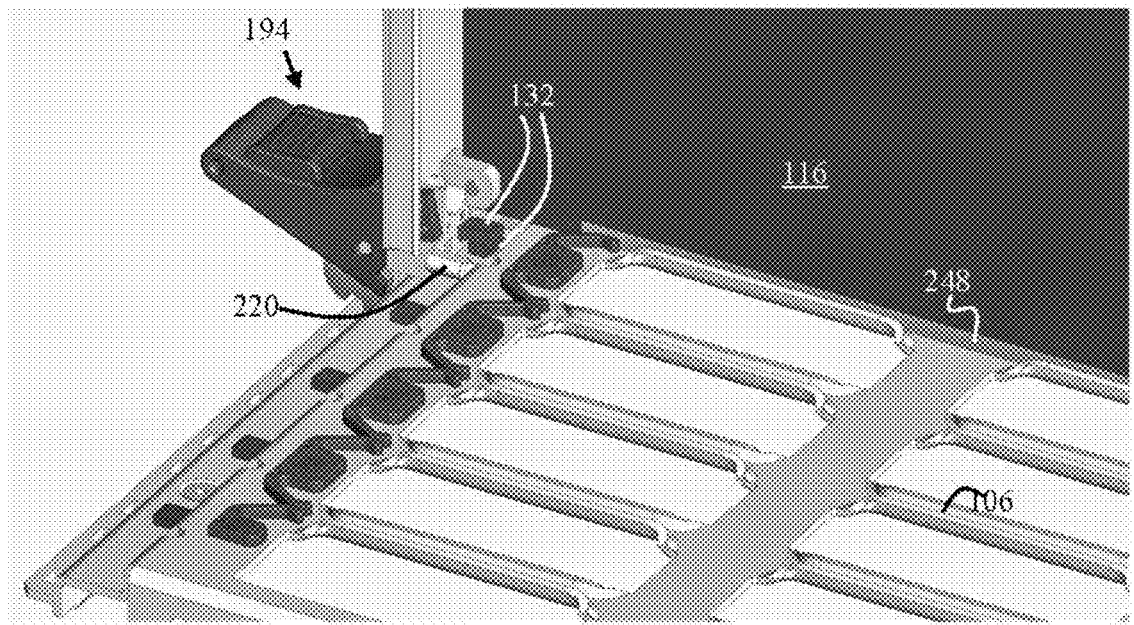

FIGS. 3A to 3N are non-limiting, exemplary illustrations of a guide panel in accordance with one or more embodiments of the present invention.

As indicated above, only guide panel 100 is discussed in detail. The only difference between the illustrated lower and upper guide panels 100 and 240 is that lower guide panel 100 includes alignment projections 126 and 242 (detailed below) whereas the upper guide panel 240 does not. Accordingly, the below description details lower guide panel 100 only as all other aspects of both guide panels 100 and 240 are identical. As detailed below, number, position, size, and orientation of alignment structures in general and alignment projections 126 and 242 and openings 184 and 342 (FIG. 1D) in particular, may vary depending on the requirements of plug-in unit 104.

Guide panel 100 shown is comprised of unitized (single piece) construction that includes guidance slots 106 for insertion and securing of plug-in units 104. In this non-limiting, exemplary instance, the illustrated guide panel 100 is comprised of a single, integral, continuous unitized metal panel with airflow openings 146 in between guidance slots 106. Guide panel 100 may be dimensioned by depth 148 and longitudinal axis 150.

Guide panel 100 is further comprised of an engagement structure 124 that interface with plug-in unit panels 104 or filler panels 118. Additionally, guide panel 100 may include power-data transmission alignment projections 126 and 242, if guide panel 100 is to be mechanically and physically aligned with a power-data transmission panel (mid- or backplane) 102. Optionally, power-data transmission alignment projections 126 and 242 may be omitted.

In this non-limiting, exemplary instance, guide panel 100 optionally accommodates Electrostatic Discharge (ESD) components 128 and 270 that are securely mounted on guide panel 100 via ESD openings 130 (FIG. 3E). Further, in this non-limiting, exemplary instance, guide panel 100 optionally accommodates well-known, conventional indexing elements 132 that are securely mounted on guide panel 100 via index element openings 134.

As further illustrated, guide panel 100 further includes two lateral optionally downward oriented connecting flanges 136 with securing openings 138 that connect guide panel 100 to side panels 120. Further included is a rear, downward oriented connecting flange 140 with plurality of openings for standoffs (female threaded fasteners such as nuts) 144 for connection to power-data transmission panel 102 using male fasteners 244 (detailed below).

Figure 1C:
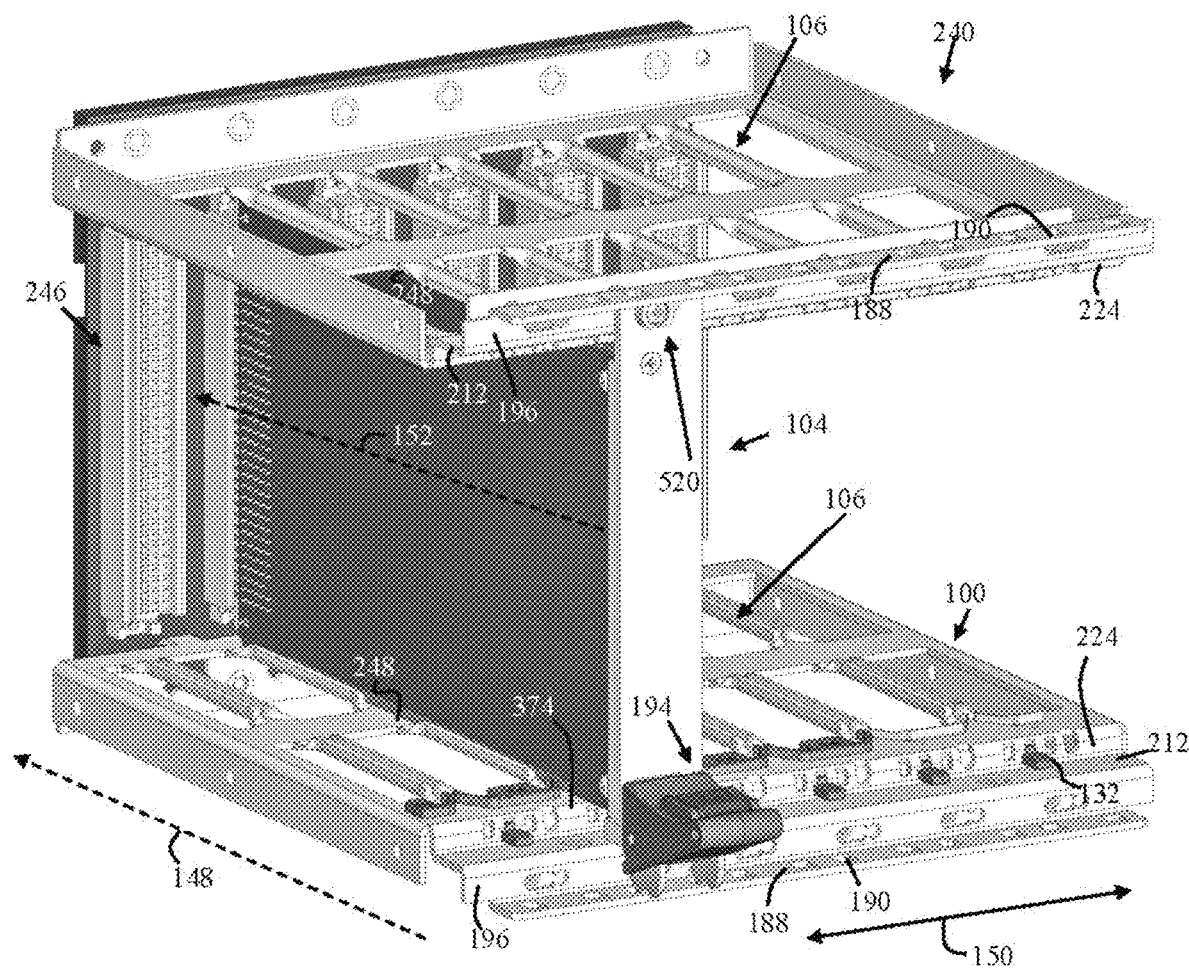
Figure 1D:
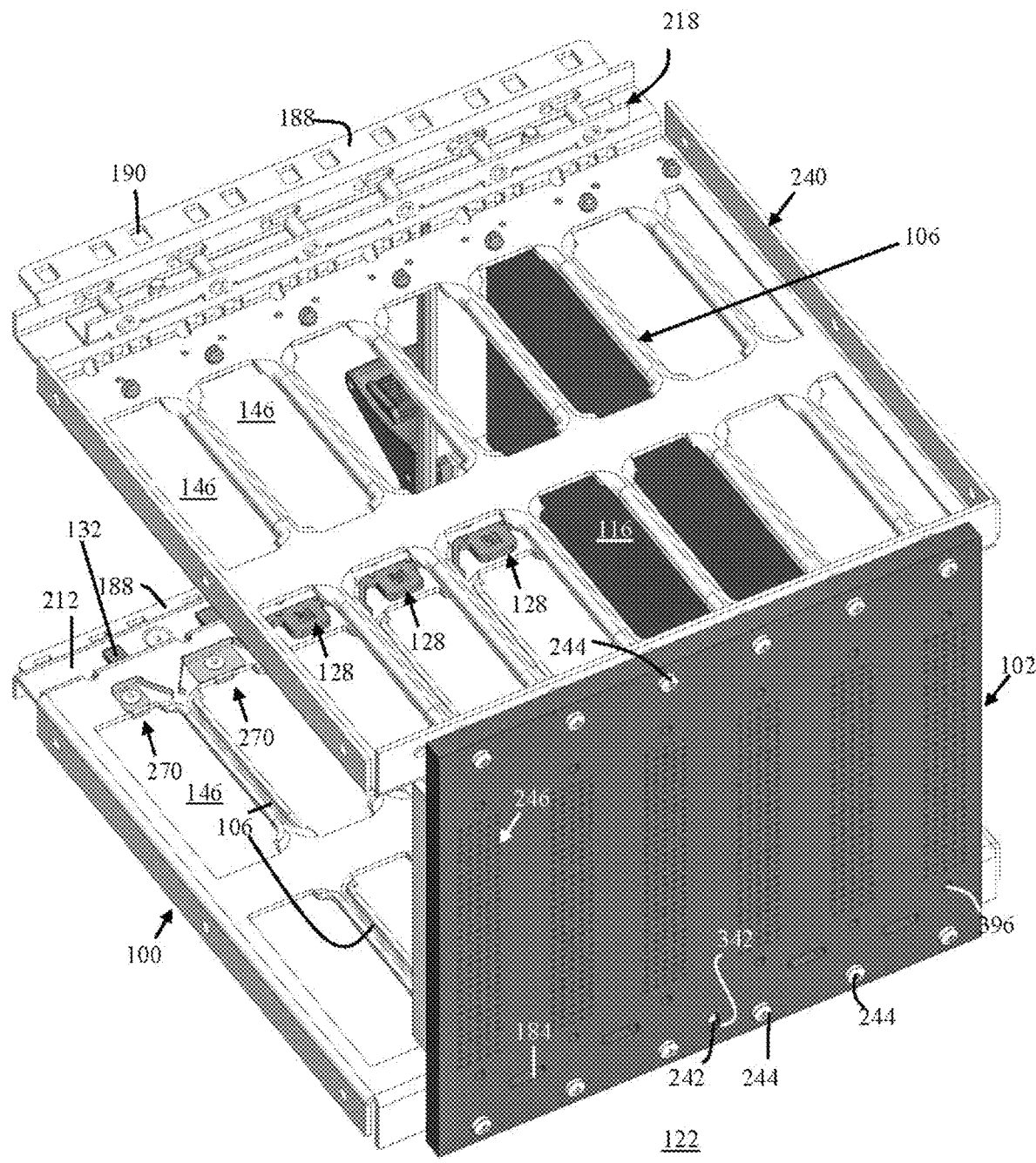
Figure 1E:
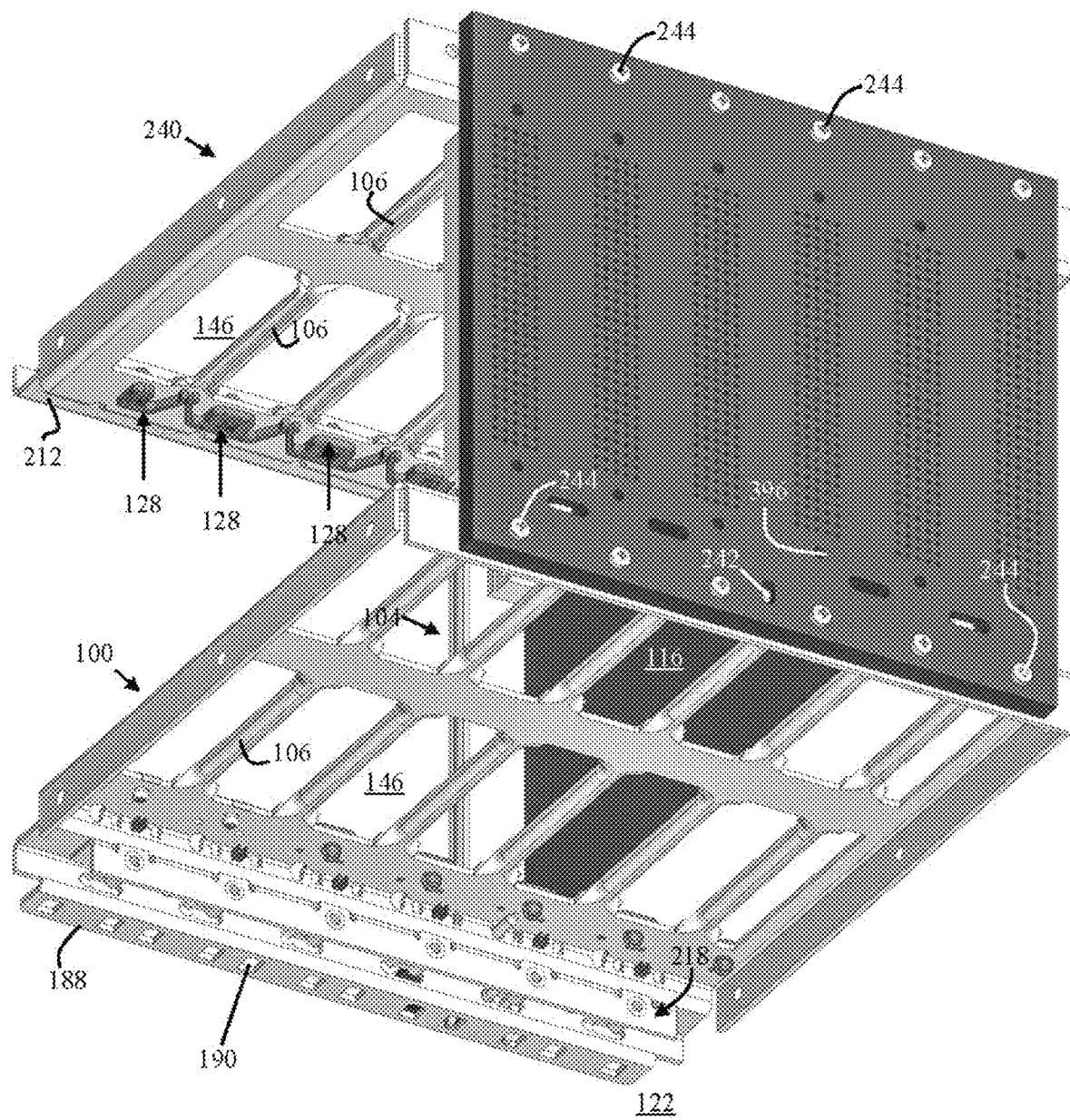
Figure 2A:
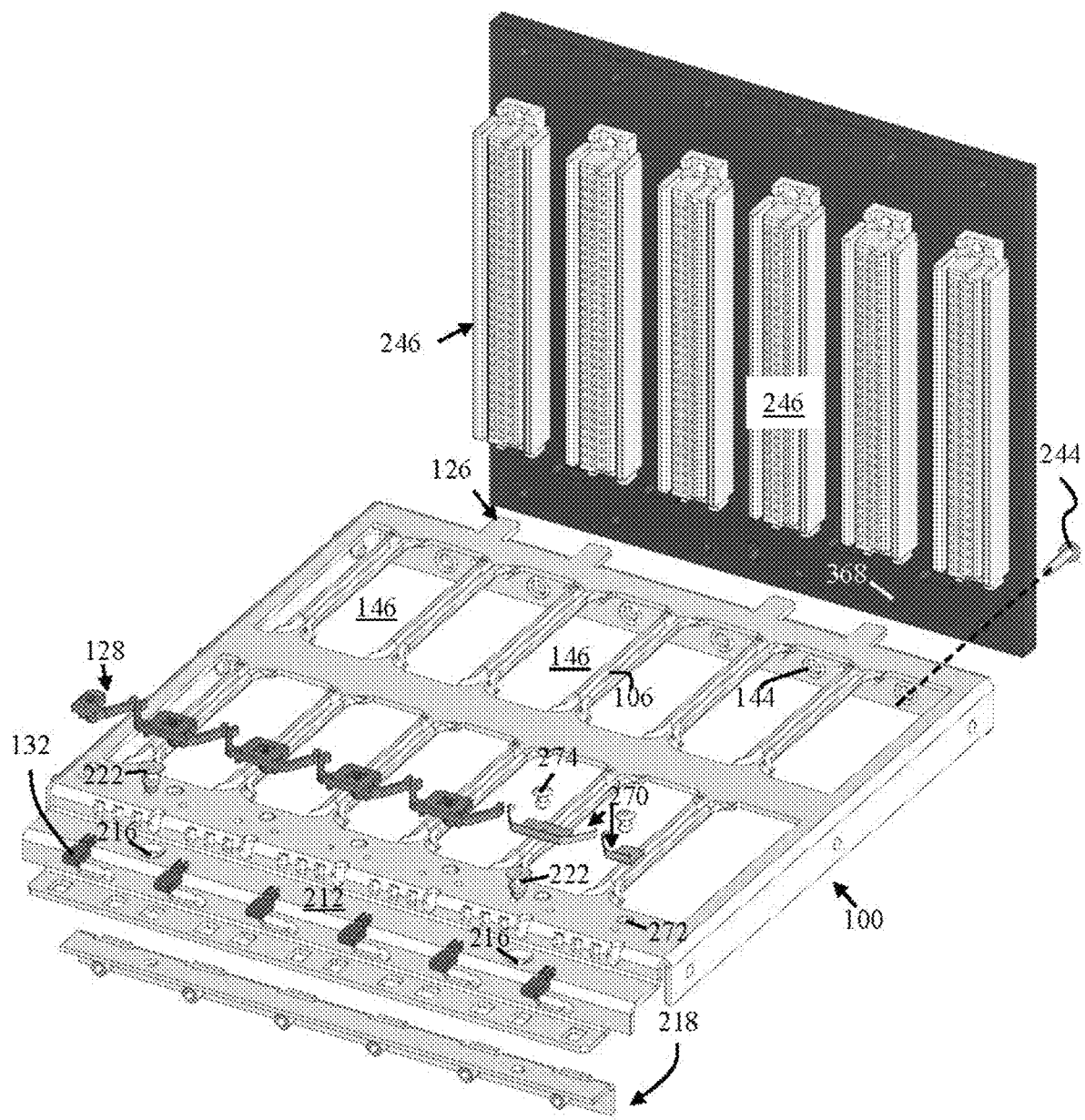
FIGS. 2A to 2D are non-limiting exemplary exploded view illustrations of the various components of only a single guide panel 100 and power-data transmission panel 102 combination illustrated in FIGS. 1A to 1E in accordance with one or more embodiments of the present invention.
Figure 2B:
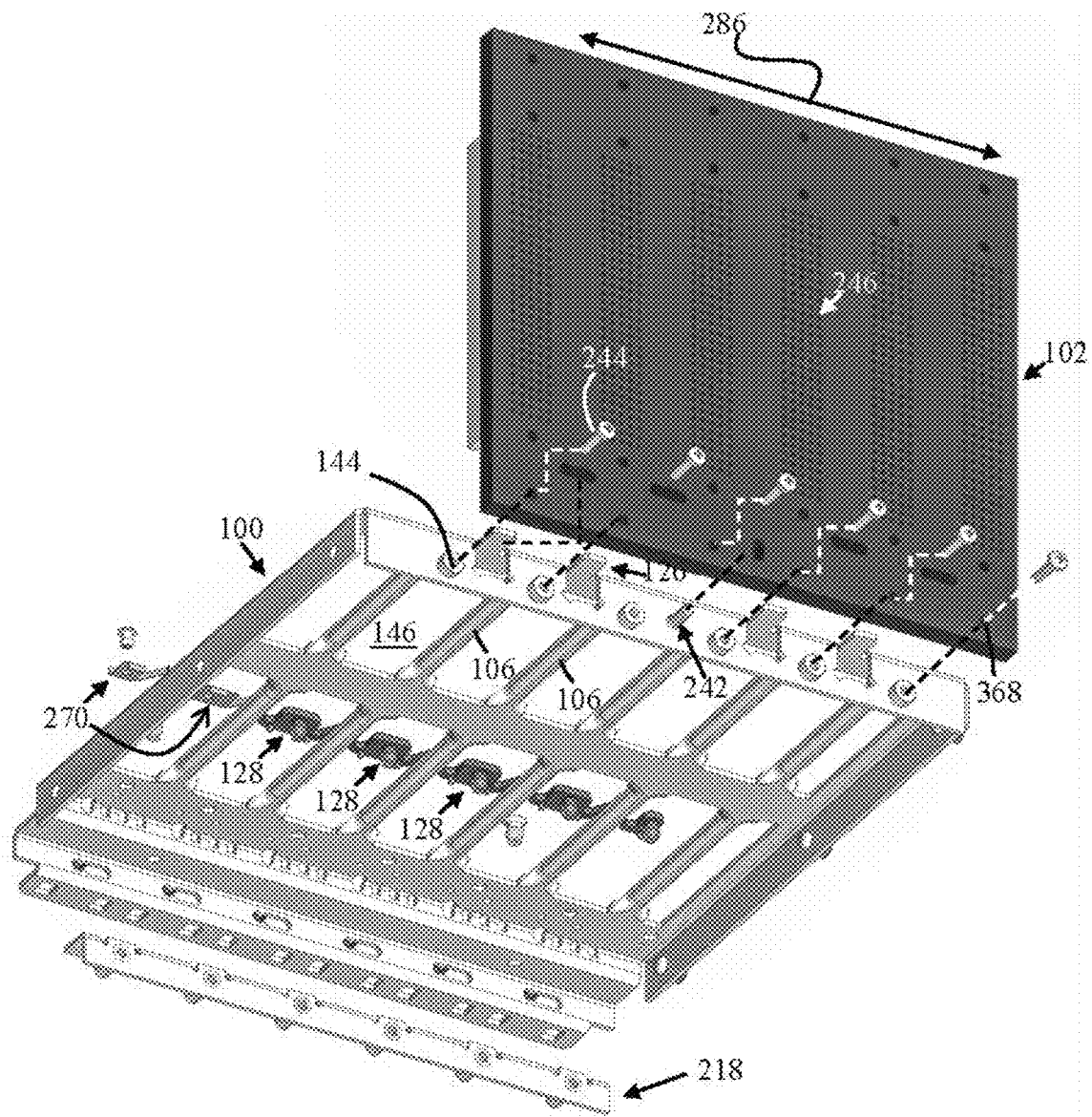
Figure 2C:
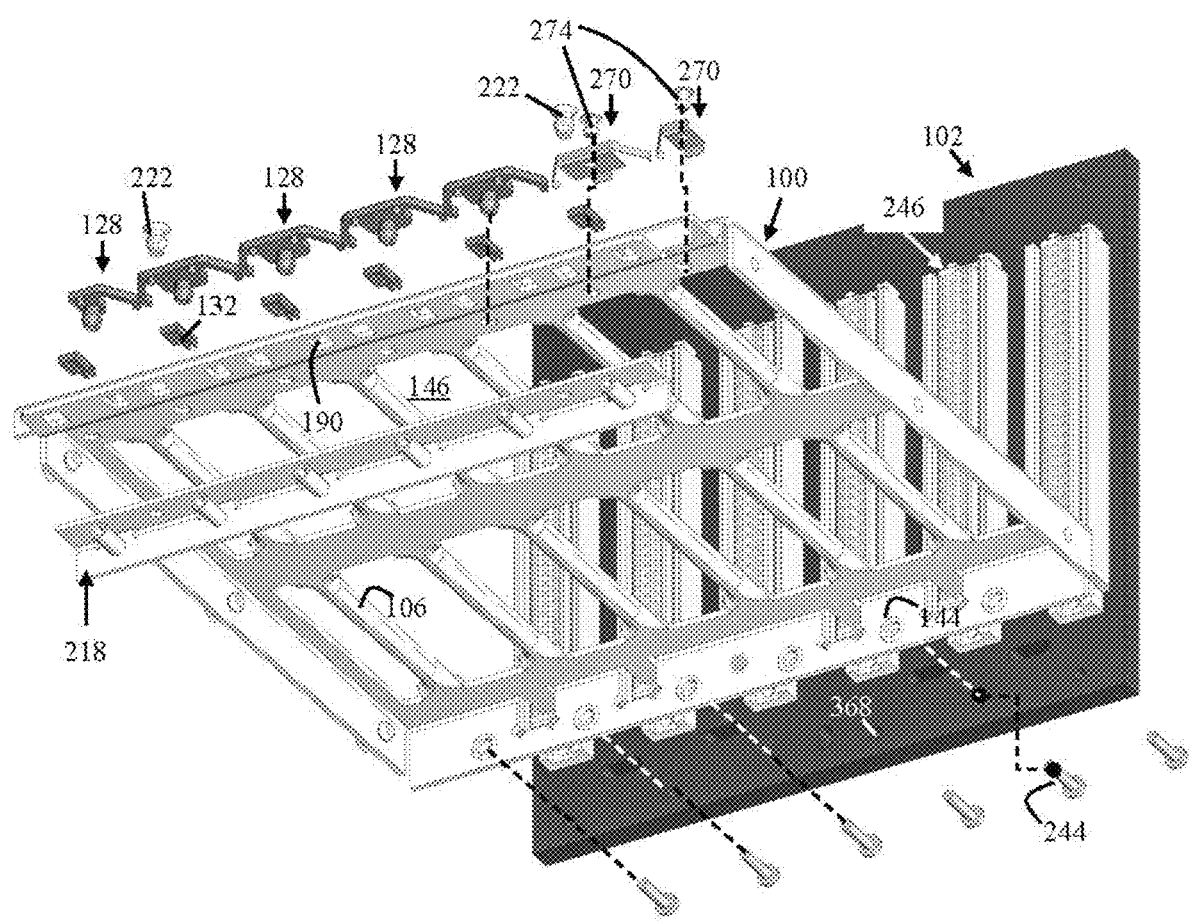
Figure 2D:
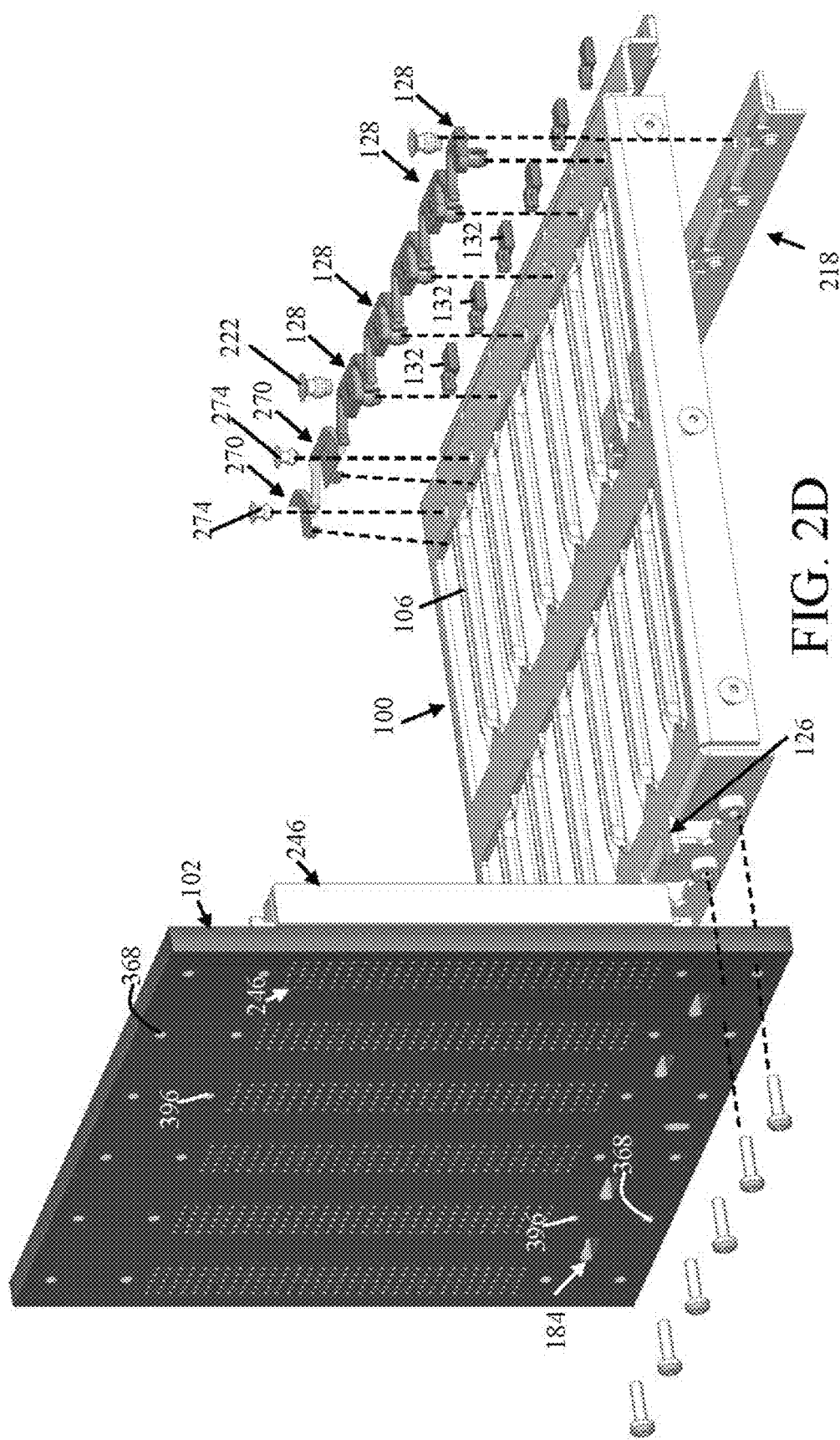

In this non-limiting, exemplary instance guide panel 100 includes multiple slots 106a and 106b (FIG. 3A) that are aligned inline to define depth 148 that may accommodate a plug-in unit 104 with PCB 116 with a depth 152 (FIG. 1C). That is, there are two rows of aligned and inline slots 106a and 106b for each plug-in unit 104 along longitudinal axis 150 of guide panel 100.

For a longer span plug-in units 104 with greater depth 152 more guidance slots 106 may be aligned for each plug-in unit 104. For example, three or more aligned, inline guidance slots 106a, 106b, and 106y (not shown) for each plug-in unit 104 may be provided instead of the illustrated paired slots 106a and 106b.

Further, for plug-in units 104 with plug-in unit depth 152 that is shallower, depth 148 of guide panel 100 may be cut shorter so that only single guidance slots 106c (FIG. 3A) are provided for each plug-in unit 104 with shallower depth 152. Accordingly, guide panels 100 may include single guidance slot 106c or multiple aligned inline guidance slots, depending on the physical dimensions of plug-in units 104 to be accommodated by guide panel 100.

Further, in, this non-limiting, exemplary instance longitudinal axis 150 of guide panel 100 is illustrated to accommodate a total of six pairs of guidance slots 106 as shown. Of course, the number of slots 106 shown may be varied depending on many factors including the HP of each plug-in unit 104. The actual longitudinal axis 150 of guide panel 100 may also be varied to accommodate greater number of plug-in units 104 with even larger or smaller HP values.

As best illustrated in FIG. 3G, each slot 106 is defined by lateral walls 158 and a slot surface 160, providing an ingress end 154 through which plug-in unit 104 is inserted into slot 106, and an egress end 156. Bottom facing side 374 (FIG. 1C) of plug-in unit 104 rests on slot surface 160.

As further illustrated in FIGS. 3G and 3H, lateral walls 158 at ingress end 154 and egress end 156 have divergent structures 164 to form chamfered ends for easy insertion and removal of plug-in units 104. As illustrated in FIG. 3I1, slot surface 160 is the same exact identical surface as top surface 166 of guide panel 100.

As indicated above and further detailed below, guide panel 100 further includes alignment projections 126 and 242, with FIG. 3I1 illustrating in detail alignment projections 126 only. Upper guide panel 240 does not have these alignment structures.

Upper guide panel 240 (FIG. 3B-2) merely has the same rear, but upward oriented connecting flange 140 with fastener nuts 144, but no alignment projections 126 and 242. In other words, rear downward oriented connecting flange 140 has no tabs, pins, etc. for alignment with power-data transmission panel 102.

In the non-limiting, exemplary instance shown in FIG. 3H, alignment projections 126 are comprised of extended tabs cut out from rear downward oriented connecting flange 140 of guide panel 100. Top side 170 of projections 126 is coplanar with top surface 166 of guide panel 100. Openings 168 are a result of alignment projections 126 cut out from rear connecting flange 140 of guide panel 100.

Guide panel 100 is cut and formed such that multiple alignment projections 126 remain coplanar with both top surface 166 of guide panel 100 and slot surface 160 of slot 106 on which plug-in unit 104 rests. Alignment projections 126 top and bottom surfaces 170 and 172 are unaffected by tolerances associated with the forming operation of flange 140.

Alignment projections 126 include a tab top surface 170 (FIG. 3H) and a tab bottom surface 172 (FIG. 3F), where the top surface 170 is the same exact identical surface as top surface 166 of guide panel 100. Accordingly, slot surface 160 and top tab surface 170 define the same exact continuous top surface 166 of guide panel 100.

Alignment projections 126 are further defined by a length 174, a width 176, and thickness 178 (which is obviously identical to the thickness of guide panel 100). As further illustrated, alignment projections 126 may further include radius or chamfered corners 180, at cantilevered ends 182 for easy insertion of alignment projections 126 into alignment openings 184 (FIG. 1D) of power-data-transmission panel 102 (detailed below). Alignment projections 126 further include lateral sides 420 and 422 with sufficient span (same as length 174) to enable engagement of alignment projection 126 with alignment openings 184. The various reliefs 186 shown are simply to facilitate the radius or chamfered corners 180 and projections 126 to the extended positions as shown and allow bending to occur on either side.

Referring to FIG. 3I, guide panel 100 includes engagement (or stepped interface) structure 124 that enables mounting of various components, including engagement of plug-in units 104 or filler panels 118. As illustrated, engagement structure 124 is configured as steps having horizontal and vertical surfaces.

A first horizontal surface 188 is comprised of a latch-opening 190 that receives a well-known latch (injector-ejector prongs) 192 (FIG. 3J) of the latch mechanism of well-known an ejector-injector handle 194 of plug-in unit panel 104. The operation of ejector-injector handle 194 of plug-in unit 104 is well known and conventional.

Further illustrated, in FIG. 3I is a first vertical surface 196 of engagement structure 124, parts of which will be described in conjunction with FIGS. 3J to 3N. FIGS. 3J to 3N progressively illustrated the engagement of a plug-in unit panel 110 of plug-in unit 104 with engagement structure 124 of guide panel 100.

In the non-limiting, exemplary instance illustrated in FIGS. 1A to 3N, first vertical surface 196 is illustrated to include an opening 198, an elongated portion of which defines a fastener-opening portion 200 for receiving a securing fastener 204 (FIG. 3J) of plug-in unit panel 110 or filler panel 118. A non-elongated, but rounded (or circular) portion of opening 198 defines a guide opening portion 206 for receiving a first guide-pin 208 (FIG. 3J) of plug-in unit panel 110. It should be noted that instead of having a single, continuous opening 198, two separate rounded openings may be formed, one as fastener-opening 200 and the other as guide-opening 206.

First vertical surface 196 also functions to set an insertion depth of plug-in unit 104. That is, once fully engaged, contacting surface 210 of plug-in unit panel 110 contacts and presses against first vertical surface 196 and hence, cannot be pushed in any further.

As further illustrated in FIGS. 3I to 3N, engagement structure 124 further includes a second horizontal surface 212 that has securing openings 216 for securing a fastening bar in a form of an angled nut-bar 218 using fasteners 222. Second horizontal surface 212 has sufficient width or depth 214 to provide clearance for indexing elements 132 (FIG. 3J), and a second guide pin 220 of plug-in unit 104.

Engagement structure 124 further includes a second vertical surface 224 comprised of indexing openings 134 for receiving indexing elements (or keys) 132, and a second guide opening 226 for receiving a second guide pin 220 of plug-in unit 104.

Guide panel 100 provides multiple indexing or key openings 134 per slot 106 for insertion and securing of multiple keys 132 that when properly oriented within selected key opening 134 in relation to selected orientations of multiple keys 132 mounted on selected key openings 230 of plug-in unit 104, will enable the correct plug-in unit 104 to be inserted within the correct slot 106 on guide panel 100.

As illustrated, each slot 106 of guide panel 100 may have three key openings 134, commensurate with the number of key openings 230 on handle 194 of plug-in units 104. Each key 132 has an offset rectangular shape that may be oriented in four different orientations when mounted within any key opening 134 of guide panel 100 and key openings 230 on plug-in unit 104.

Accordingly, arrangement of keys 132, i.e., selection of the proper key openings 134 and 230 on respective guide panel 100 and plug-in unit 104, and insertion of key 132 at a desire orientation within the selected key openings 134 and 230 provides an indexing feature that will allow the correct plug-in unit 104 to be inserted, within the correct slot. It should be noted that keying and uses thereof is well known, the point of the detailed illustration is that guide panel 100 and method of making thereof in accordance with one or more embodiments of the present invention is one with substantially reduced parts but without loss in functionality that fully complies with requiring standards.

As further illustrated in FIGS. 3I to 3N, engagement structure 124 further includes a third horizontal surface, which is the top surface 166 of guide panel 100. Top surface 166 at engagement structure 124 includes electrostatic discharge openings 228 and 268 for securing electrostatic discharge components 128 and 270 (detailed below).

Figure 4B:
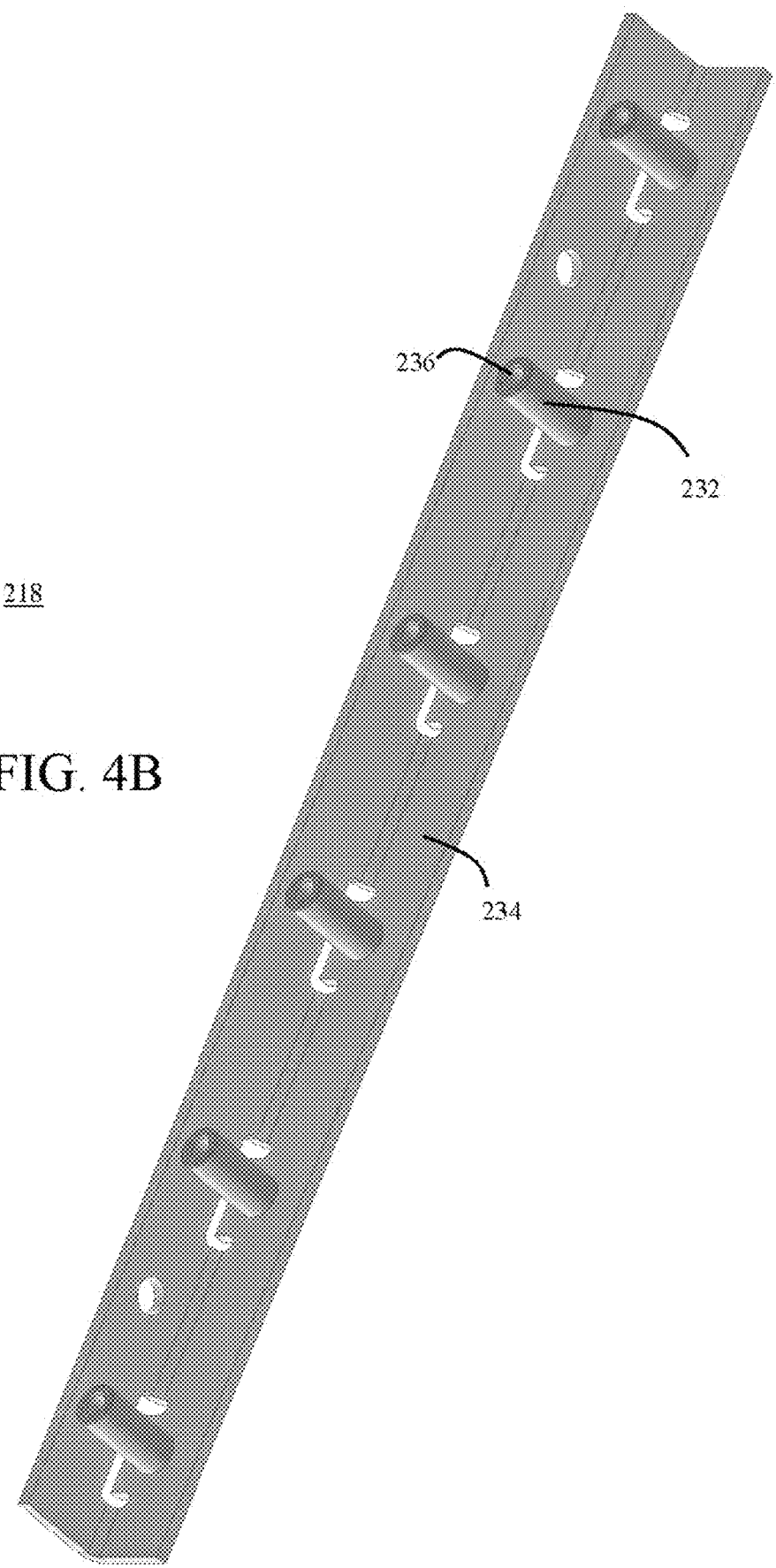
Figure 4C:
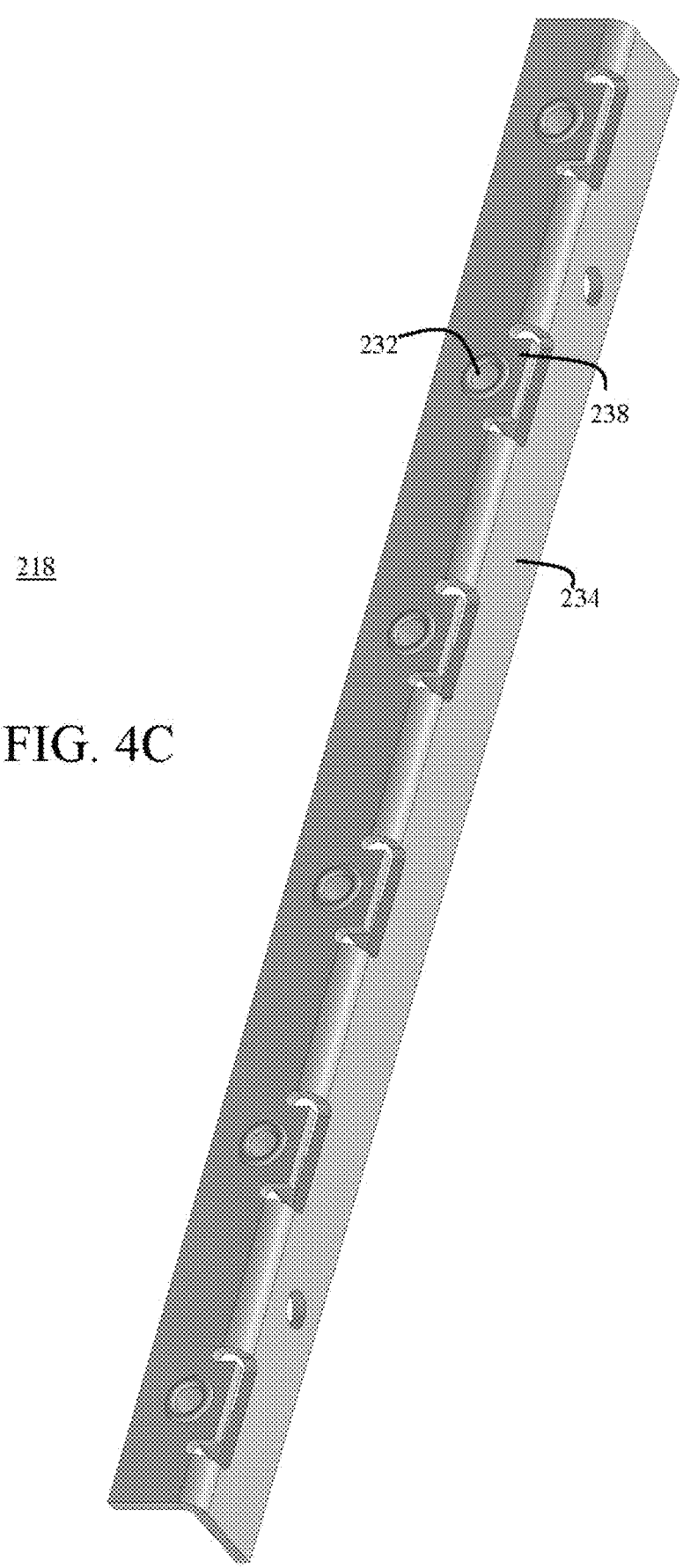

FIGS. 4A to 4C are non-limiting, exemplary illustrations of a fastener bar and its connection with a guide panel in accordance with one or more embodiments of the present invention. As illustrated, fastening bar (or angled nut-bar) 218 includes an angled bar 234 with mounted threaded elements (or stand-off nuts) 232 having an opening 236 aligned with a fastener-opening 200 of first vertical surface 196.

As indicated above, second horizontal surface 212 may include two or more openings 216 for securing an angled nut-bar 218 using fasteners 222, with stand-off nuts 232 having opening 236 facing fastener-opening 200 of first vertical surface 196 for receiving the fastener 212 of a plug-in unit 104.

Angled nut-bar 218 includes a single piece metal sheet punched and bent, having a plurality of mounted (flare, swage, clinching, screwed fitting, etc.) standoff fasteners 232 of angled bar 234.

A non-limiting, exemplary method of manufacturing angled nut-bar is to use metal (e.g., sheet metal) and cut out all shapes (e.g., by stamping presses, punching, laser cutting or use of CNC machines, etc.), thereafter adding bends and standoffs, resulting in an angle nut strip. This bending action avoids using the extrusion method of manufacturing process additionally requiring threaded strips, spacers, insulators and fasteners, this makes the manufacturing process lower cost, more flexible and more efficient.

FIGS. 5A to 5M are non-limiting, exemplary illustrations of various views of electrostatic discharge components in accordance with one or more embodiments of the present invention.

As is well known, optionally, a plug-in unit 104 may include exposed conductive traces 248 (e.g., a copper traces shown in FIG. 3N) on either or both sides of PCB 116 of plug-in unit 104, both on top end or edge of the PCB 116 and at its bottom end or edge. Conductive traces 248 may be used for discharge of any static potential.

Guide panel 100 of the present invention may optionally include Electrostatic Discharge (ESD) components 128 and 270 with resilient extensions that flex 258 that when contacting conductive traces 248 (FIGS. 1A to 1C, and 3K to 3N) may discharge electrostatic potential on PCB 116 via guide panel 100. It should be noted that since guide panel 100 is constructed of unitized metal structure, it will discharge any potential electrostatic charge from PCB 116 and hence, the reasons for the ESD components being optional.

Figure 5A:
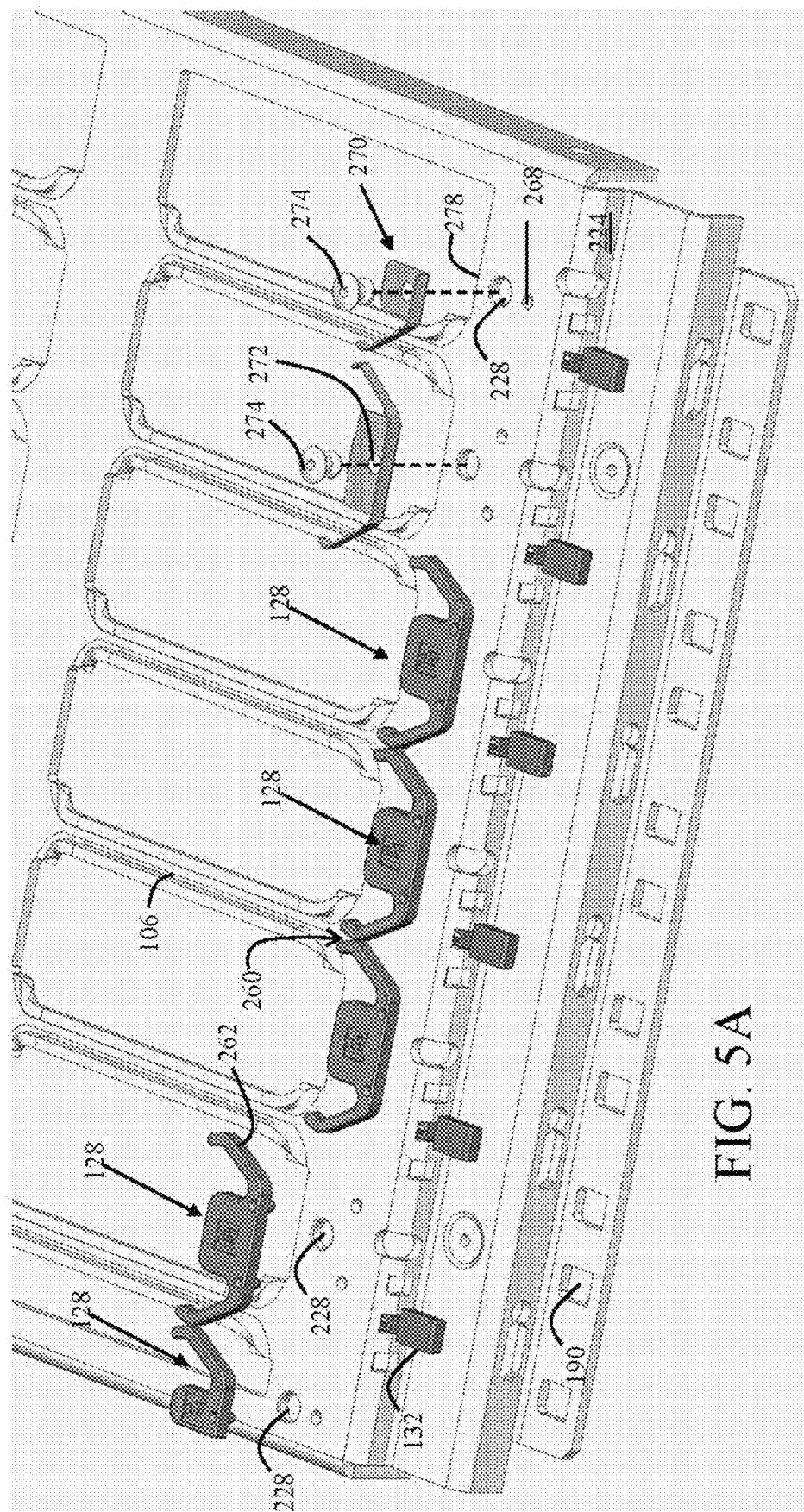
FIGS. 5A to 5M are non-limiting, exemplary illustrations of various views of electrostatic discharge components in accordance with one or more embodiments of the present invention.
Figure 5B:
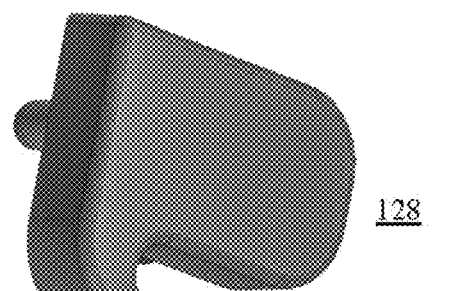
Figure 5C:
Figure 5D:
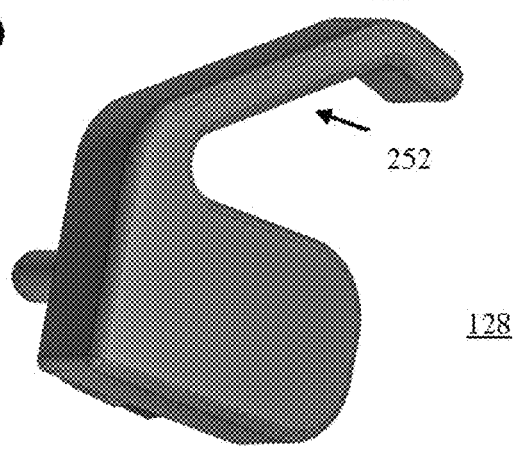
Figure 5E:
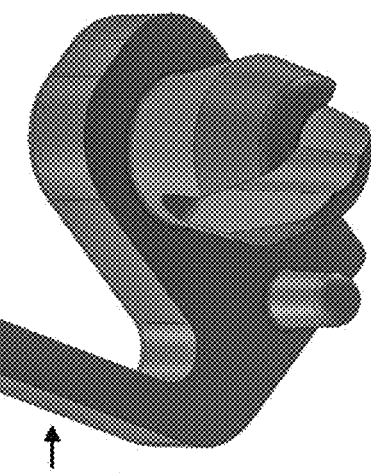
Figure 5F:
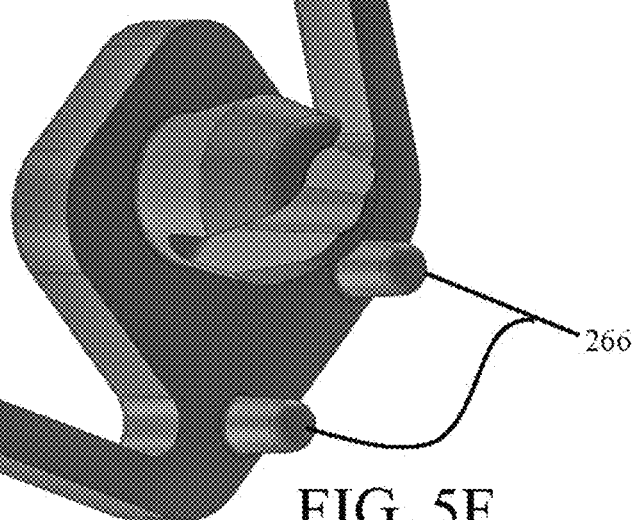

As best shown in FIGS. 5B to 5G, ESD components 128 may comprise of injection molded conductive plastics with a resilient single right-side extension 250 (FIGS. 5B and 5E), a resilient single left-side extension 252 (FIGS. 5D and 5G), or resilient double extensions 254 and 256 (FIGS. 5C and 5F).

The resilient extensions (or elongated flexors) enable ESD components 128 and 270 to frictionally contact conductive traces 248. Accordingly, a gap 260 (FIG. 5A) between adjacent resilient extensions of adjacent slots 106 is less than the thickness of PCB 116 for a firm contact of external surface 262 of resilient extension with conductive traces 248.

Figure 5G:
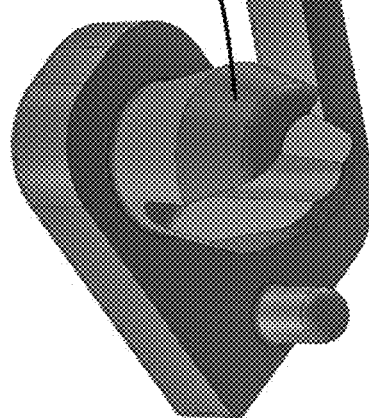
Figure 5H:
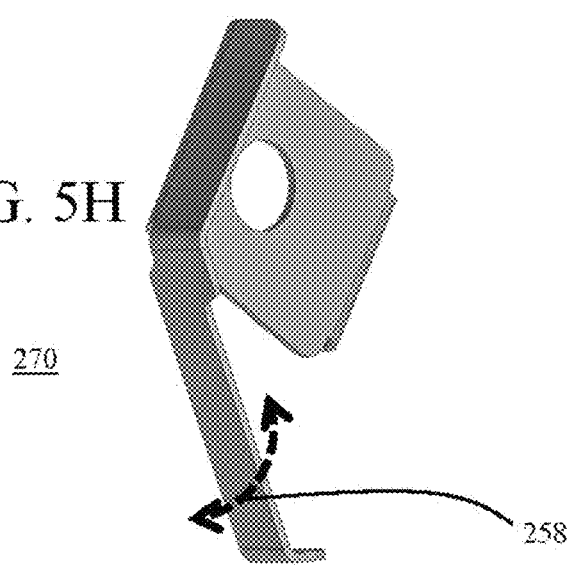
Figure 5I:
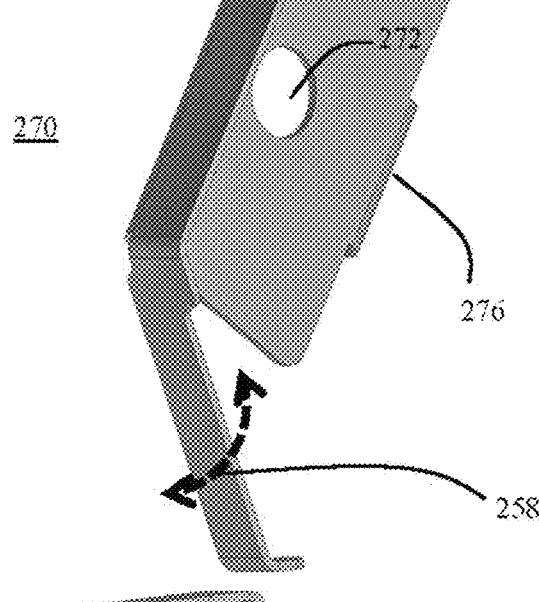
Figure 5J:
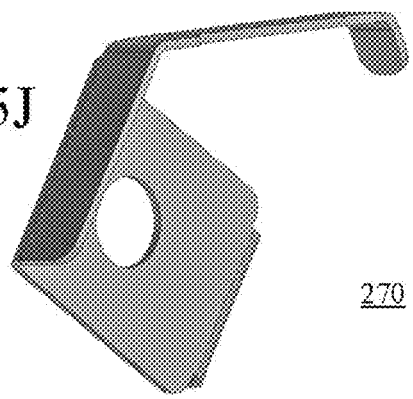
Figure 5K:
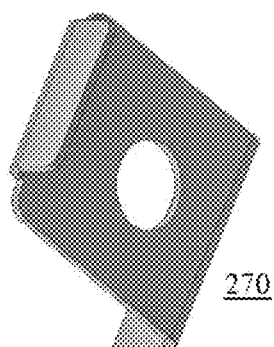
Figure 5L:
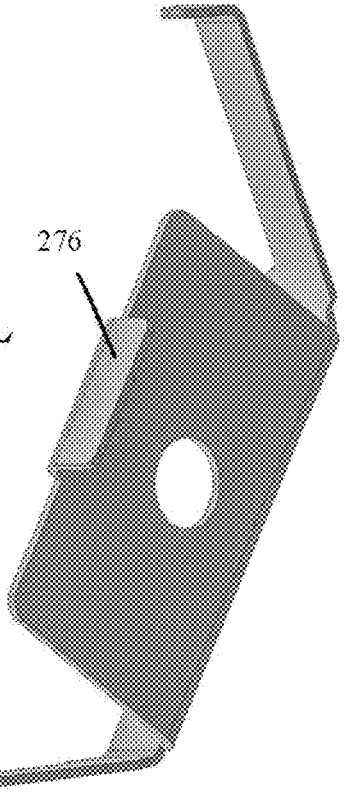
Figure 5M:
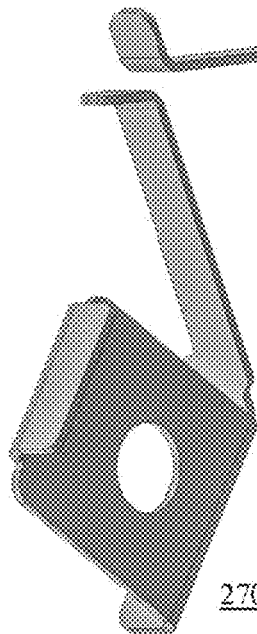

As best illustrated in FIGS. 5E to 5G, ESD components 128 may be further comprised of non-limiting securing mechanisms 264 and 266 to allow ESD components 128 to be securely mounted within respective ESD securing openings 228 and 268 on guide panel 100.

First securing mechanism 264 enables ESD components 128 to be securely mounted onto guide panel 100 while second securing mechanism 266 provides an anti-rotation feature that prevents potential rotation of ESD components 128 as plug-in unit 104 is inserted through slots 106.

FIGS. 5H to 5M are another set of non-limiting, exemplary illustrations of details of optional ESD components in accordance with one or more embodiments of the invention. ESD components 270 illustrated in FIGS. 5IT to 5M include similar corresponding or equivalent components, interconnections, functional, operational, and or cooperative relationships as ESD components 128 that are shown in FIGS. 5A to 5G, and described above. Therefore, for the sake of brevity, clarity, convenience, and to avoid duplication, the general description of FIGS. 5H to 5M will not, repeat every corresponding or equivalent component, interconnections, functional, operational, and or cooperative relationships that has already been described above in relation to ESD components 128 that is shown in FIGS. 5A to 5G but instead, are incorporated by reference herein.

In the instance illustrated in FIGS. 5H to 5M. ESD components 270 are made from metal sheet stock and by their very nature provide a conductive path from ground strip 248 of plug-in unit 104 to guide panel 100.

Further, in this non-limiting, exemplary embodiment ESD components 270 include a fastener opening 272 through which a fastener (e.g., a rivet, screw, etc.) 274 shown in FIG. 5A may be inserted to secure ESD component 270 onto guide panel 100.

As further best illustrated in FIGS. 5H to 5M, ESD components 270 further include an anti-rotational feature in a form of a non-limiting, exemplary extended flange (or tab) 276 that abuts against edge 278 (FIGS. 3B-1, 3D, and 5A) of guide panel 100. As indicated above, anti-rotation feature 276 prevents potential rotation of ESD components 270 as plug-in unit 104 is inserted through slots 106.

FIGS. 6A to 6I are non-limiting, exemplary illustrations of various detailed views of alignment projections and alignment openings of the guide panel and the power-data transmission panel of FIGS. 1A to 5M in accordance with one or more embodiments of the present invention.

As indicated above, in this non-limiting, exemplary instance, it is only guide panel 100 that includes alignment projections 126 and 242 and not upper guide panel 240. An alignment projection and an alignment opening may be collectively referred to as an alignment structure.

As further detailed below, number, position, size, and orientation of alignment structures in general, and alignment projections 126 and 242 and openings 184 and 342 in particular, may vary, depending on the requirements of plug-in unit 104 and power-data transmission panel 102.

As will be apparent from the details below, when a guide panel and a power-data transmission panel are sufficiently sized to achieve proper alignment, then all that is required is for one guide panel to have alignment projections, requiring one set of corresponding alignment openings on the power-data transmission panel. In the exemplary instance illustrated in FIGS. 1A to 6I, due to the sufficient length span 286 of both guide panel 100 and power-data transmission panel 102, only a single set of alignment projections 126 and 242 and alignment openings 184 and 342 is needed.

As will be further apparent from details below, use of minimal number of alignment projections 126 and 242 and their corresponding alignment openings 184 and 342 is beneficial in that it limits any potential conflict that may arise with third-party manufacturing and engineering limitations of typical power-data transmission panel 102.

All alignment openings 184 and 342 on power-data transmission panel 102 must be positioned and located away from trace or bus routings of power-data transmission panel 102. Any alignment opening 184 and 342 that is too close to the trace or bus routings of power-data transmission panel 102 would have a negative impact (e.g., may cause signal interference) on transmission timing and signal integrity of power-data transmission panel 102.

Referring to FIG. 6A, alignment projections 126 and 242 of guide panel 100 are comprised of projections extending from guide panel 100 that engage alignment openings 184 and 342 on power-data transmission panel 102 to thereby align guidance slots 106 of guide panel 100 with connectors 246 of power-data transmission panel 102.

As detailed below, alignment projections 126 (individually referenced as 334, 336, 338, and 340 in FIGS. 6B to 6F) and 242 and alignment openings 184 (individually referenced as 288, 290, 294, 296, and 342 in FIGS. 6B to 6F) facilitate with precision and accuracy an engagement of plug-in units 104 with power-data transmission panel 102. As shown in FIG. 6C, combined, they may be referred to as alignment structures 398, 400, 402, 404, and 406.

Alignment projections 126 and 242 further facilitate the prevention of power-data transmission panel 102 associated with guide panel 100 from an in-plane rotation movement 280 (FIG. 6B), a lateral movement 282, and a vertical movement 284. Alignment projections 126 and 242 provide precision and accuracy in the engagement by isolating any one of in-plane rotation movement 280, lateral movement 282, and vertical movement 284 from any one of the pair of in-plane rotation movement 280, lateral movement 282, and vertical movement 284.

FIGS. 6C to 6F exemplary illustrate in detail the cooperative operational relationship between alignment projections 334, 336, 338, 340, and 242 and alignment openings 288, 290, 294, 296, and 342. As illustrated, in this non-limiting, exemplary instance, guide panel 100 includes four "tab" alignment projections 334, 336, 338, 340 and a single "pin" alignment projection 242.

The four "tab" alignment projections 334, 336, 338, 340 engage with the four parallel alignment openings 288, 290, 294, 296, and the single "pin" alignment projection 242 engages the single non-parallel alignment opening 342. As illustrated, all alignment facilitators (both structure and opening) are spread across longitudinal axis 150 (FIG. 1C) of guide panel 100 and longitudinal axis 286 (FIG. 2B) power-data transmission panel 102.

As further illustrated, in this non-limiting, exemplary instance, power-data transmission panel 102 includes four axially parallel alignment openings 288, 290, 294, and 296 and a single non-parallel (preferably generally perpendicular) alignment opening 342.

The four axially parallel alignment openings 288, 290, 294, and 296 have a longitudinal axis 298 (FIG. 6C) that is parallel to longitudinal axis 286 of power-data transmission panel 102. The four axially parallel alignment openings 288, 290, 294, and 296 have a transverse axis 300 (FIG. 3D) that is parallel to a transvers axis 302 (FIG. 3C) of power-data transmission panel 102.

In this non-limiting, exemplary instance, all four axially parallel alignment openings 288, 290, 294, and 296 are equally sized. Further, longitudinal axis 298 (FIG. 6D) of all four axially parallel alignment openings 288, 290, 294, and 296 has a longer length span than width 176 (and hence free cantilever end 182) of alignment projections 334, 336, 338, and 340. Accordingly, all four axially parallel alignment openings 288, 290, 294, and 296 provide lateral spacings 328 between lateral sides 330 and 332 (FIG. 6D) of alignment openings 288, 290, 294, and 296 and their respective alignment projections 334, 336, 338, and 340. Accordingly, in this non-limiting, exemplary instance, lateral sides 420 and 422 of any of alignment projections 334, 336, 338, and 340 do not contact any edge of alignment openings 288, 290, 294, and 296.

In this non-limiting, exemplary instance, all four axially parallel alignment openings 288, 290, 294, and 296 have transverse axis 300 that, has a greater width span than thickness 178 of alignment projections 334, 336, 338, and 340. Accordingly, all four axially parallel alignment openings 288, 290, 294, and 296 provide spacings 358 between one edge of alignment openings 288, 290, 294, and 296 and their respective alignment projections 334, 336, 338, and 340.

The single non-parallel alignment opening 342 has a longitudinal axis 304 (FIG. 6F) that is parallel to transverse axis 302 (FIG. 6C) of power-data transmission panel 102. The single non-parallel alignment opening 342 has a transverse axis 306 that is parallel to a longitudinal axis 286 (FIG. 6B) of power-data transmission panel 102, and receives alignment projection pin 242.

Referring to FIG. 6D, which is an enlarged illustration of a portion of FIG. 6C portioned off by dashed lines, as illustrated, the first adjacent pair of parallel alignment openings 288 and 290 are axially parallel, but they are not axially inline or aligned. For example, first center longitudinal axis 360 of first alignment opening 288 is positioned below second center longitudinal axis 362 second alignment opening 290 by a distance 292.

Referring to FIG. 6E, which is an enlarged illustrated of another portion of FIG. 6C portioned off by dashed lines, as illustrated, the second adjacent pair of parallel alignment openings 294 and 296 are also axially parallel, but they are not axially inline or aligned. For example, third center longitudinal axis 364 of third alignment opening 294 is positioned above fourth center longitudinal axis 366 fourth alignment opening 296 by the same distance 292.

Referring to both FIGS. 6D and 6E, first alignment opening 288 is axially parallel and axially inline and aligned with fourth alignment opening 296. Further, second alignment opening 290 is axially parallel and axially inline and aligned with third alignment opening 294.

An upper edge 308 of first alignment opening 288 is below an upper edge 310 of second alignment opening 290 by a distance 292. Upper edge 310 of second alignment opening 290 is inline with upper edge 314 of third alignment opening 294.

A lower edge 316 of first alignment opening 288 is below a lower edge 320 of second alignment opening 290 by a distance 292. Lower edge 316 of first alignment opening 288 is inline with lower edge 322 of forth alignment opening 296.

An upper edge 314 of third alignment opening 294 is above an upper edge 324 of fourth alignment opening 296 by distance 292. Lower edge 322 of fourth alignment opening 296 is below lower edge 326 of third alignment opening 294 by the same distance 292.

As further illustrated in FIG. 6D, a top side surface 170 (highlighted by a thicker line) of first alignment projection 334 contacts upper edge 308 of first alignment opening 288. Bottom side surface 172 of first alignment projection 334 is a distance 292 away from lower edge 316 of first alignment opening 288 and hence, does not contact with lower edge 316.

A bottom side surface 172 (highlighted by a thicker black line) of second alignment projection 336 contacts lower edge 320 of second alignment opening 290. Top side surface 170 of second alignment projection 336 is a distance 292 away from top edge 310 of second alignment opening 288 and hence, does not contact with top edge 310.

As best shown in FIG. 6E, a bottom side surface 172 (highlighted by a thicker black line) of third alignment projection 338 contacts lower edge 326 of third alignment opening 294. Top side surface 170 of third alignment projection 338 is a distance 292 away from top edge 314 of third alignment opening 294 and hence, does not contact with top edge 314.

As further illustrated in FIG. 6E, a top side surface 170 (highlighted by a thicker black line) of fourth alignment projection 340 contacts upper edge 324 of fourth alignment opening 296. Bottom side surface 172 of fourth alignment projection 340 is a distance 292 away from lower edge 322 of fourth alignment opening 296 and hence, does not contact with lower edge 322. It should be noted that in this non-limiting, exemplary instance, alignment structures 398 and 406 are aligned in relation to one another and alignment structures 400 and 404 are aligned in relation to one another. However, other combinations and permutations in the arrangements of the alignment structures are also possible so long as vertical and in-plane rotational movements 284 and 280 are prevented. As a non-limiting example of alternative permutation and combination, alignment structures 404 may be aligned with alignment structure 398 and alignment structure 406 aligned with alignment structure 400. It should further be noted that non-contacting upper or lower edges of an alignment opening (not contacting an alignment projection) need not be aligned as described. Additionally, straight portions of the upper and lower edges of the alignment openings must have a longer span than width 176 of alignment projection 126. All non-contacting edges (upper, lower, lateral, etc.) are to enable easy insertion of alignment projections and hence, must be away from the alignment projections. Further, the non-contacting edges and distances allow for manufacturing tolerances of different process and parts (such as guide panel 100 and power-data transmission panel 102) without an adverse effect on card cage assembly accuracy.

As best shown in FIG. 6F, lateral sides of pin alignment projection 242 contact lateral sides 344 and 346 alignment opening 342. Pin alignment projection 242 has a very high side-to-side (or lateral) position accuracy as a result of stamping presses or CNC cutting process.

As best illustrated in FIG. 6B, the combination of top surfaces 170 of alignment projections 334 and 340 in contact with upper edges 308 and 324 of alignment openings 288 and 294 with bottom surfaces 172 of alignment projections 336 and 338 in contact lower edges 320 and 326 of alignment openings 290 and 294 prevent vertical movement 284 as well as in-plane rotation movement 280 of power-data transmission panel 102.

Additionally, lateral sides of pin alignment projection 242 in contact with lateral sides 344 and 346 alignment opening 342 prevent lateral movement 282 of power-data transmission panel 102.

In this non-limiting exemplary embodiment, prevention of vertical and in-plane rotational movements 284 and 280 are achieved by, one set of alignment structures, isolated from lateral movement 282, which is achieved by other alignment structures. Power-data transmission securing screws 244 may be added and tightened to further secure it to guide panel 100 as shown throughout the figures.

In addition to preventing unwanted movements, alignment structures are also used for accurate and precise alignment of power-data transmission panel 102 in relation to guide panel 100.

Alignment structures are used to align guidance slots 106 of guide panel 100 with connector 246 of power-data transmission panel 102. That way, when plug-in unit 104 is inserted into a guidance slot 106, its connectors 348 (FIGS. 1A and 1B) would be aligned in relation to connectors 246 of power-data transmission panel 102. In other words, well known connector 348 of plug-in unit 104 are fully aligned with their respective connectors 246 of power-data transmission panel 102 and hence, connector 348 would not be damaged during insertion of plug-in units 104.

As detailed below, there is specific physical relationship between the number, position, size, and orientation of each alignment opening on power-data transmission, panel 102 in relation to number, position, size, and orientation of each alignment projection on guide panel 100 to provide an accurate and precise alignment between both.

There are a number of factors that determine the number, position, size, and orientation of alignment projections-openings combinations, in particular, the size of power-transmission panel 102. For example, the length and the thickness sizes of power-data transmission panel 102 and the manufacturing process used in creating openings 184 will determine if power-data transmission panel 102 would require more than two alignment openings. The larger and thicker sized power-data transmission panel 102 may require more alignment openings to achieve maximum alignment opening size accuracy, dictated by the manufacturing processes.

It should be noted that the actual shape and number of the alignment openings and alignment projections may be varied, so long as alignment between guide panel 100 and power-data transmission panel 102 is achieved for easy and accurate insertion of plug-in units 104.

The actual shape and number of the alignment openings and alignment projections may also be varied so long as vertical movement, in-plane rotational movement, and lateral movement of power-data transmission panel 102 is prevented.

The specific physical relationship between the number, position, size, and orientation of each alignment opening on power-data transmission panel 102 in relation to number, position, size, and orientation of each alignment projection on guide panel 100 is achieved by aligning upper edges 308 and 324 of respective alignment openings 288 and 294 with top surface 170 of alignment projections 334 and 340 of guide panel 100. In other words, upper edges 308 and 324 of respective alignment openings 288 and 294 are coplanar in relation to top surface 166 of guide panel 100.

The specific physical relationship further requires that lower edges 320 and 326 of respective alignment openings 290 and 292 are coplanar with bottom surface 172 of structures 334 and 340 of guide panel 100, which is the same as the bottom surface of guide panel 100.

The above scheme provides for precise and accurate alignment and further, significantly reduces manufacturing and assembly tolerances. Given the above parameters and the fact that slot surface 160 of guidance slots 106 is coplanar with top surfaces 166 and 170, when plug-in unit 104 is inserted onto guidance slots 106 it is positioned in the same plane as top surface 170 of an alignment projection, substantially reducing any potential errors (lowering tolerances) in manufacturing and assembly.

As best illustrated in FIGS. 6G to 6I, one or more embodiments of the present invention use the following methodology for establishing the various interfaces of power-data transmission panel 102 and guide panel 100 based on given parameters of a plug-in unit 104. The finally resulting interfaces of power-data transmission panel 102 and guide panel 100 enable full alignment of connectors of plug-in unit 104 in relation to connectors of power-data transmission panel 102 and further, eliminate vertical, lateral, and in-plane rotational movements of power-data transmission panel 102 in relation to guide panel 100.

As further detailed below in relation to FIG. 6G, some of the parameters from a manufacturer specification or datasheet of a physical structure of plug-in unit 104 are used as the controlling factors to construct the physical structure of power-data transmission panel 102 in terms of the number, position, size, and orientation of alignment openings 184 (FIG. 6A), connectors 246, and other physical features such as openings 368 for securing power-data transmission panel 102 with guide panel 100 via fasteners 244.

In addition, the parameters from the manufacturer specification or datasheet of the physical structure of plug-in unit 104 are also used as the controlling factors to construct the physical structure of guide panel 100, the number, position, size, and orientation of guidance slots 106, alignment projections 126 and 242, and other physical features such as securing fastener openings 144 for securing power-data transmission panel 102 with guide panel 100 via fasteners 244.

As detailed below, the methodology in constructing interfaces for power-data transmission panel 102 and guide panel 100 to accomplish alignment and prevent movements includes first determining coordinates of one or more connectors of a plug-in unit 104.

The methodology further requires mapping those coordinates of the one or more connectors of the plug-in unit 104 onto power-data transmission panel 102, and positioning a corresponding connector of the power-data transmission panel from the mapping. Further, constructing a guidance slot size, position, and orientation of guide panel from the coordinates of the one, or more connectors of the plug-in unit 104.

The methodology in accordance with one or more embodiments further requires establishing a slot surface of guidance slot, mapping those coordinates onto power-data transmission panel, and constructing alignment openings of the power-data transmission panel from the mapping.

The method of making guide panel 100 in accordance with one or more embodiments of the present invention requires using a given thickness 370 of PCB 116 of plug-in unit 104 from the specification or datasheet and determining a PCB 116 center plane 372 (or first datum plane 372) as shown in FIGS. 6G to 6I.

PCB 116 center plane 372 may be determined by merely dividing the overall given thickness 372 of PCB 116 in two. PCB 116 center (or first datum) plane 372 may be used as the ordinate (or Y-axis) of the system of coordinates as shown in FIGS. 6G to 6I, a non-limiting, example of such coordinate system may be a Cartesian coordinate system.

As further illustrated in FIGS. 6G to 6I, bottom facing side 374 (which, rests directly on surface slot 160 of guidance slot 106) may be used to represent a base-plane 376 (a second datum plane), which may be used as the abscissa (or X-axis) of the system of coordinates as shown in FIGS. 6H and 6I.

Since bottom facing side 374 (or base-plane 376) rests on slot surface 160, bottom facing side 374 is coplanar with top surface 160 of guide panel 100 and top surface 170 of alignment projection 126. Accordingly, bottom facing side 374, the slot surface 160, top surface 170, and the overall top surface 166 of guide panel 100 are all coplanar, defining the base (or second datum) plane 376, which is mapped as the X-axis of the system of coordinates.

As best shown in FIGS. 6G to 6I, bottom side edge 374 of plug-in unit 104 (where first and second datum planes 372 and 376 cross) resting on central longitudinal axis 380 (FIG. 3E) of slot surface 160 of guide panel 100 is mapped to a (0, 0) value of the illustrated Cartesian coordinate system, which is directly mapped as a corresponding (0, 0) value on power-data transmission panel 102. As detailed below, this provides a very precise and accurate starting point for mapping the rest of the interfaces of guide panel 100 and power-data transmission panel 102.

Since it is center plane 372 that rests within guidance slots 106, center plane 372 may be used to construct the position, size, and orientation of each guidance slot 106. In fact, the overall width 378 (FIG. 3G) and in particular, slot central longitudinal axis 380 (FIG. 3E) of each guidance slot 106 is determined based on center plane 372.

Guidance slot 106 position, size, and orientation and in particular, slot central longitudinal axis 380 is constructed with the view to enable center plane 372 of PCB 116 of plug-unit 104 to precisely and accurately rest directly on slot central longitudinal axis 380 of guidance slot 106. Use of center plane 372 eliminates the need for concern regarding any potential variances in the overall thickness 370 of the PCB 116 as only an average center plane 372 value is used as a parameter to construct guidance slots 106.

Of course, one of the lateral sides 382 or 384 (FIG. 6G) of PCB 116 may also be used instead of center plane 372, but to do so would require a shifting of the position of central longitudinal axis 380 of guidance slot 106 to align or coincide with center plane 372, which is half the thickness 370 of PCB 116.

PCB 116 center plane 372 may also be used to determine the "X" coordinate positional value (X, 0) of contacts 392 (FIGS. 6H and 6I) of plug-in unit 104 (as shown in FIGS. 6H and 6I). In other words, PCB center plane 372 is one of the aspects that contributes to precise and accurate alignment of X-coordinate positions (X, 0) of contacts 392 of plug-in units 104 and connectors 246 of power-data transmission panel 102.

Referring to FIGS. 6H and 6I, the "Y" coordinates positional value (0, Y) is determined by a given contact-distance identifier 388 from the manufacturer specification or datasheet. In other words, contact-distance identifier 388 may be used to determine the "Y" coordinate positional value (0, Y) of the corresponding contact 394 (FIG. 6B) of power-data transmission panel (as shown in FIGS. 6H and 6I).

Contact-distance identifier 388 is a given distance that spans from base plane 376 (or bottom facing edge 374) of PCB 116 of plug-in unit to a center of any one of the first row 390 of contacts 392 of plug-in unit 104.

Contact-distance identifier 388 is one of the aspects that contributes to precise and accurate alignment of Y-coordinate positions (0, Y) of contacts 392 of plug-in units 104 and contacts 394 of power-data transmission panel 102.

The combination of both X and Y coordinates (X, 0) and (0, Y) as detailed above, point to a center point position (X, Y)$_{PU}$ of a contact 392 of plug-in unit 104, which is mapped onto power-data transmission panel 102 and constructed as a corresponding position (X, Y)$_{TP}$ of contact 394 (FIG. 6B) of power-data transmission panel 102. This process is simply repeated for the rest of connectors 348 of plug-in unit 104 to map out and construct the rest of connectors 246 of power data transmission panel 102. Openings 396 (FIG. 6B) are not part of connectors 246, but are indexing openings for proper orientation of plug-in unit 104 for connection with power-data transmission panel 102.

As to the alignment openings, as best illustrated in FIG. 6B, upper edges 308 and 324 of alignment openings 288 and 296 on power-data transmission panel 102 are set to be coplanar with second datum plane 376, which is top surface 166 of guide panel 100 (which is coplanar with top side 170 of alignment projections 334 and 340). Further, lower edges 320 and 326 of alignment openings 290 and 294 on power-data transmission panel 102 are set to be coplanar with bottom or underside surface 172 of alignment projections 336 and 338. All alignment openings are well below first row 390 of connectors 246 thus preventing any potential issues with trace or bus interferences.

Figure 7A:
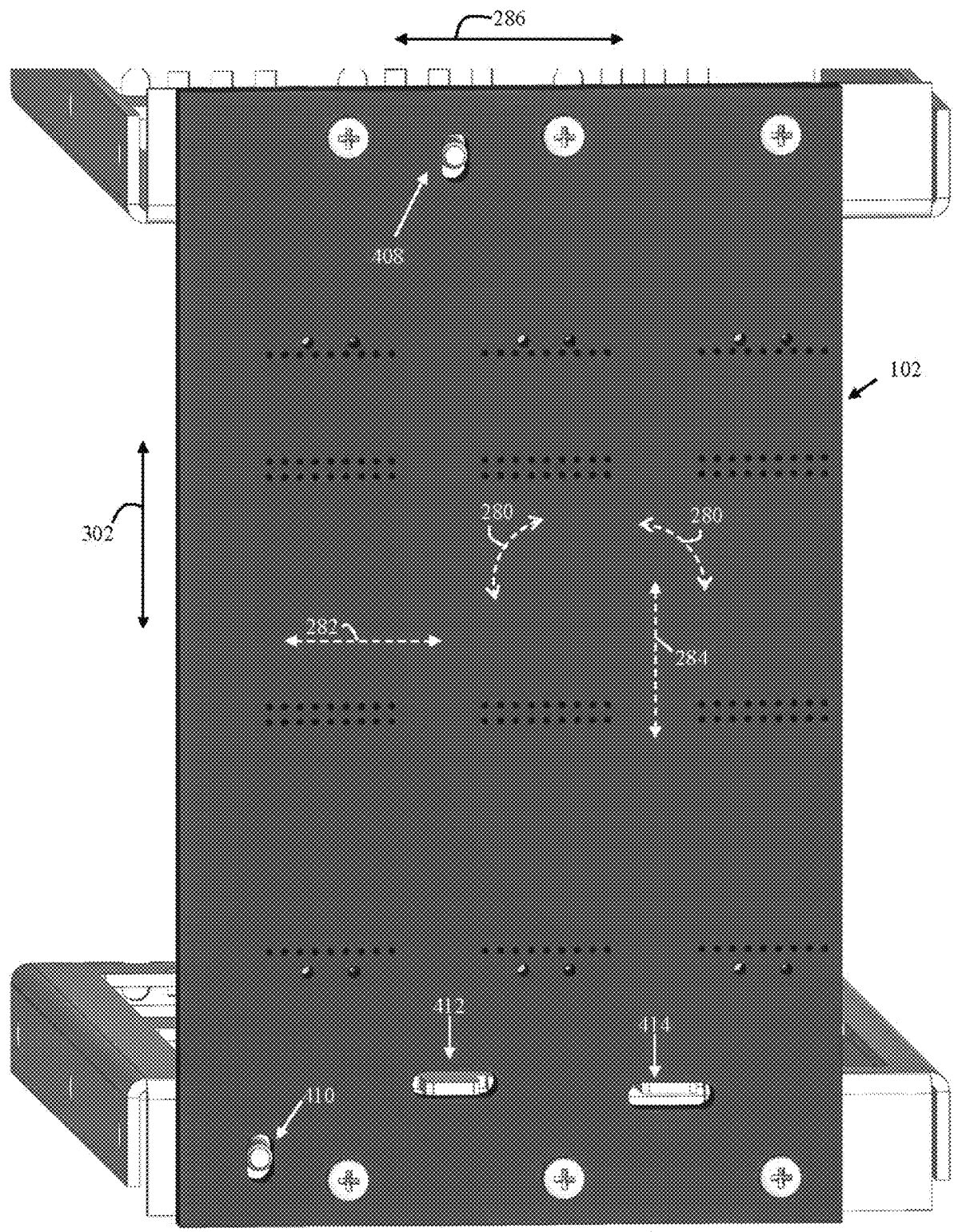
FIGS. 7A and 7B are non-limiting, exemplary illustrations of an alignment structure for guide panel and power-data transmission panel in accordance with another embodiment of the present invention.
Figure 7B:
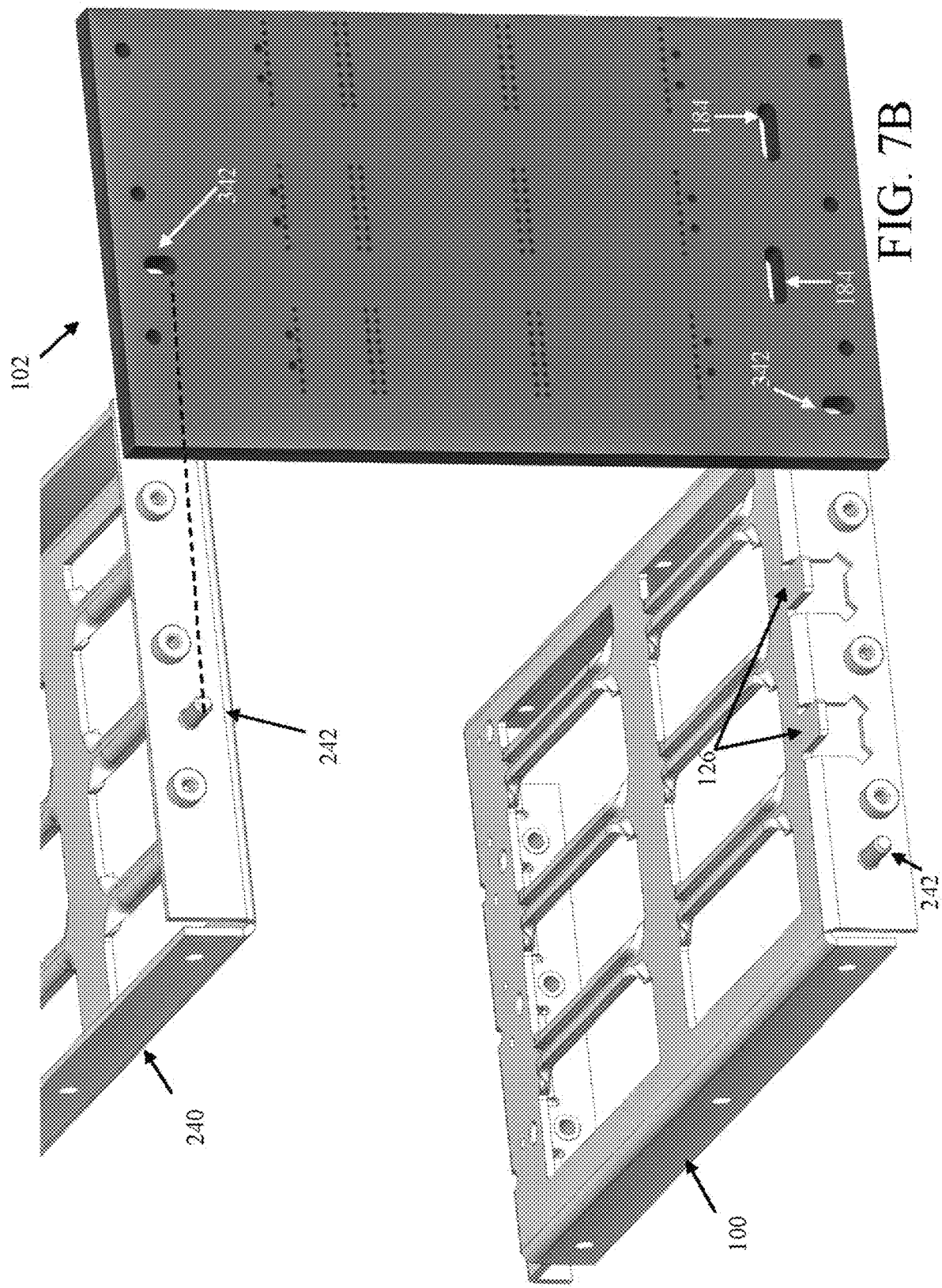

FIGS. 7A and 7B are non-limiting, exemplary illustrations of an alignment structure for guide panel and power-data transmission panel in accordance with another embodiment of the present invention. Guide panel and power-data transmission panel illustrated in FIGS. 7A and 7B include similar corresponding or equivalent components, interconnections, functional, operational, and or cooperative relationships as guide panel and power-data transmission panel that are shown in FIGS. 1A to 6I, and described above. Therefore, for the sake of brevity, clarity, convenience, and to avoid duplication, the general description of FIGS. 7A and 7B will not repeat every corresponding or equivalent component, interconnections, functional, operational, and or cooperative relationships that has already been described above in relation to guide panel and power-data transmission panel that are shown in FIGS. 1A to 6I but instead, are incorporated by reference herein.

As illustrated in FIGS. 7A and 7B, in this non-limiting, exemplary instance based on parameters of a plug-in unit 104 requirements, power-data transmission panel 102 has a shorter longitudinal axis 286, but a longer transverse axis 302. Accordingly, for this embodiment, both lower and upper guide panels 100 and 240 have alignment projections 126 and 242 that are inserted into corresponding alignment openings 184 and 342 of power-data transmission panel 102. As indicated above, number, position, size, and orientation of alignment structures in general, and alignment projections 126 and 242 and openings 184 and 342 in particular, may vary depending on the requirements of the plug-in unit 104.

In this non-limiting, exemplary instance, first alignment structure 408 is associated with upper guide panel 242 and upper section of power-data transmission panel 102. A second alignment structure 410 is associated with lower guide panel 100 and lower section of power-data transmission panel 102. In this embodiment, both, the first and the second alignment structures 408 and 410 prevent lateral 282 as well as in-plane rotational 280 movements of power-data transmission panel 102. In this non-limiting, exemplary instance, third and fourth alignment structures 412 and 414 are associated with lower guide panel 100 and lower section of power-data transmission panel 102. Both third and fourth alignment structures 412 and 414 prevent vertical movement 284 of power-data transmission panel 102.

Figure 8:
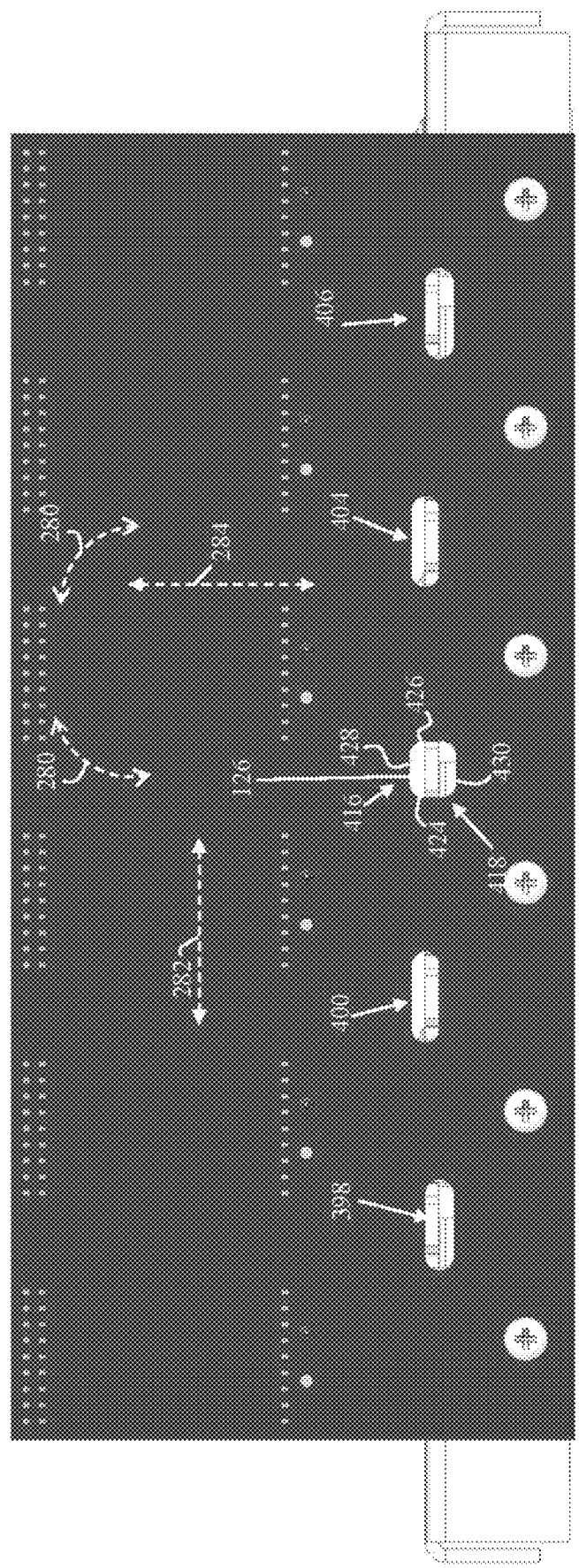
FIG. 8 is non-limiting, exemplary illustration of an alignment structure for guide panel and power-data transmission panel in accordance with another embodiment of the present invention.

FIG. 8 is non-limiting, exemplary illustrations of an alignment structure for guide panel and power-data transmission panel in accordance with another embodiment of the present invention. Guide panel and power-data transmission panel illustrated in FIG. 8 include similar corresponding or equivalent components, interconnections, functional, operational, and or cooperative relationships as guide panel and power-data transmission panel that are shown in FIGS. 1A to 7B, and described above. Therefore, for the sake of brevity, clarity, convenience, and to avoid duplication, the general description of FIG. 8 will not repeat every corresponding or equivalent component, interconnections, functional, operational, and or cooperative relationships that has already been described above in relation to guide panel and power-data transmission panel that are shown in FIGS. 1A to 7B but instead, are incorporated by reference herein.

As illustrated in FIG. 8, in this non-limiting, exemplary instance, alignment structure 416 prevents lateral movement 282 of power-data transmission panel 102. Alignment structure 416 includes alignment projection 126 extending from lower guide panel 100 and inserted into alignment opening 418. In this embodiment, lateral sides 420 and 422 of alignment projection 126 contact straight lateral sides 424 and 426 of alignment opening 418. Straight lateral sides 424 and 426 of alignment opening 418 must be of sufficient span so that the curved corners of alignment opening 418 do not interfere with lateral sides 420 and 422 of alignment projection 126. Accordingly, there is spacing between top and bottom sides 170 and 172 of alignment projection 126 and upper and lower edges 428 and 430 of alignment opening 418. Additionally, straight portions of the lateral edges of the alignment openings must have a longer span than thickness 178 of alignment projection 126. All non-contacting edges (upper, lower, lateral, etc.) are to enable easy insertion of alignment projections and hence, must be away from the alignment projections. Further, the non-contacting edges and distances allow for manufacturing tolerances of different process and parts (such as guide panel 100 and power-data transmission panel 102) without an adverse effect on card cage assembly accuracy.

Figure 9:
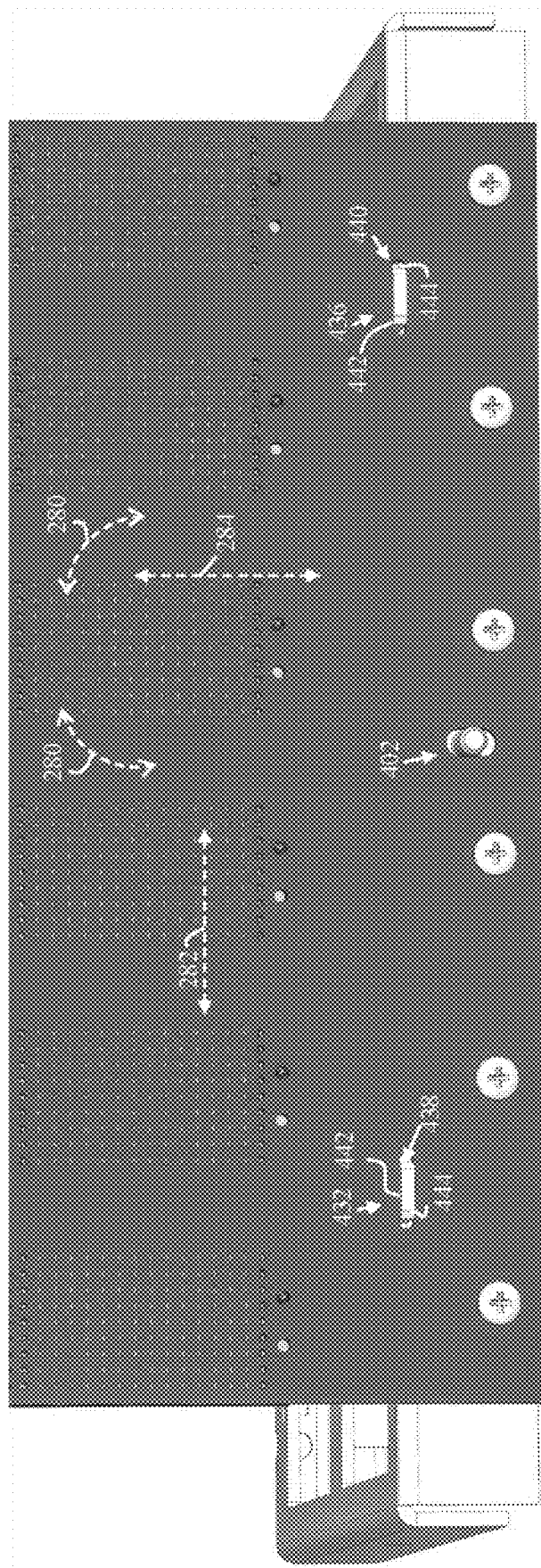
FIG. 9 is non-limiting, exemplary illustration of an alignment structure for guide panel and power-data transmission panel in accordance with another embodiment of the present invention.

FIG. 9 is non-limiting, exemplary illustrations of an alignment structure for guide panel and power-data transmission panel in accordance with another embodiment of the present invention. Guide panel and power-data transmission panel illustrated in FIG. 9 include similar corresponding or equivalent components, interconnections, functional, operational, and or cooperative relationships as guide panel and power-data transmission panel that are shown in FIGS. 1A to 8, and described above. Therefore, for the sake of brevity, clarity, convenience, and to avoid duplication, the general description of FIG. 9 will not repeat every corresponding or equivalent component, interconnections, functional, operational, and or cooperative relationships that has already been described above in relation to guide panel and power-data transmission panel that are shown in FIGS. 1A to 8 but instead, are incorporated by reference herein.

As illustrated in FIG. 9, in this non-limiting, exemplary instance, alignment structure 434 and 436 prevent in-plane rotation, movement 280 and vertical movement 284 while alignment structure 402 prevents lateral movement 282 of power-data transmission panel 102.

Alignment structures 432 and 436 include alignment projections 126 extending from lower guide panel 100 and inserted into respective alignment opening 438 and 440.

In this embodiment, top and bottom sides 170 and 172 of alignment projections 126 contact respective upper and lower edges 442 and 444 of alignment openings 438 and 440. Further, there is spacing 328 between lateral sides 420 and 422 of alignment projections 126 and alignment openings 438 and 440. Additionally, straight portions of the upper and lower edges 442 and 444 of the alignment openings 438 and 440 must have a longer span than width 176 of alignment projection. Further, the non-contacting edges and distances allow for manufacturing tolerances of different process and parts (such as guide panel 100 and power-data transmission panel 102) without an adverse effect on card cage assembly accuracy.

Figure 10:
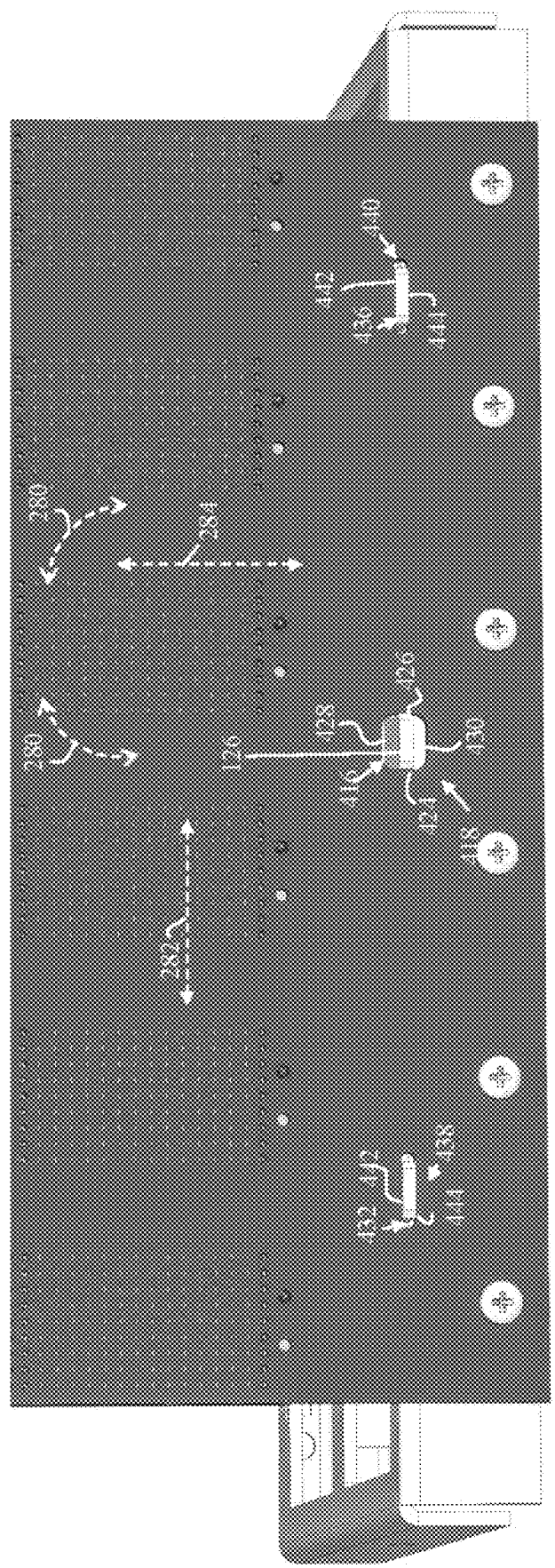
FIG. 10 is non-limiting, exemplary illustration of an alignment structure for guide panel and power-data transmission panel in accordance with another embodiment of the present invention.

FIG. 10 is non-limiting, exemplary illustrations of an alignment structure for guide panel and power-data transmission panel in accordance with another embodiment of the present invention. Guide panel and power-data transmission panel illustrated in FIG. 10 include similar corresponding or equivalent components, interconnections, functional, operational, and or cooperative relationships as guide panel and power-data transmission panel that are shown in FIGS. 1A to 9, and described above. Therefore, for the sake of brevity, clarity, convenience, and to avoid duplication, the general description of FIG. 10 will not repeat every corresponding or equivalent component, interconnections, functional, operational, and or cooperative relationships that has already been described above in relation to guide panel and power-data transmission panel that are shown in FIGS. 1A to 9 but instead, are incorporated by reference herein.

In this non-limiting, exemplary instance, a combination of alignment structures 432, 416, and 436 described above are used together.

Figure 11:
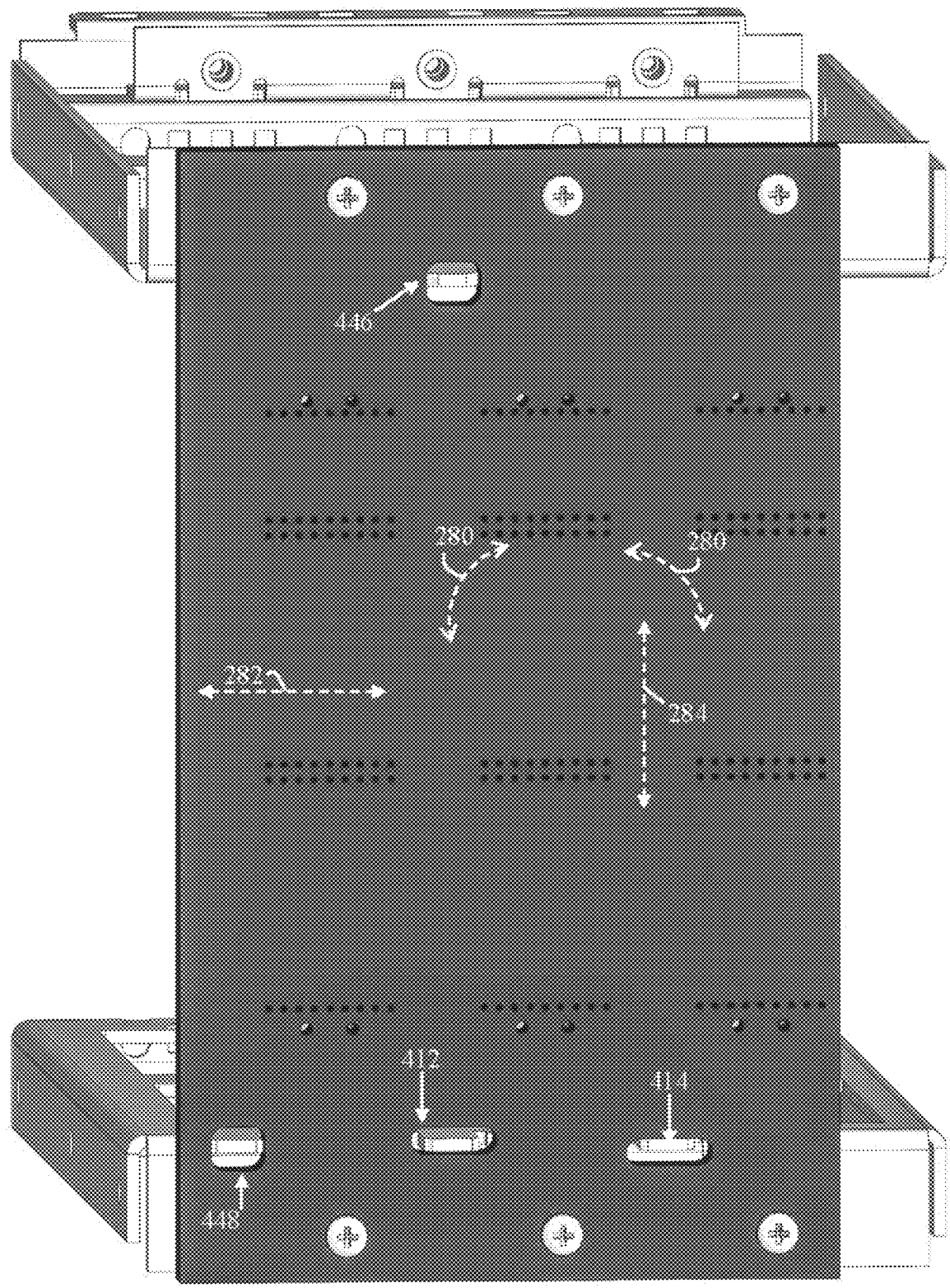
FIG. 11 is non-limiting, exemplary illustration of an alignment structure for guide panel and power-data transmission panel in accordance with another embodiment of the present invention.

FIG. 11 is non-limiting, exemplary illustrations of an alignment structure for guide panel and power-data transmission panel, in accordance with another embodiment of the present invention. Guide panel and power-data transmission panel illustrated in FIG. 11 include similar corresponding or equivalent components, interconnections, functional, operational, and or cooperative relationships as guide panel and power-data transmission panel that are shown in FIGS. 1A to 10, and described above. Therefore, for the sake of brevity, clarity, convenience, and to avoid duplication, the general description of FIG. 11 will not repeat every corresponding or equivalent component, interconnections, functional, operational, and or cooperative relationships that has already been described above in relation to guide panel and power-data transmission panel that are shown in FIGS. 1A to 11 but instead, are incorporated by reference herein.

In this non-limiting, exemplary instance, alignment structures 408 and 410 shown in FIGS. 7A and 7B are replaced with alignment structures 446 and 448. Alignment structures 446 and 448 are identical to alignment structure 418. As with the embodiment illustrated in FIGS. 7A and 7B, alignment structures prevent lateral and in-plane rotational movements 282 and 280 of power-data transmission panel 102. Alignment structures 412 and 414 prevent vertical movement 284 of the power-data transmission, panel 102.

Figure 12:
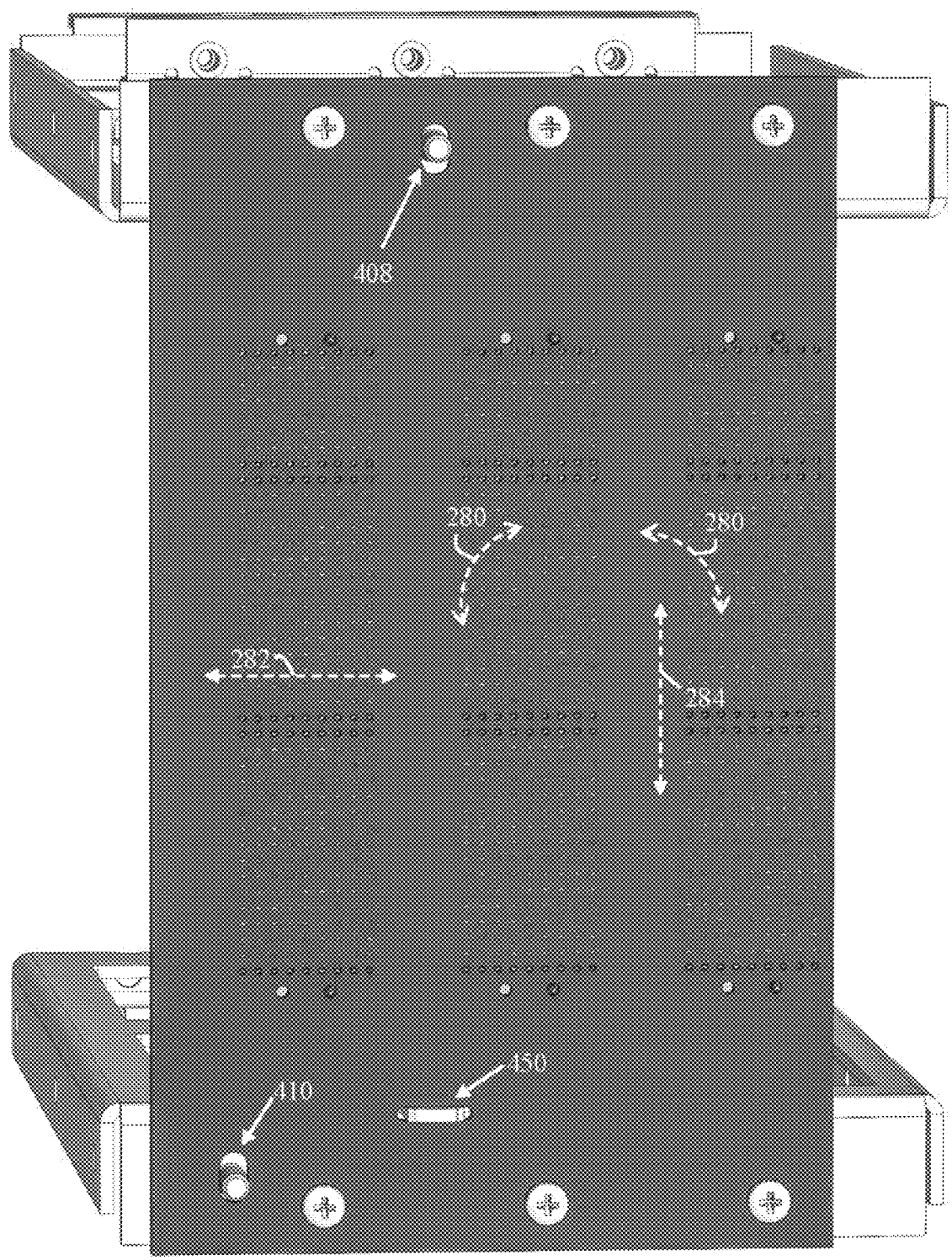
FIG. 12 is non-limiting, exemplary illustration of an alignment structure for guide panel and power-data transmission panel in accordance with another embodiment of the present invention.

FIG. 12 is non-limiting, exemplary illustrations of an alignment structure for guide panel and power-data transmission, panel, in accordance with another embodiment of the present invention. Guide panel and power-data transmission panel illustrated in FIG. 12 include similar corresponding or equivalent components, interconnections, functional, operational, and or cooperative relationships as guide panel and power-data transmission panel that are shown in FIGS. 1A to 11, and described above. Therefore, for the sake of brevity, clarity, convenience, and to avoid duplication, the general description of FIG. 12 will not repeat every corresponding or equivalent component, interconnections, functional, operational, and or cooperative relationships that has already been described, above in relation to guide panel and power-data transmission panel that are shown in FIGS. 1A to 11 but instead, are incorporated by reference herein.

In this non-limiting, exemplary instance, alignment structures structure 450 (identical to alignment structures 432 and 436) prevent vertical movement of the power-data transmission panel 102.

Figure 13:
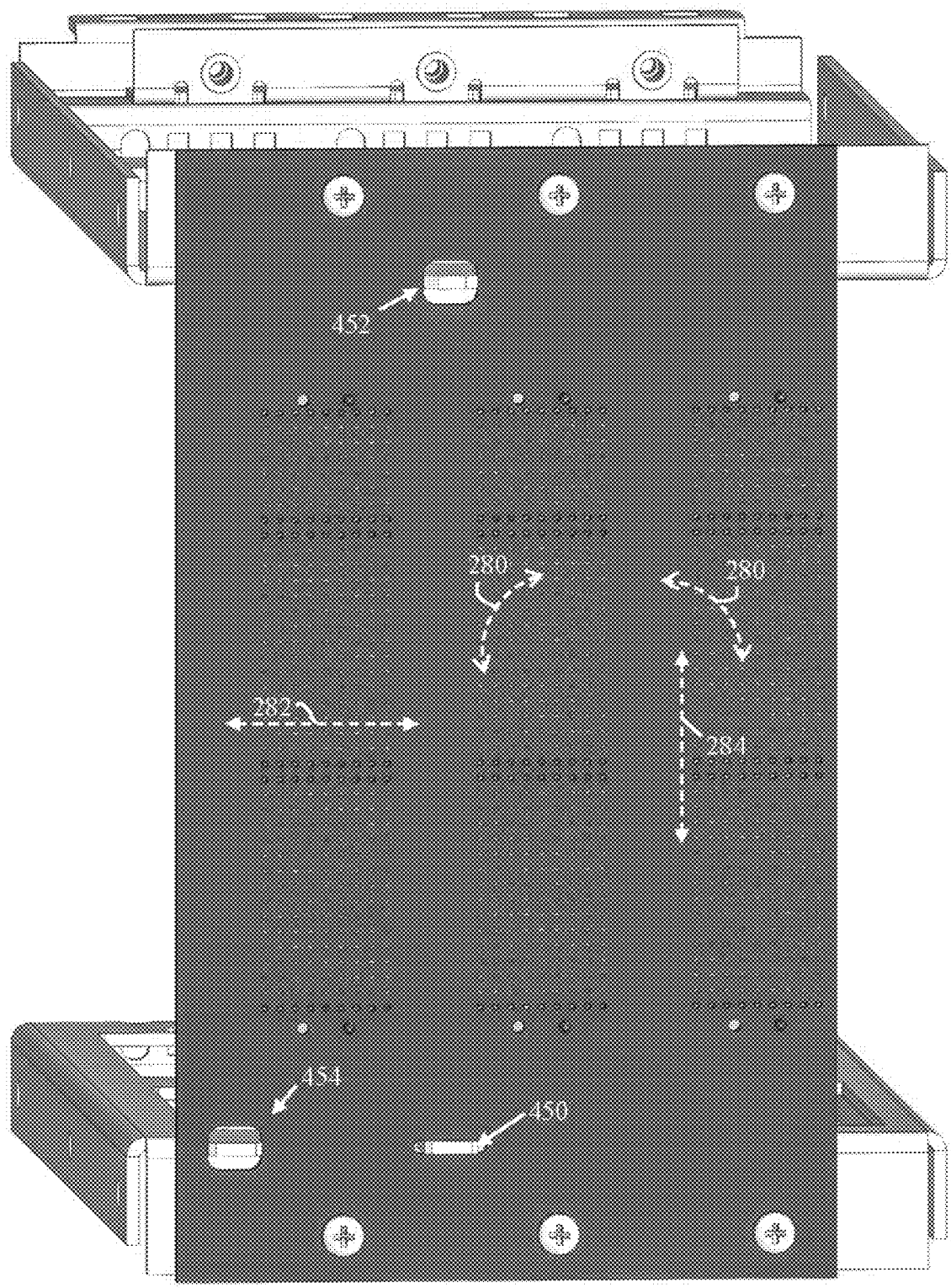
FIG. 13 is non-limiting, exemplary illustration of an alignment structure for guide panel and power-data transmission panel in accordance with another embodiment of the present invention.

FIG. 13 is non-limiting, exemplary illustrations of an alignment structure for guide panel and power-data transmission panel in accordance with another embodiment of the present invention. Guide panel and power-data transmission panel illustrated in FIG. 13 include similar corresponding or equivalent components, interconnections, functional, operational, and or cooperative relationships as guide panel and power-data transmission panel that are shown in FIGS. 1A to 12, and described above. Therefore, for the sake of brevity, clarity, convenience, and to, avoid duplication, the general description of FIG. 13 will not repeat every corresponding or equivalent component, interconnections, functional, operational, and or cooperative relationships that has already been described above in relation to guide panel and power-data transmission panel that are shown in FIGS. 1A to 12 but instead, are incorporated by reference herein.

In this non-limiting, exemplary instance, alignment structures 452 and 454 (identical to alignment structure 416) prevent both lateral and as well as in-plane rotation movements 282 and 280 of power-data transmission panel 102.

Figure 14:
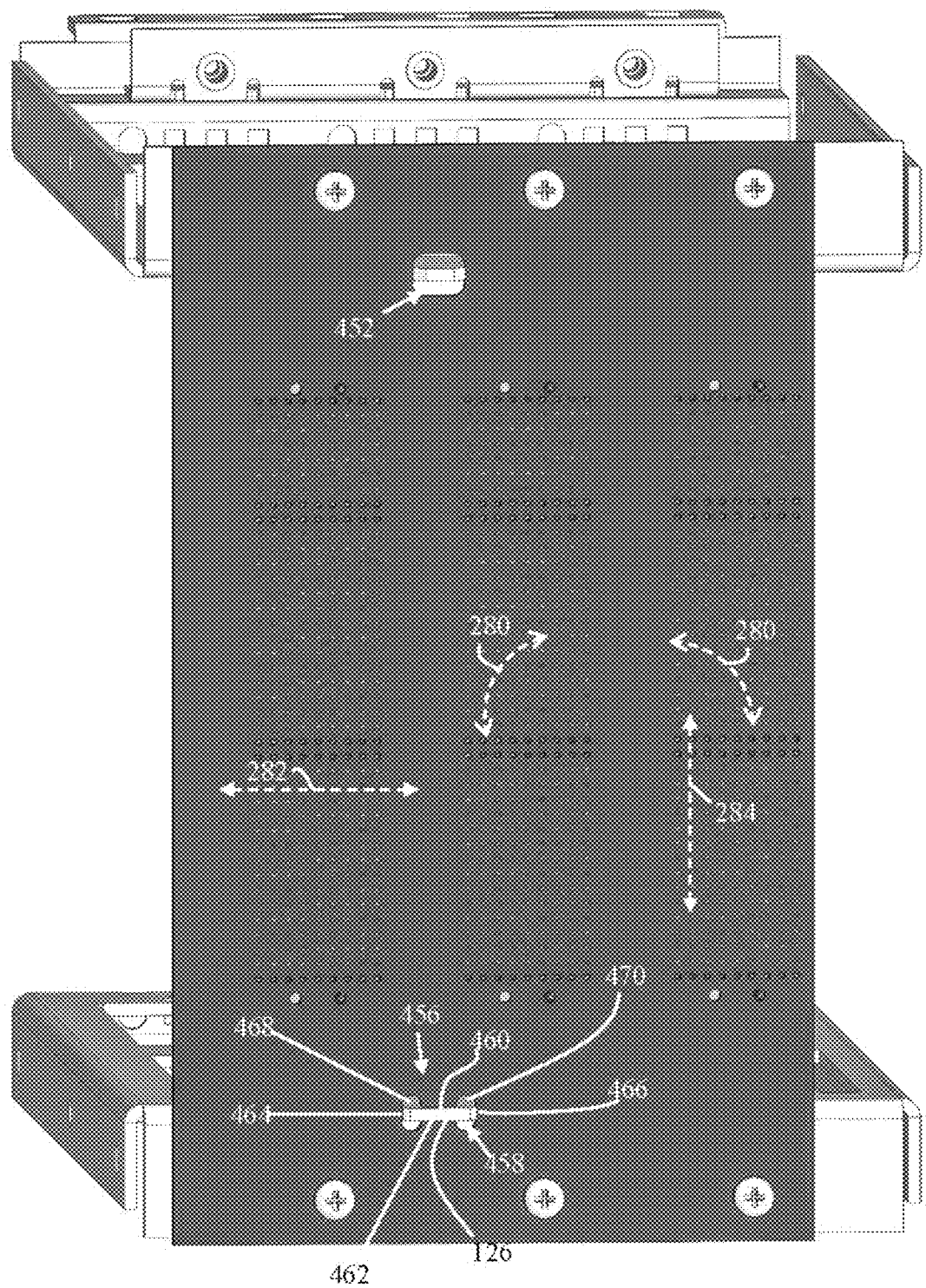
FIG. 14 is non-limiting, exemplary illustration of an alignment structure for guide panel and power-data transmission panel in accordance with another embodiment of the present invention.

FIG. 14 is non-limiting, exemplary illustrations of an alignment structure for guide panel and power-data transmission panel in accordance with another embodiment of the present invention. Guide panel and power-data transmission panel illustrated in FIG. 14 include similar corresponding or equivalent components, interconnections, functional, operational, and or cooperative relationships as guide panel and power-data transmission panel that are shown in FIGS. 1A to 13, and described above. Therefore, for the sake of brevity, clarity, convenience, and to avoid duplication, the general description of FIG. 14 will not repeat every corresponding or equivalent component, interconnections, functional, operational, and or cooperative relationships that has already been described above in relation to guide panel and power-data transmission panel that are shown in FIGS. 1A to 13 but instead, are incorporated by reference herein.

In this non-limiting, exemplary instance, alignment structures 456 is comprised of an alignment opening 458 and alignment projection 126. Both top and bottom surfaces 170 and 172 of alignment projection 126 fully contact respective upper straight section edge 460 and lower straight section edge 462 of alignment opening 458.

As further illustrated, both lateral sides 420 and 422 of alignment projection 126 also fully contact respective first and second straight section sides 464 and 466. The rounded lateral openings 468 and 470 facilitate in constructing alignment opening 458.

In this non-limiting, exemplary instance, alignment structure 456 prevents in-plane rotational movement 280, lateral movement 282, and vertical movement 284 because alignment projection 126 contacts all four edges 460, 462, 464, and 466 of alignment opening 458. Further, alignment structure 452 in combination with alignment structure 456 further prevent both lateral and in-plane rotational movements 282 and 280.

Figure 15:
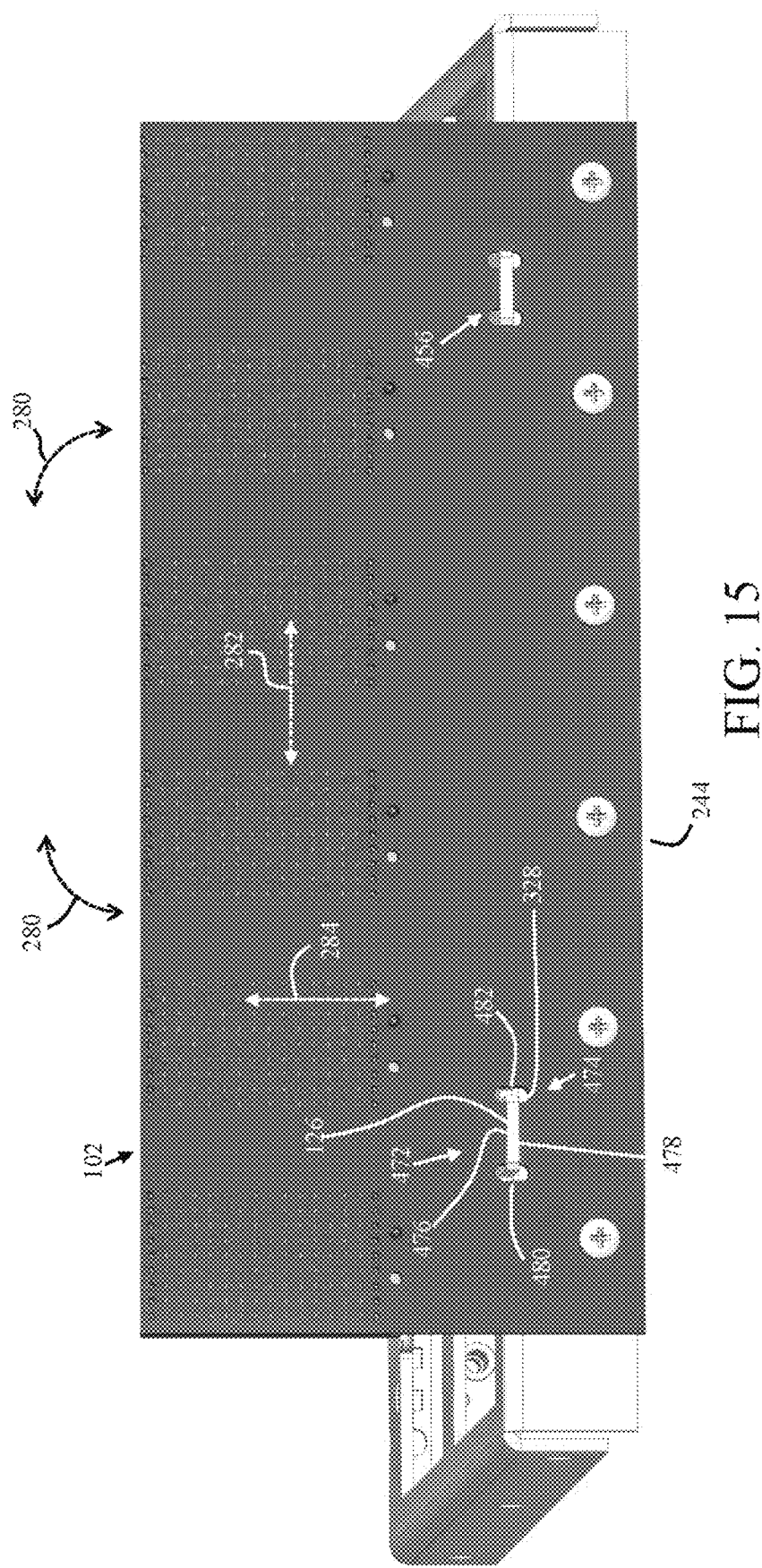
FIG. 15 is non-limiting, exemplary illustration of an alignment structure for guide panel and power-data transmission panel in accordance with another embodiment of the present invention.

FIG. 15 is non-limiting, exemplary illustrations of an alignment structure for guide panel and power-data transmission panel in accordance with another embodiment of the present invention. Guide panel and power-data transmission panel illustrated in FIG. 15 include similar corresponding or equivalent components, interconnections, functional, operational, and or cooperative relationships as guide panel and power-data transmission panel that are shown in FIGS. 1A to 14, and described above. Therefore, for the sake of brevity, clarity, convenience, and to avoid duplication, the general description of FIG. 15 will not repeat every corresponding or equivalent component, interconnections, functional, operational, and or cooperative relationships that has already been described above in relation to guide panel and power-data transmission panel that are shown in FIGS. 1A to 14 but instead, are incorporated by reference herein.

In this non-limiting, exemplary instance, alignment structures 472 is comprised of an alignment opening 474 and alignment projection 126. Both top and bottom surfaces 170 and 172 of alignment projection 126 fully contact respective upper straight section edge 476 and lower straight section edge 478 of alignment opening 474.

As, further illustrated, both lateral sides 420 and 422 of, alignment projection 126 do not contact respective first and second straight section sides 480 and 482. Accordingly, there is a spacing 328 between lateral sides 420 and 422 of alignment projection 126 and respective sides 480 and 482 of alignment opening 474. The rounded lateral openings 468 and 470 facilitate in constructing alignment opening 474.

In this non-limiting, exemplary instance, alignment structure 456 prevents in-plane rotational movement 280, lateral movement 282, and vertical movement 284 of power-data transmission panel 102. Further, alignment structure 472 in combination with alignment structure 456 further prevent vertical as well as in-plane rotational movements 284 and 280 of power-data transmission panel 102.

It should be noted that for all, of the embodiments disclosed the precision and accuracy is substantially below +/−0.15 mm (0.005 in) with respect to alignment and lateral, vertical, and in-plane rotational movements of power-data transmission panel 102 in relation to guide panel 100. The best precision and accuracy achieved by well-known conventional systems at best is above +/−0.46 mm (0.018 in), which is substantially less precise and less accurate (about 300% less precise and less accurate) and without preventing lateral, vertical, and in-plane rotational movements.

FIGS. 16A to 16I are non-limiting, exemplary illustrations of, a card cage (in particular, guide panel) that includes accommodations for a box type plug-in unit in accordance with another embodiment of the present invention. The guide panel illustrated in FIGS. 16A to 16I include similar corresponding or equivalent components, interconnections, functional, operational, and or cooperative relationships as the guide panels that are shown in FIGS. 1A to 15, and described above. Therefore, for the sake of brevity, clarity, convenience, and to avoid duplication, the general description of FIGS. 16A to 16I will not repeat every corresponding or equivalent component, interconnections, functional, operational, and or cooperative relationships that has already been described above in relation to the guide panel that are shown in FIGS. 1A to 15 but instead, are incorporated by reference herein.

Figure 16A:
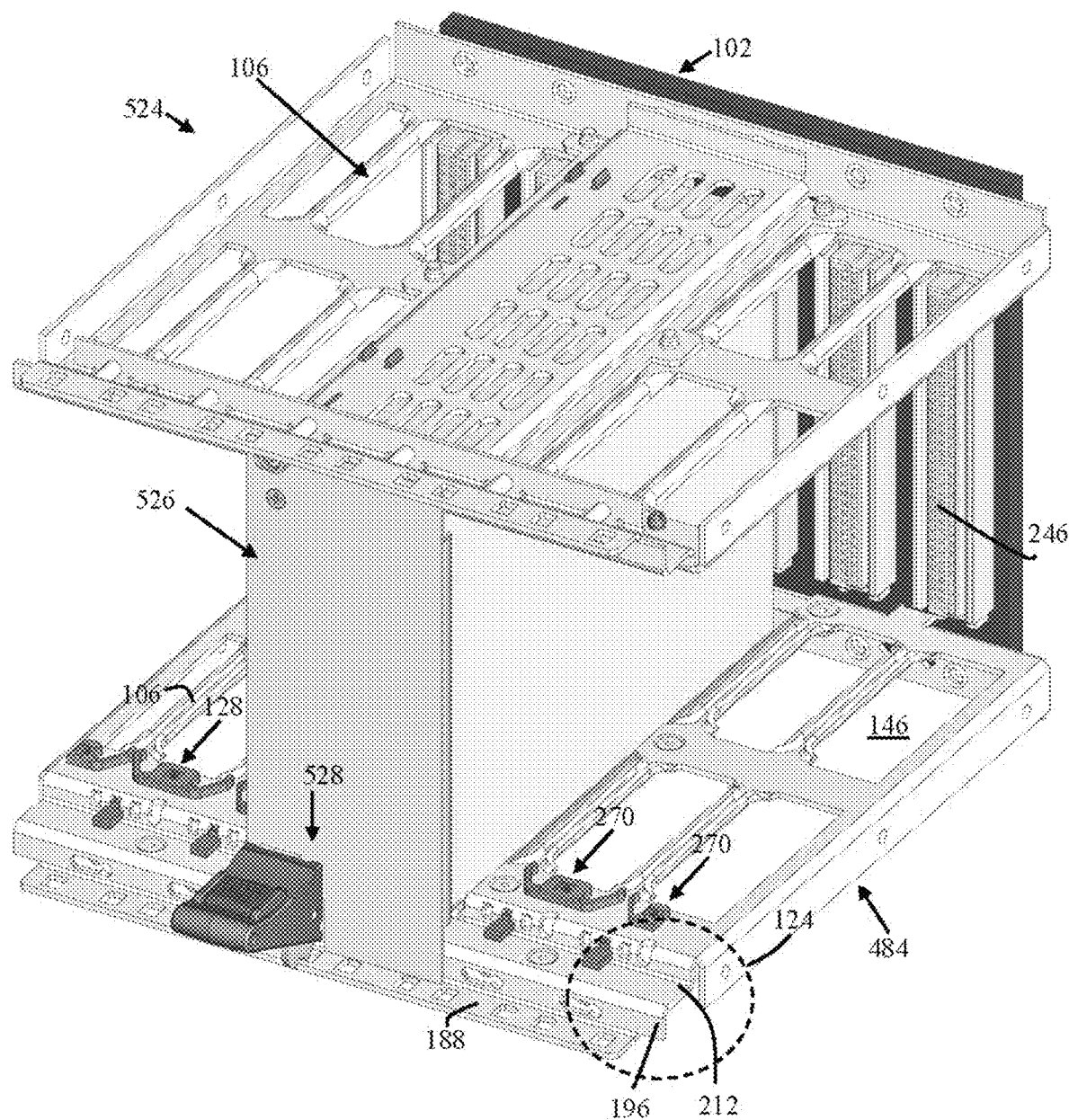
FIGS. 16A to 16I are non-limiting, exemplary illustrations of a card cage (in particular, guide panel) that includes accommodations for a box type plug-in unit in accordance with another embodiment of the present invention.
Figure 16B:
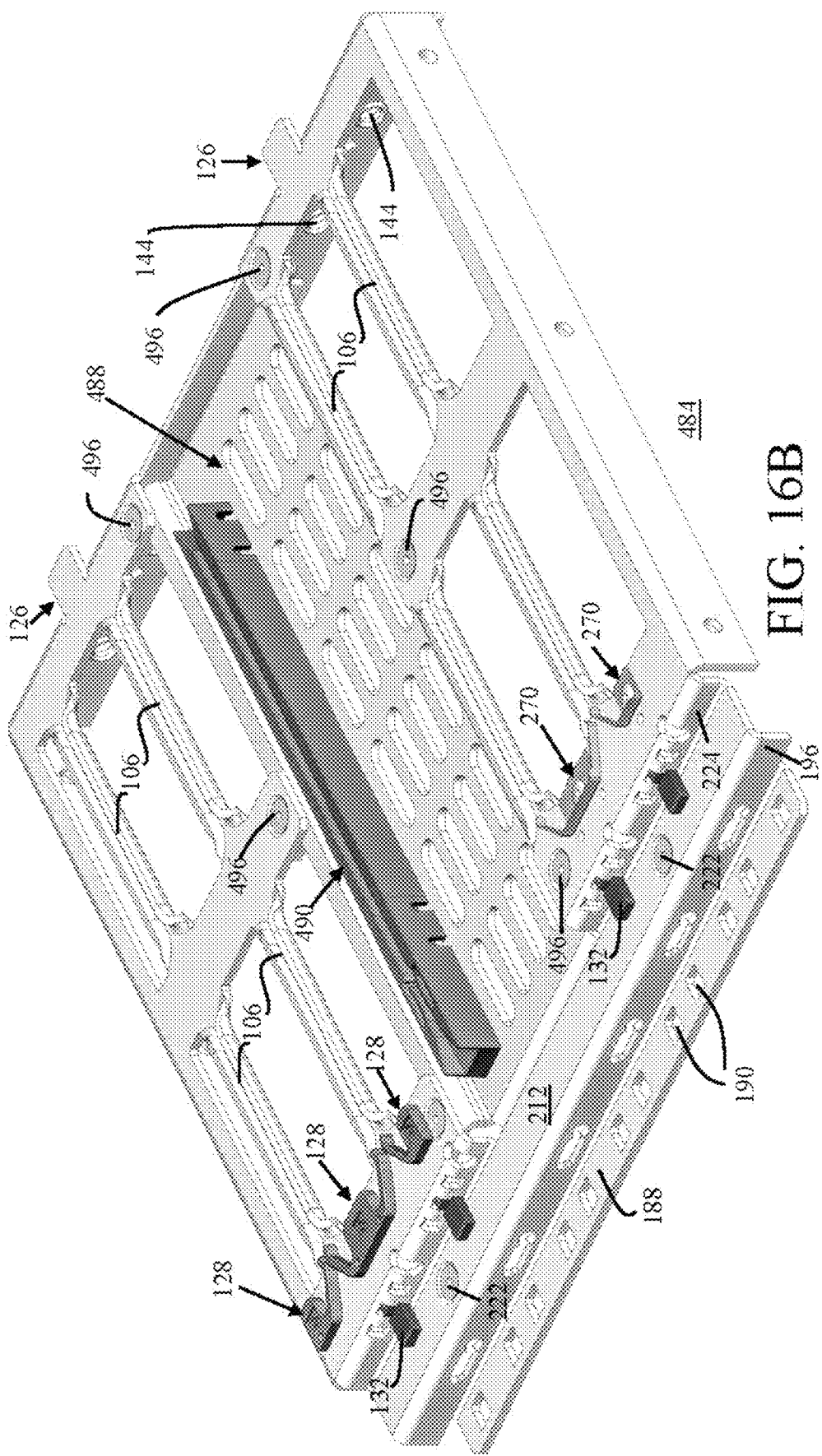
Figure 16C:
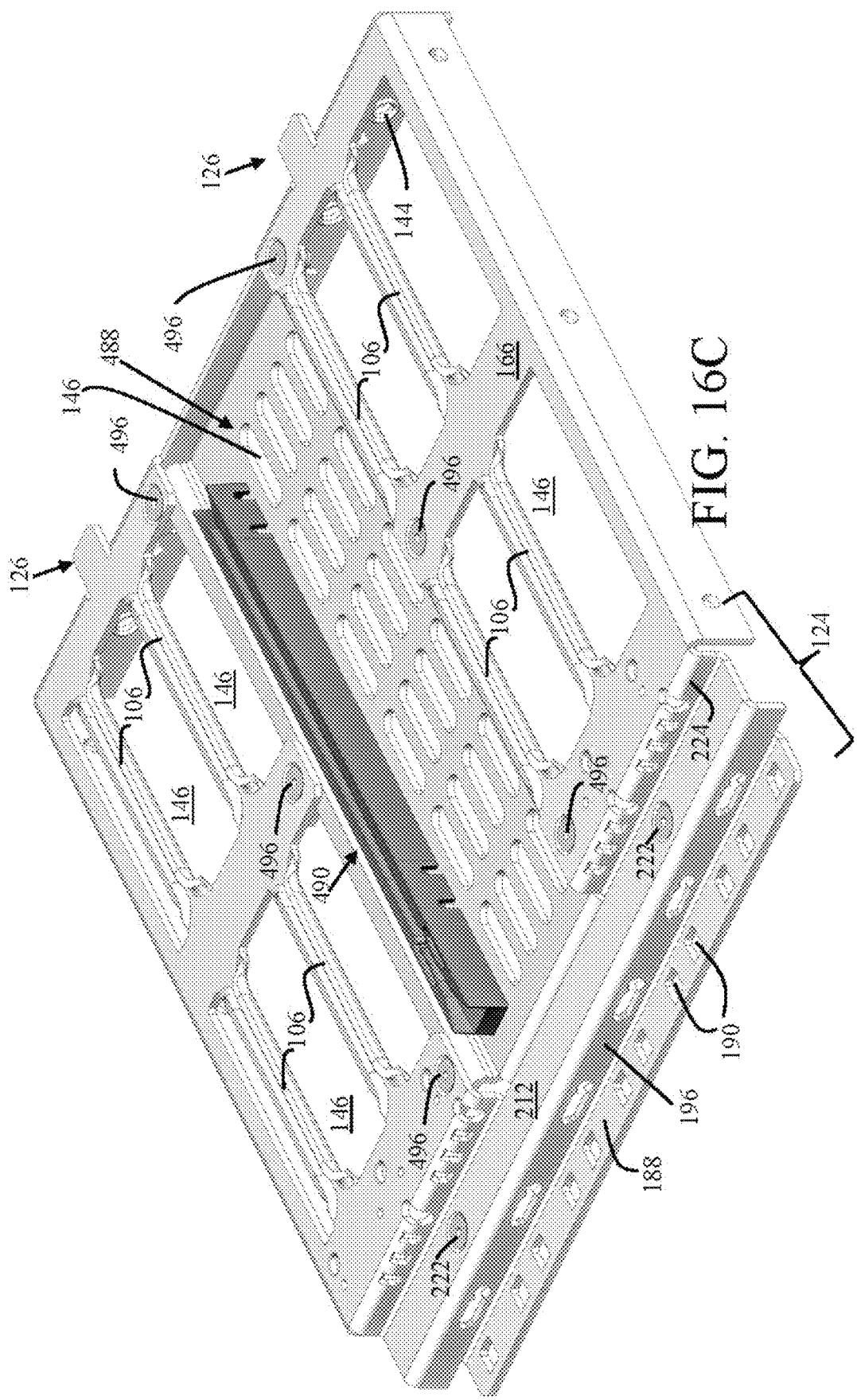
Figure 16D:
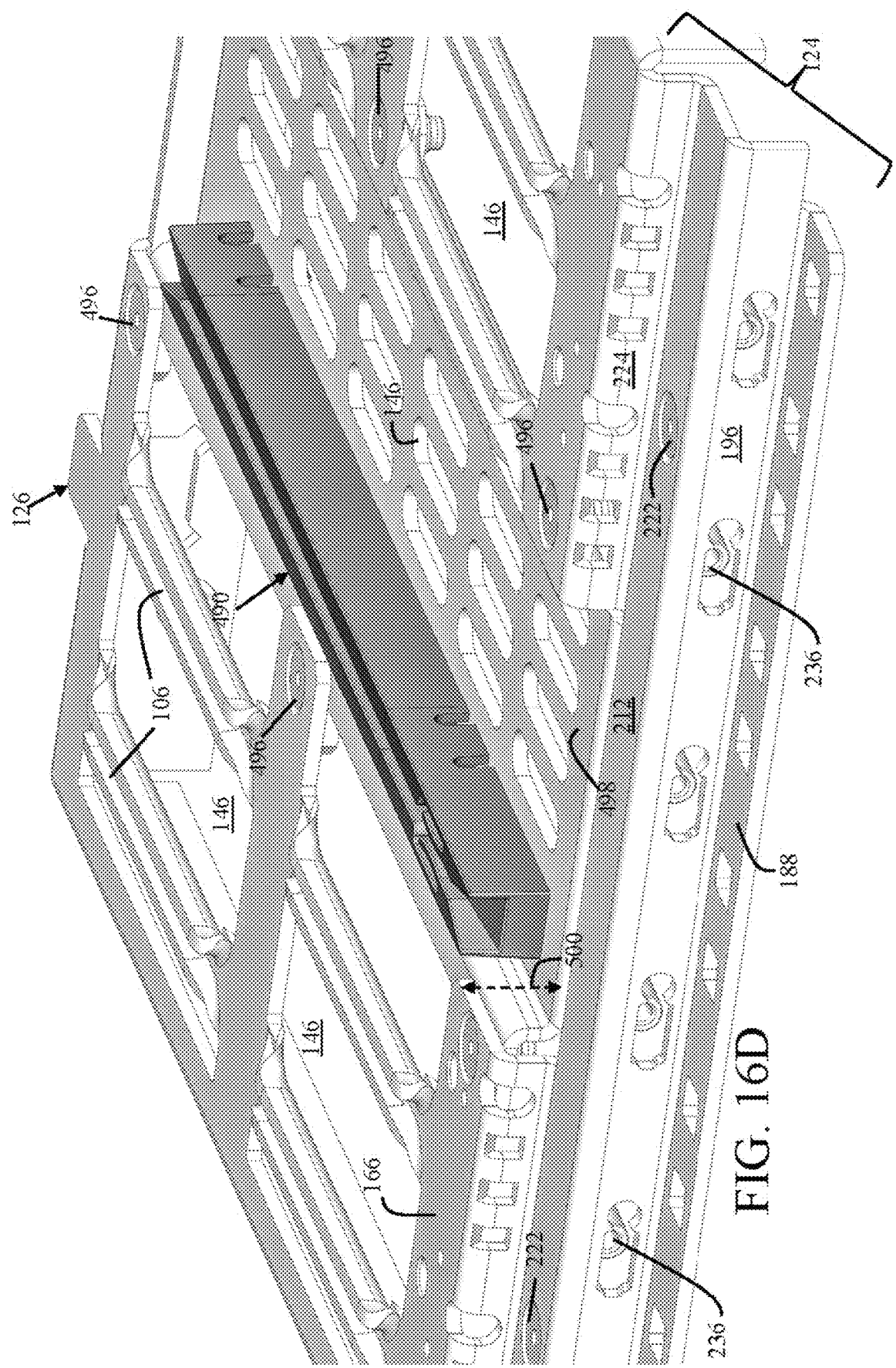

FIGS. 16A to 16I are non-limiting, exemplary illustrations related to a guide panel assembly of a card cage that is capable of accommodating box type plug-in units in accordance with one or more embodiments of the present invention. As illustrated, in this non-limiting, exemplary instance, lower and upper guide panel assemblies 484 and 524 each include a guide panel 486, a box guide panel 488, a box guide slot 490, and angled fastener bar 218. FIG. 16A further illustrates a conventional box plug-in unit 526 mounted between upper and lower guide panel assemblies 484 and 524 and connected to power-data transmission panel 102.

As with, lower and upper guide panels 100 and 240, lower and upper guide panel assembly 484 and 524 are also identical with the exception of their respective interfaces with power-data transmission panel 102. Accordingly, from this point forward, only lower guide panel assembly 484 is discussed in detail for simplicity and clarity.

Guide panel 486 has the same identical engagement structure 124 as described above for accommodating card plug-in units 104 for the four illustrated guidance slots 106. In this non-limiting, exemplary instance, the well-known, conventional box plug-in units 526 may not require or need second vertical surface 224 of guide panel 484 (which includes the key or index openings 134, second guide openings 226, etc.

As detailed below, one or more embodiments of the present invention are optionally designed to accommodate one or more box plug-in units 526, which require a box guide panel 488 for support. Accordingly, one or more embodiments of the present invention provide a box guide panel 488 associated with guide panel 486, with box guide panel 488 supporting one or more box plug-in units (not shown, but well known). This embodiment merely illustrates the flexibility of the innovative design of a guide panel of the present invention with reduced parts, while meeting various standards without loss in functionality.

Figure 16E:
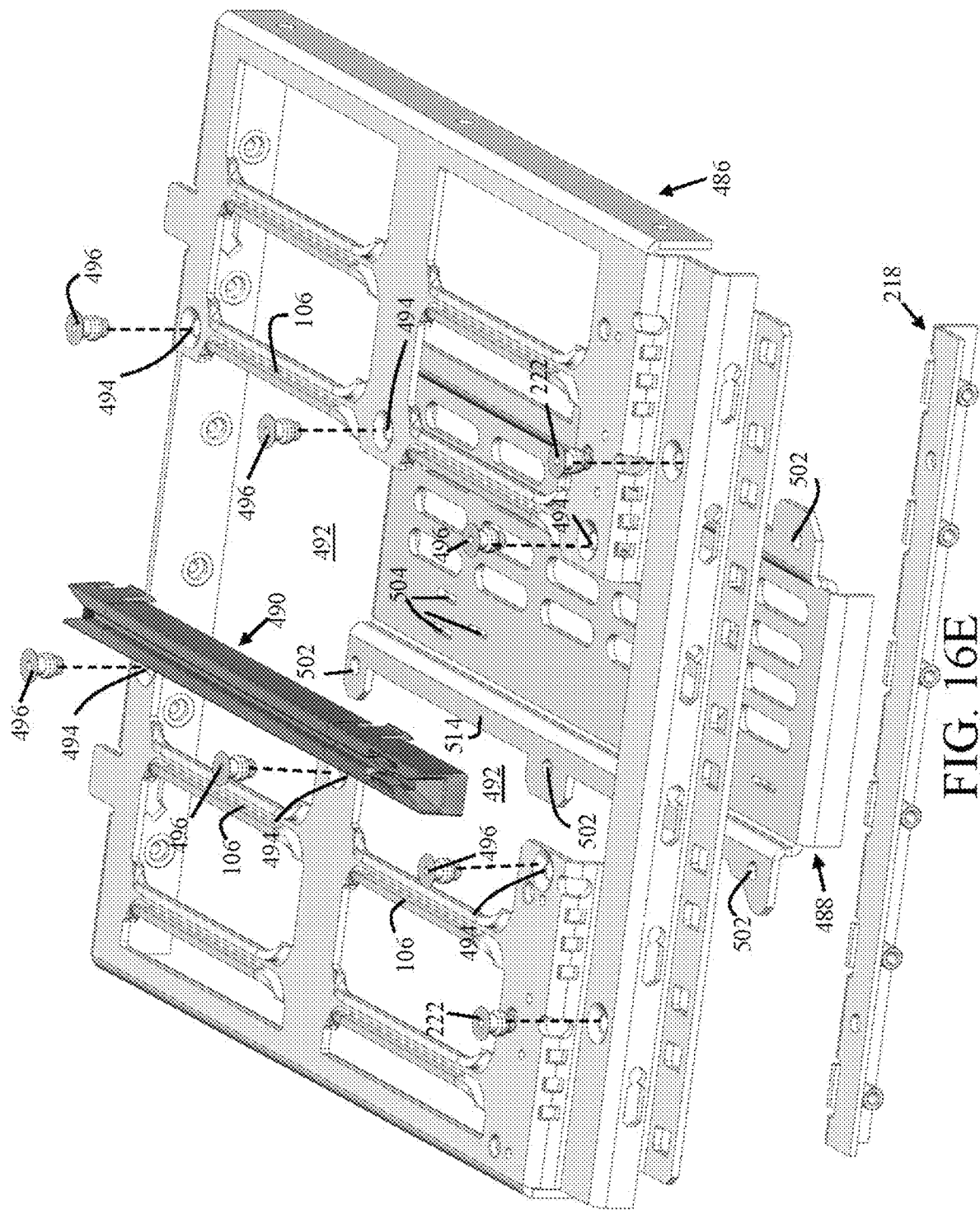
Figure 16F:
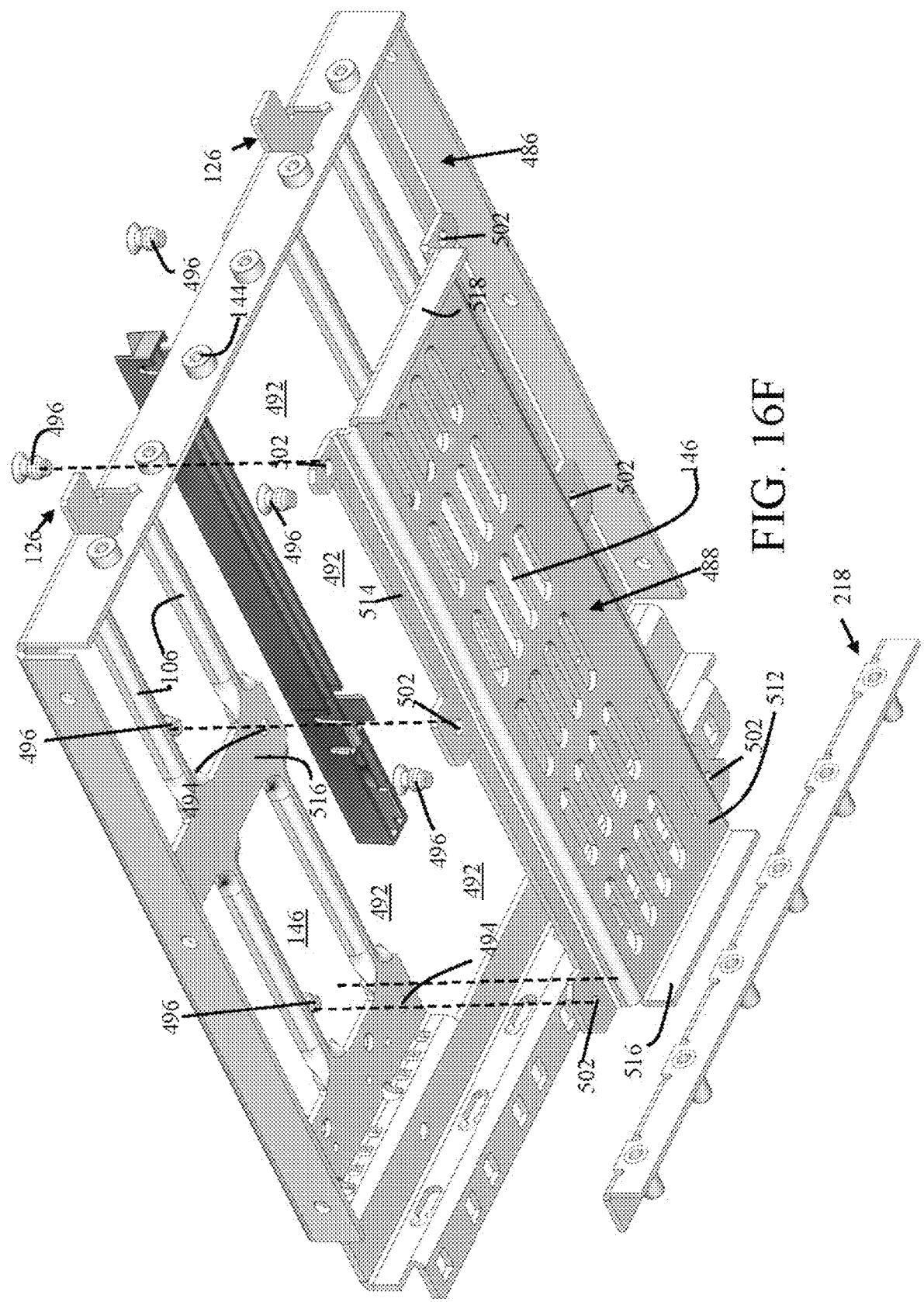

Referring to FIG. 16E, guide panel 486 has identical features compared to any one of the guide panels discussed above with the exception that it has a box guide opening 492 between its slots 106 to receive a box guide panel 488. Further included on guide panel 486 are lateral fastener openings 494 for securing box-guide panel 488 to guide panel 486.

Box guide opening 492 may be varied in terms of size, position, and number. For example, a box guide opening 492 may be positioned at a distal lateral end of guide panel 486. As another example, two box guide openings 492 of larger size may be positioned at both distal lateral ends of guide panel 486 for supporting two box plug-in units.

As illustrated, box guide opening 492 of guide panel 486 may be formed by removing some infrastructure from guide panel 486, providing openings 492 for attachment of box guide panel 488 within opening 492. Any type of well-known fastener mechanism may be used to securely attach a box guide panel 488 to guide panel 486, including using the illustrated fasteners 496.

As further illustrated (for example, in FIG. 16D), top surface 498 of box guide panel 488 is at a lower elevation by a distance 500 from top surface 166 of guide panel 486. Lower elevation distance 500 of top surface 498 of box guide panel 488 provides sufficient spacing (between top and bottom box guide panels—only one box guide panel is shown) to enable box plug-in unit (which has increased, height size than a plug-in unit) to fit in between top and bottom box guide panels.

As illustrated, optimally, box guide panel 488 also includes ventilation openings 146, including openings 504 for securing box guide slots 490 for mounting and aligning of box plug-in units. It should be noted that in this non-limiting, exemplary instance, one box-guide slot 490 is illustrated. However, instead, more box guide slots 490 may also be optionally used for a single box plug-in unit instead of the one per box plug-in unit.

Figure 16G:
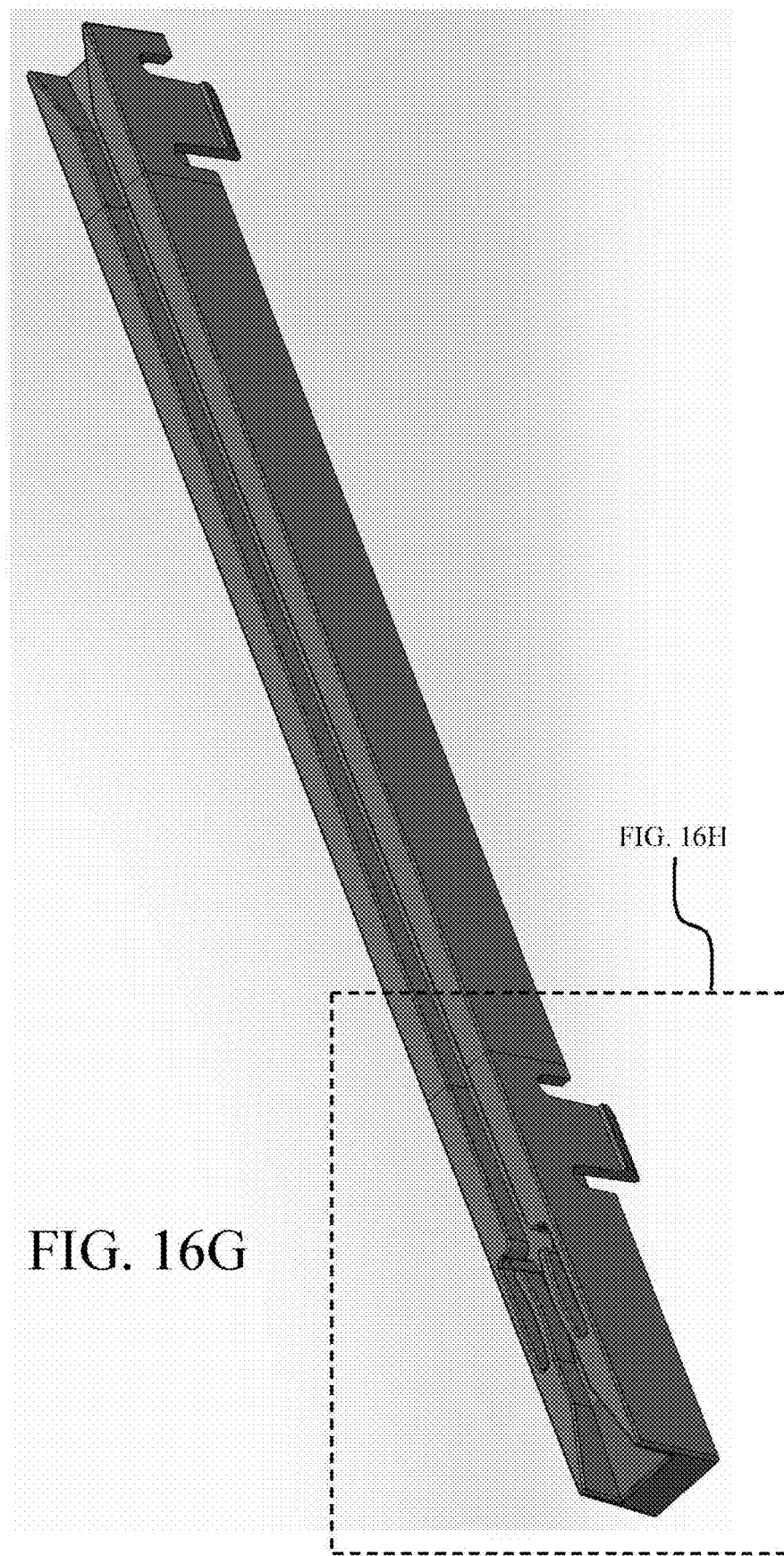
Figure 16H:
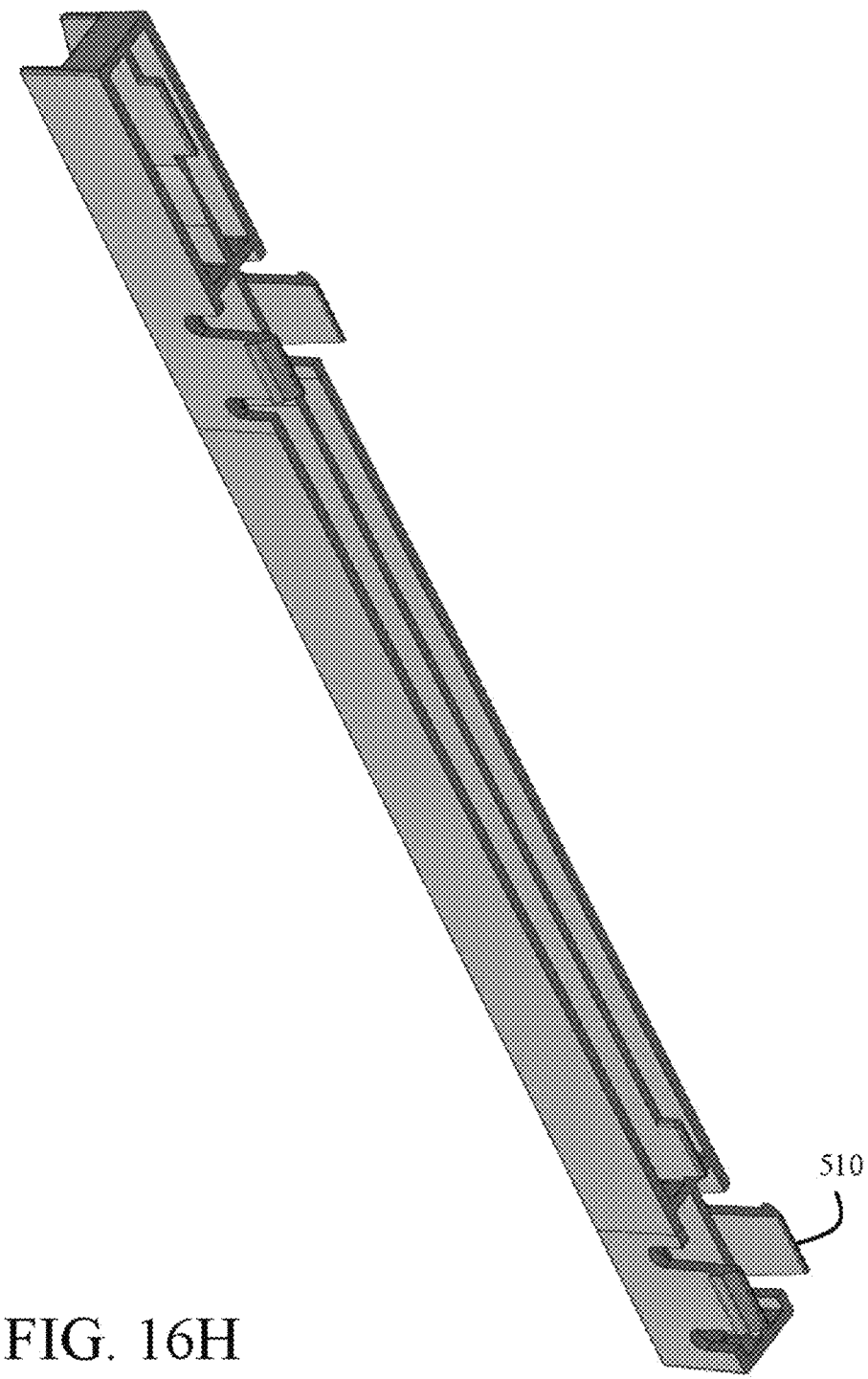
Figure 16I:
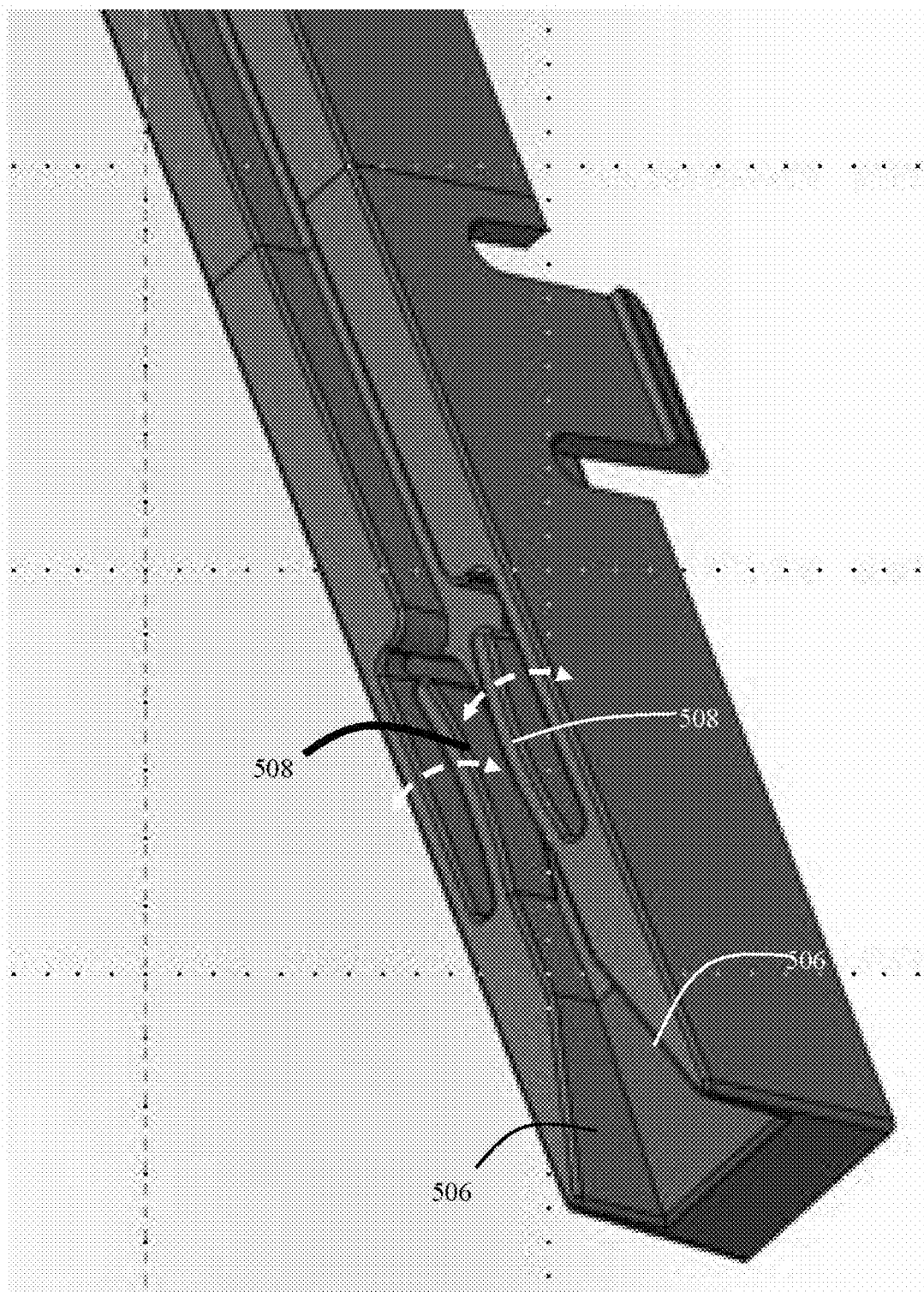

As illustrated in FIGS. 16G to 16I, box guide slots 490 are associated with, box guide panel 488 to accommodate and support box plug-in units in accordance with one or more, embodiments of the present invention. In this non-limiting, exemplary instance, box guide slots 490 are not part of box guide panel 488 but are securely mounted onto box guide panel 488.

Each box guide slot 490 supports a single box plug-in unit on box guide panel 488. Box guide slot 490 may be comprised of the same material as the ESD components 128 for ESD protection.

Box guide slot 490 may comprise of chamfered edges 506 for easy insertion (or sliding) of a box plug-in unit. Box guide slot 490 may further include resilient extensions 508 that firmly mechanically contact ("interference fit") box plug-in units for ESD protection as indicated in FIG. 16I.

Resilient extensions 508 are equivalent to resilient extensions of ESD components 128. The opposite side of box guide slot 490 (FIG. 16H) may include interlocking extensions 510 that snap into respective openings 504 of box guide panel 488.

Referring back to FIGS. 16A to 16F, box guide panel 488 has top and bottom box guide panel surfaces 498 and 512, and includes lateral mounting flanges 514 that include openings 502 for mounting and securing box guide panel 488 to underside of lateral sides 516 of openings 494 on guide panel 486.

Further included are front and rear facing flanges 516 and 518 that are bent to enable top surface 498 of box guide panel 488 to remain flat and coplanar with second horizontal surface 212 of engagement structure 124 of guide panel 486. This structural arrangement enables easy insertion and removal of box type plug-in unit enclosures on coplanar surfaces 498 and 212. Surface 498 may be at a lower elevation than that of surface 212. Front and rear flanges 516 and 518 may be optional for short box guide panels (as shown) and may function as stiffeners.

Although the invention has been described in considerable detail in language specific to structural features and or method acts, it is to be understood that the invention defined in the appended claims is not necessarily limited to the specific features or acts described. Rather, the specific features and acts are disclosed as exemplary preferred forms of implementing the claimed invention. Stated otherwise, it is to be understood that the phraseology and terminology employed herein, as well as the abstract, are for the purpose of description and should not be regarded as limiting. Further, the specification is not confined to the disclosed embodiments. Therefore, while exemplary illustrative embodiments of the invention have been described, numerous variations and alternative embodiments will occur, to those skilled in the art. For example, the location of alignment projections and alignment openings may be reversed. For example, power-data transmission panels 102 may comprise the alignment projections and guide panel may comprise the alignment openings. As another example, any number of combinations and permutations of the alignment structures shown throughout the figures may be used for, any card cage or power-data transmission panel. A non-limiting, exemplary method of manufacturing guide panel is to use sheet metal and cut out all shapes (e.g., by punching/laser cut/use of CNC machines, stamping press etc.), bend to selected configurations, and add standoffs at the rear flange and bend desired sections. It should be noted that the slot 106 infrastructure is, formed during the automated cut-out operations or stamping operations. In other words, slot 106 opening edges are formed during the same cutting process. Accordingly, the engagement structures 124 are for example, punched and formed when either CNC or stamping processes are used. During actual final step of assembly of the card cage, all that would be required is the use of fasteners such as rivets or threaded fasteners to connect all manufactured parts. The present application does not preclude the joining of parts through welding, brazing, soldering, etc. Such variations and alternate embodiments are contemplated, and can be made without departing from the spirit and scope of the invention.

It should further be noted that throughout the entire disclosure, the labels such as left, right, front, back, top, inside, outside, bottom, forward, reverse, clockwise, counter clockwise, up, down, or other similar terms such as upper, lower, aft, fore, vertical, horizontal, oblique, proximal, lateral, distal, parallel, perpendicular, transverse, longitudinal, etc. have been used for convenience purposes only and are not intended to imply any particular fixed direction, orientation, or position. Instead, they are used to reflect relative locations/positions and/or directions/orientations between various portions of an object.

In addition, reference to "first," "second," "third." and etc. members throughout the disclosure (and in particular, claims) is not used to show a serial or numerical limitation but instead is used to distinguish or identify the various members of the group.

Further the terms "a" and "an" throughout the disclosure (and in particular, claims) do not denote a limitation of quantity, but rather denote the presence of at least one of the referenced item.

In addition, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of," "act of," "operation of" or "operational act of" in the claims herein is not intended to invoke the provisions of 35 U.S.C. 112, Paragraph 6.

What is claimed is:

1. A guide panel, comprising:
unitized construction that includes:
a guidance slot;
an engagement structure; and
an alignment structure that pre-aligns a plug-in unit with a power-data transmission panel before the plug-in unit is mounted on the guide panel;
the alignment structure is comprised of:
a projection that interlocks with an opening;
with a position, size, and orientation of the guidance slot and positions, sizes, and orientations of the projection and the opening of the alignment structure determined by datum derived from physical features of the plug-in unit.

2. The guide panel as set forth in claim 1, wherein:
the engagement structure is configured as steps having horizontal and vertical surfaces.

3. The guide panel as set forth in claim 2, wherein:
a first horizontal surface of horizontal surfaces is comprised of a latch-opening that receives a latch of a latch mechanism of a handle of a plug-in unit panel.

4. The guide panel as set forth in claim 3, wherein:
the latch is an injector-ejector prong.

5. The guide panel as set forth in claim 2, wherein:
a first vertical surface of vertical surfaces is comprised of:
a fastener-opening for receiving a securing fastener of a plug-in unit panel.

6. The guide panel as set forth in claim 2, wherein:
the first vertical surface is comprised of:
a guide-opening for receiving a first guide-pin of a plug-in unit panel.

7. The guide panel as set forth in claim 2, wherein:
a first vertical surface of the vertical surfaces is comprised of:
a fastener-opening for receiving a securing fastener of one of a plug-in unit panel and filler panel; and
a guide-opening for receiving a first guide-pin of one of a plug-in unit panel and filler panel.

8. The guide panel as set forth in claim 2, wherein:
a first vertical surface of vertical surfaces is comprised of:
an elongated opening for receiving one of a securing fastener, a first guide-pin, and a securing fastener and a first guide-pin.

9. The guide panel as set forth in claim 2, wherein:
a first vertical surface of vertical surfaces sets an insertion depth of a plug-in unit.

10. The guide panel as set forth in claim 2, wherein:
a second horizontal surface of horizontal surfaces provides for securing a fastening bar.

11. The guide panel as set forth in claim 10, wherein:
the second horizontal surface has sufficient expanse to provide for indexing elements and a second guide pin associated with one of a third vertical surface of the vertical surfaces and one of plug-in unit panel.

12. The guide panel as set forth in claim 10, wherein:
the fastening bar includes:
a threaded element having an opening aligned with a fastener-opening of the first vertical surface of the vertical surfaces.

13. The guide panel as set forth in claim 2, wherein:
a second vertical surface of the vertical surfaces is comprised of:
indexing openings for receiving indexing elements; and
a second guide opening for receiving a second guide pin of a plug-in unit.

14. The guide panel as set forth in claim 2, wherein:
a third horizontal surface of the horizontal surfaces is comprised of:
an Electro-static discharge (ESD) component opening for securing an electrostatic discharge component.

15. The guide panel as set forth in claim 1, wherein:
the power-data transmission alignment structure is comprised of:
alignment projections extending from the guide panel that engage alignment openings on the power-data transmission panel to thereby align the guidance slot of the guide panel with a connector of the power-data transmission panel.

16. A guide panel, comprising:
alignment structures that facilitate with precision and accuracy pre-alignment of plug-in units with a power-data transmission panel before the plug-in units are mounted on the guide panel;
the alignment structures further facilitate the prevention of the power-data transmission panel associated with the guide panel from an in-plane rotation movement, a lateral movement, and a vertical movement;
the alignment structures are comprised of;
alignment projections that interlock with alignment openings;
with a position, size, and orientation of a guidance slot of the guide panel and positions, sizes, and orientations of the alignment projections and the alignment openings of the alignment structures determined by datum derived from physical features of the plug-in unit.

17. The guide panel as set forth in claim 16, wherein:
the alignment structures provide precision and accuracy in the engagement by isolating any one of the in-plane rotation movement, the lateral movement, and the vertical movement from any one of the pair of the in-plane rotation movement, the lateral movement, and the vertical movement.

* * * * *